(12) United States Patent
Liaw

(10) Patent No.: US 11,616,125 B2
(45) Date of Patent: Mar. 28, 2023

(54) INTEGRATED CIRCUIT DEVICE AND MANUFACTURING METHOD THEREOF

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/214,589

(22) Filed: Mar. 26, 2021

(65) Prior Publication Data
US 2021/0234004 A1     Jul. 29, 2021

Related U.S. Application Data

(62) Division of application No. 16/388,404, filed on Apr. 18, 2019, now Pat. No. 10,964,784.

(51) Int. Cl.
| | |
|---|---|
| *H01L 29/10* | (2006.01) |
| *H01L 27/11* | (2006.01) |
| *H01L 27/092* | (2006.01) |
| *H01L 21/8238* | (2006.01) |
| *H01L 23/528* | (2006.01) |
| *H01L 21/74* | (2006.01) |

(52) U.S. Cl.
CPC ........ *H01L 29/1087* (2013.01); *H01L 21/743* (2013.01); *H01L 21/823807* (2013.01); *H01L 21/823821* (2013.01); *H01L 21/823871* (2013.01); *H01L 21/823892* (2013.01); *H01L 23/5286* (2013.01); *H01L 27/0924* (2013.01); *H01L 27/0928* (2013.01); *H01L 27/1104* (2013.01); *H01L 29/1037* (2013.01); *H01L 29/1083* (2013.01)

(58) Field of Classification Search
CPC ............ H01L 29/1087; H01L 27/1104; H01L 27/0924; H01L 27/0928; H01L 29/1037; H01L 21/823871; H01L 23/5286; H01L 21/743; H01L 21/823807; H01L 21/823821; H01L 21/823892; H01L 29/1083
See application file for complete search history.

(56) References Cited

U.S. PATENT DOCUMENTS

| | | | |
|---|---|---|---|
| 10,134,744 B1 * | 11/2018 | Chen | G11C 7/1075 |
| 10,157,987 B1 * | 12/2018 | Liaw | H01L 29/165 |
| 2009/0108374 A1 * | 4/2009 | Wong | H01L 27/1104 |
| | | | 257/E27.098 |
| 2013/0270652 A1 * | 10/2013 | Liaw | H01L 29/66818 |
| | | | 257/E27.06 |

(Continued)

*Primary Examiner* — Edward Chin
(74) *Attorney, Agent, or Firm* — Maschoff Brennan

(57) ABSTRACT

A method of manufacturing an integrated circuit device includes: doping a substrate with a first type dopant to form a well region; forming a first semiconductor fin and a second semiconductor fin wider than the first semiconductor fin over the well region; forming a first source/drain region of a second type dopant on the first semiconductor fin, the second type dopant is of a different conductivity type than the first type dopant; forming a second source/drain region of the first type dopant on the second semiconductor fin.

20 Claims, 33 Drawing Sheets

(56) References Cited

U.S. PATENT DOCUMENTS

| | | | |
|---|---|---|---|
| 2014/0131813 A1* | 5/2014 | Liaw | H01L 27/0207 |
| | | | 438/689 |
| 2019/0109193 A1* | 4/2019 | Liaw | H01L 29/7848 |
| 2020/0075606 A1* | 3/2020 | Liaw | H01L 29/66795 |
| 2020/0098766 A1* | 3/2020 | Liaw | H01L 23/528 |
| 2020/0335620 A1* | 10/2020 | Lin | H01L 21/3083 |

* cited by examiner

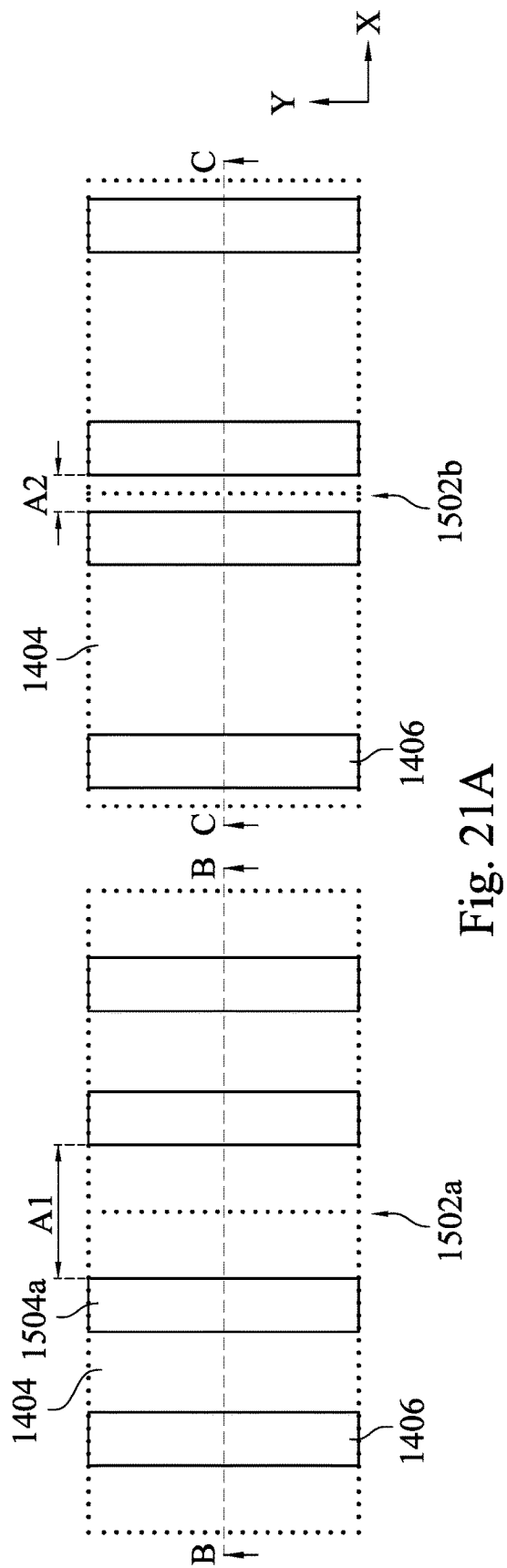
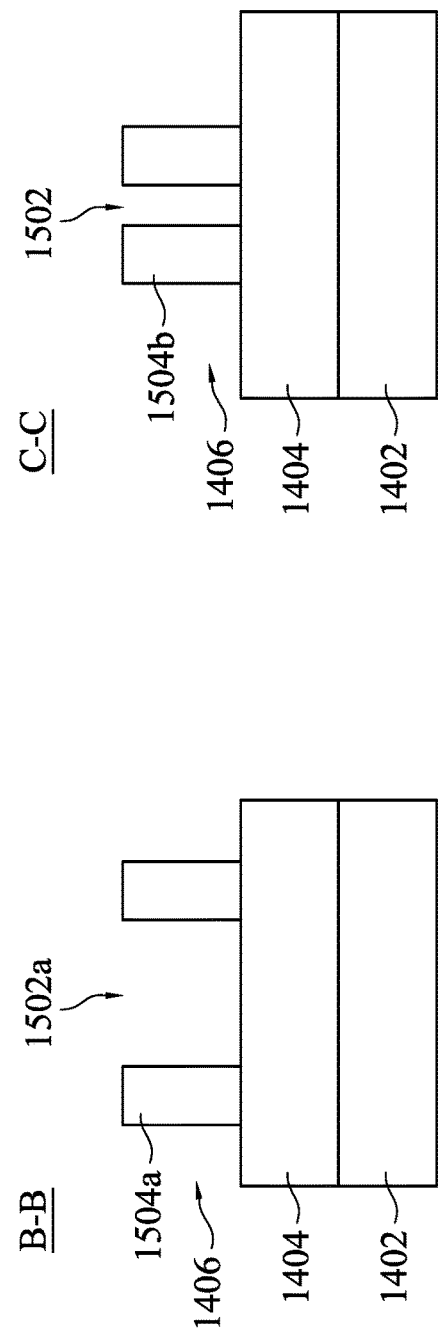
Fig. 21A
Fig. 21B
Fig. 21C

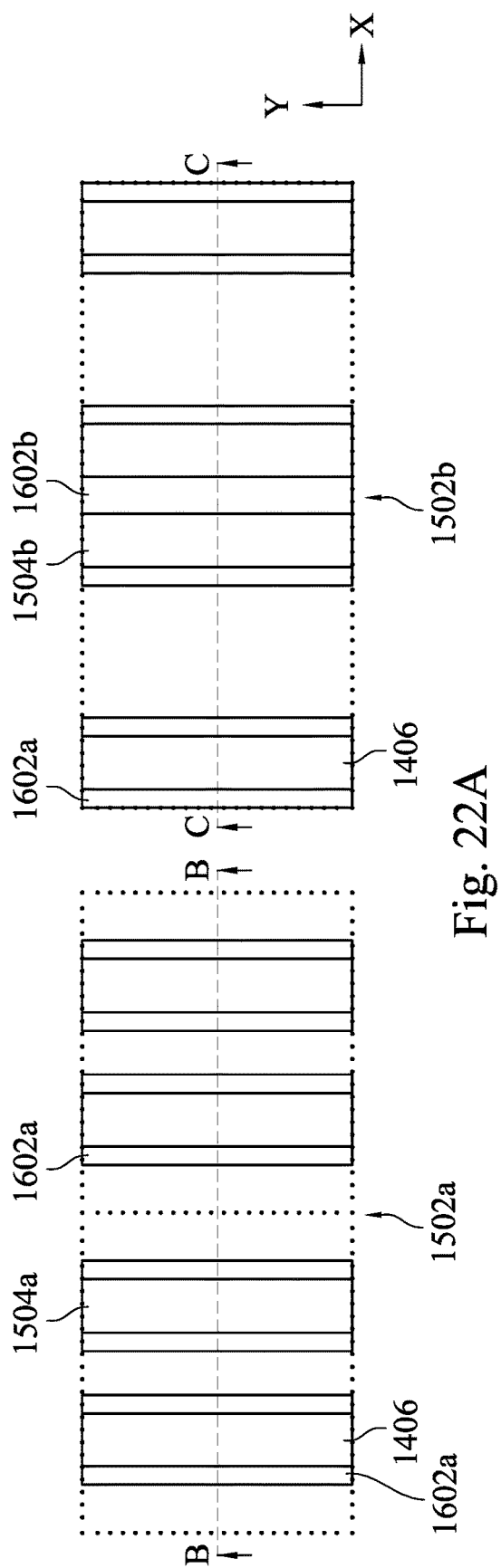
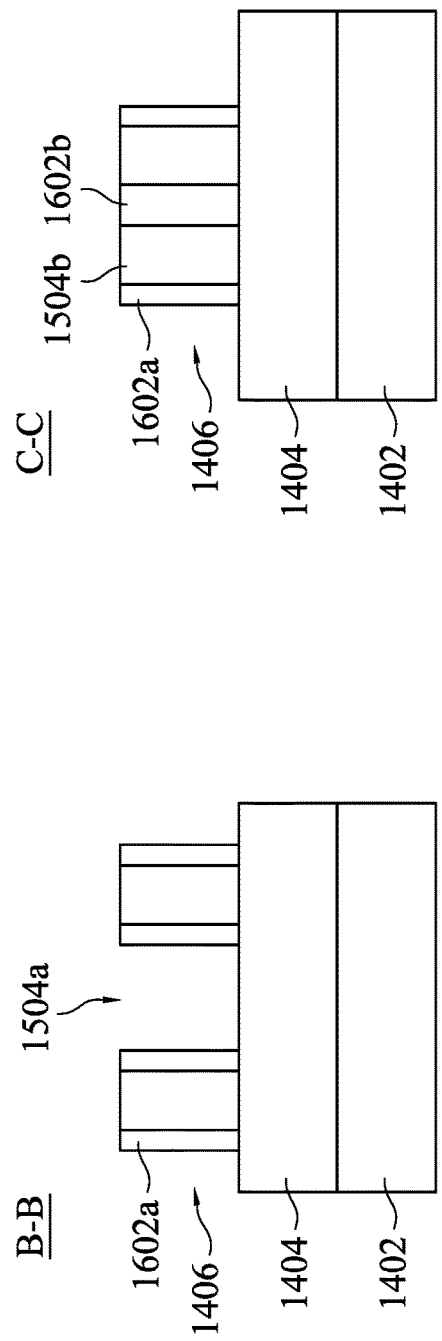
Fig. 22A
Fig. 22B
Fig. 22C

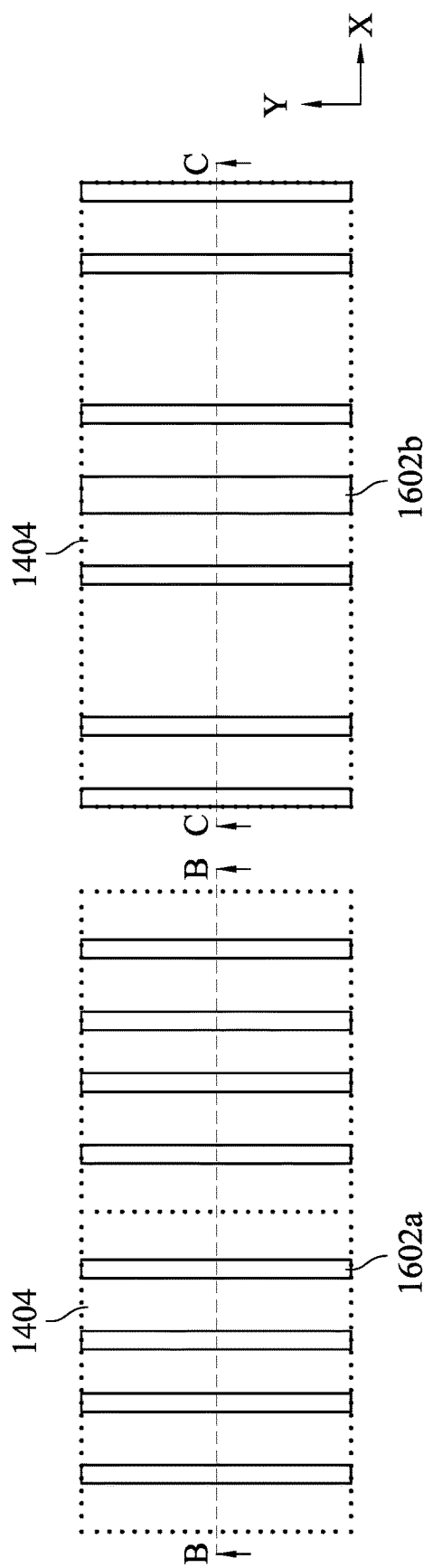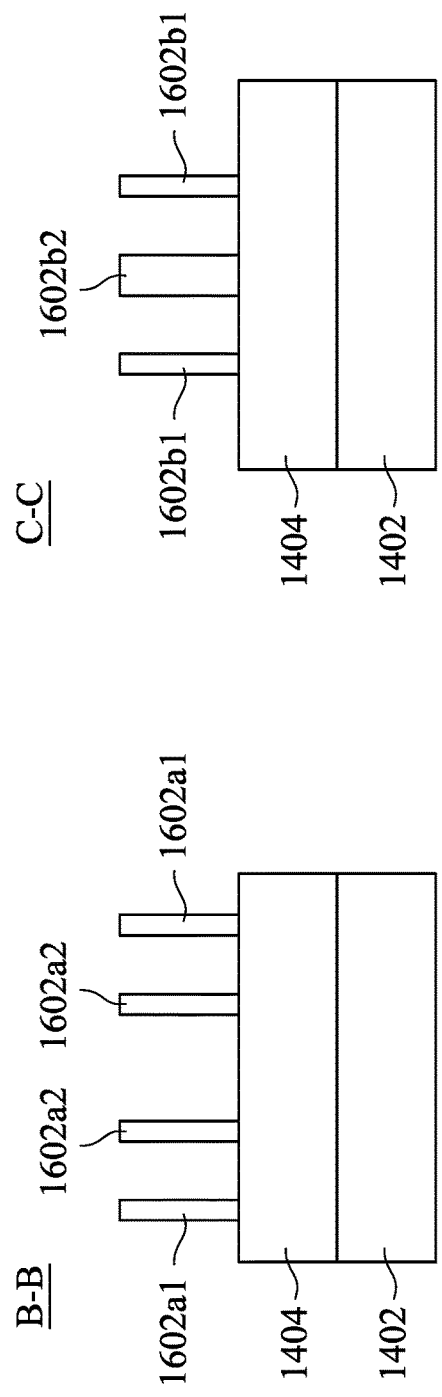
Fig. 23A
Fig. 23B
Fig. 23C

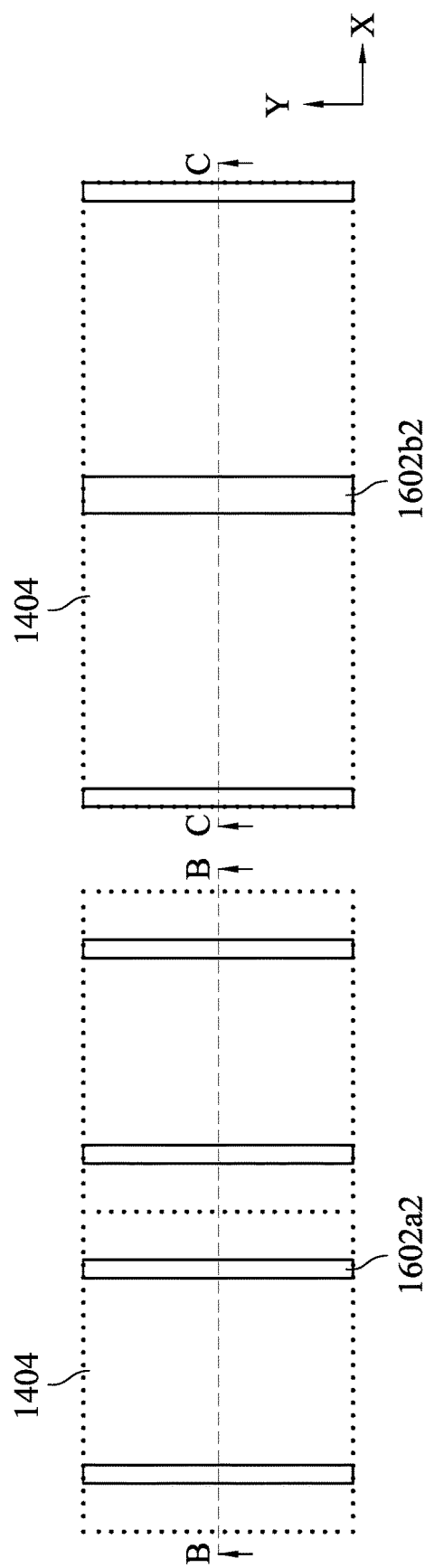
Fig. 24A
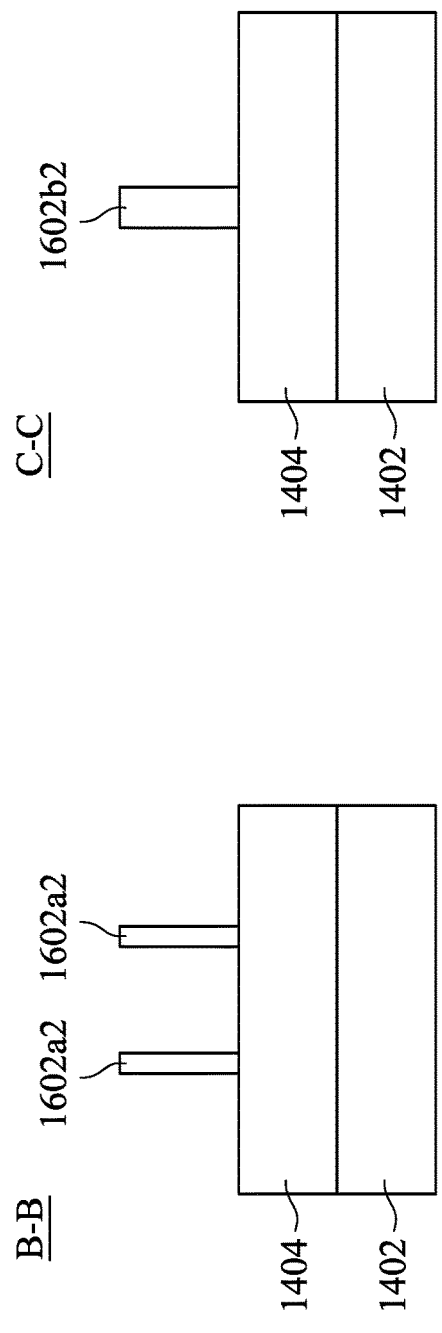
Fig. 24B
Fig. 24C

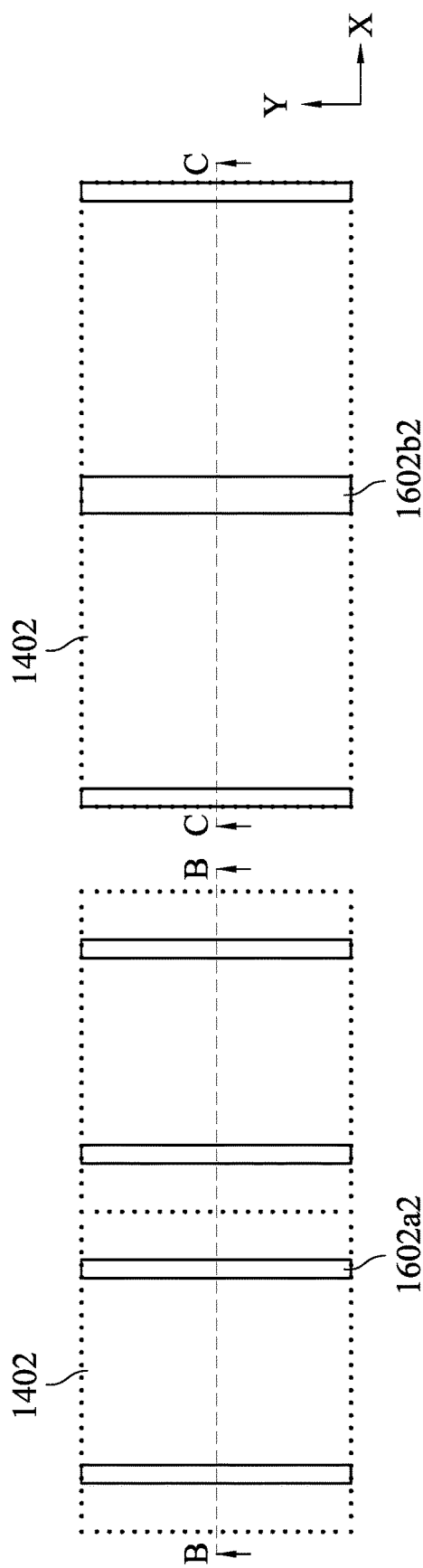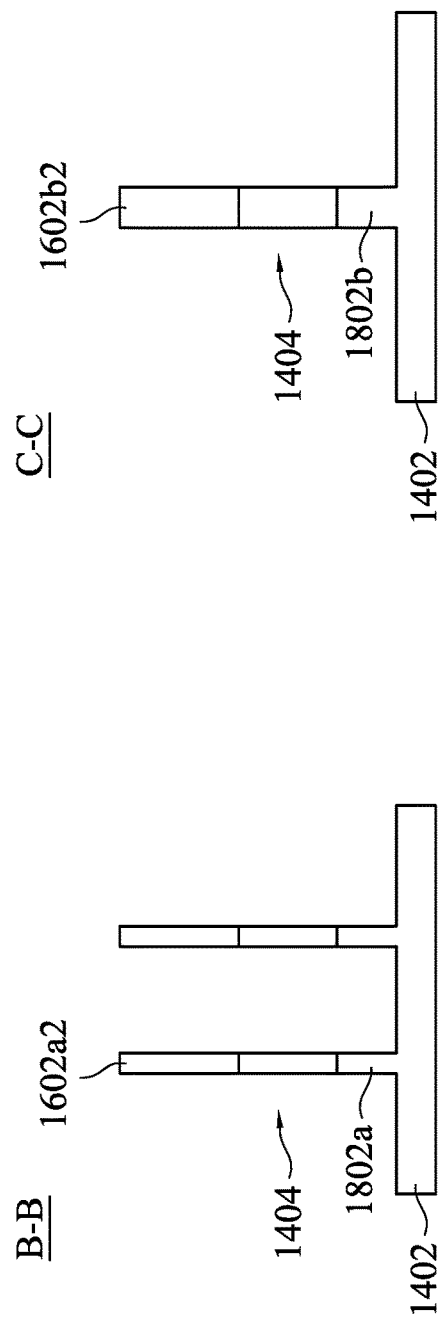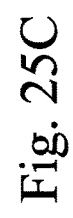
Fig. 25A
Fig. 25B
Fig. 25C

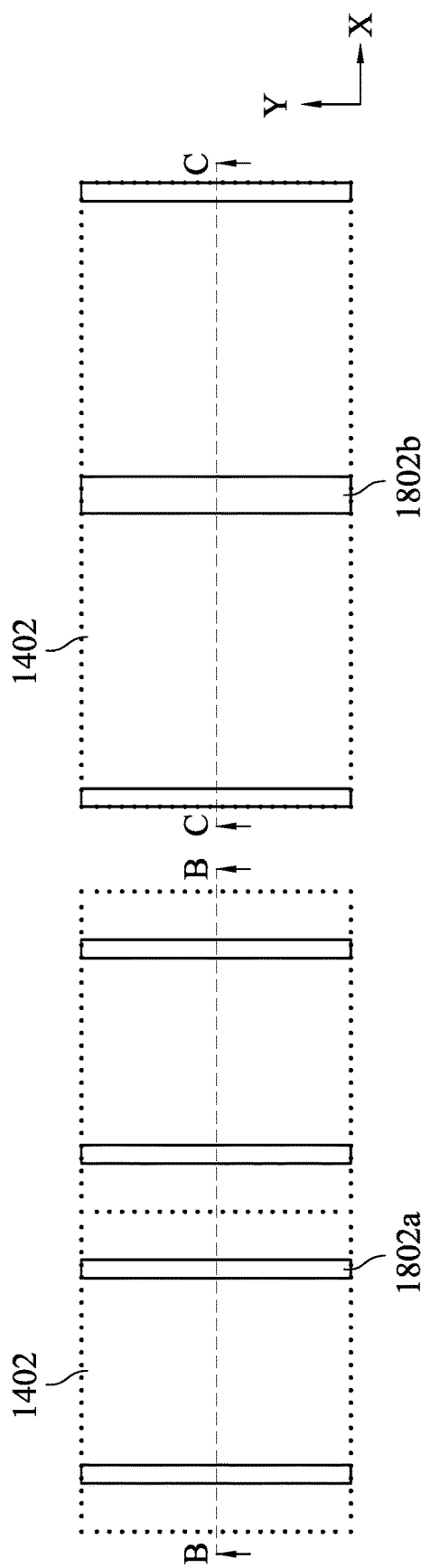
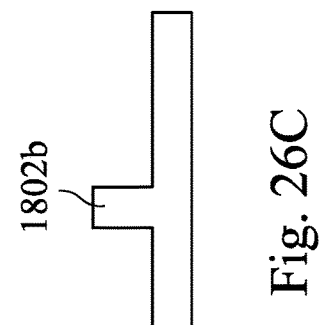
Fig. 26A
Fig. 26B
Fig. 26C

INTEGRATED CIRCUIT DEVICE AND MANUFACTURING METHOD THEREOF

The present application is a Divisional Application of the U.S. application Ser. No. 16/388,404, filed Apr. 18, 2019, now U.S. Pat. No. 10,964,784, issued Mar. 30, 2021 which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20-26C are top and/or cross-sectional views of a portion of embedded SRAM cells manufactured with the method in FIG. 19, in accordance with an embodiment.

DETAILED DESCRIPTION

Figure 1A:
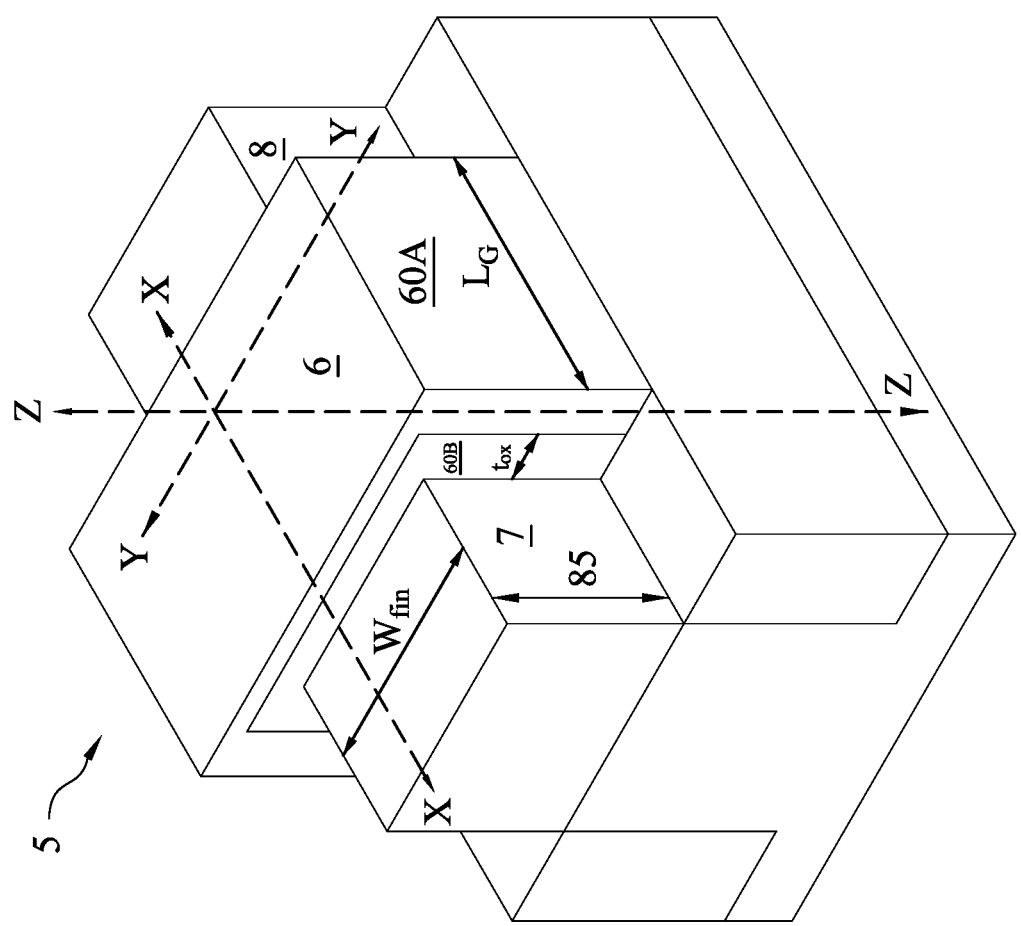
FIG. 1A is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1A, a perspective view of an example FinFET device 5 is illustrated.

The FinFET device 5 is a non-planar multi-gate transistor that is built over a substrate (such as a bulk substrate). A thin silicon-containing "fin-like" structure (hereinafter referred to as a "fin") forms the body of the FinFET device 5. The fin extends along an X-direction shown in FIG. 1A. The fin has a fin width $W_{fin}$ measured along a Y-direction that is orthogonal to the X-direction. A gate 6 of the FinFET device 5 wraps around this fin, for example around the top surface and the opposing sidewall surfaces of the fin. Thus, a portion of the gate 6 is located over the fin in a Z-direction that is orthogonal to both the X-direction and the Y-direction.

$L_G$ denotes a length (or width, depending on the perspective) of the gate 6 measured in the X-direction. The gate 6 may include a gate electrode 6A and a gate dielectric layer 6B. The gate dielectric layer 6B has a thickness $t_{ox}$ measured in the Y-direction. A portion of the gate 6 is located over a dielectric isolation structure such as shallow trench isolation (STI). A source 7 and a drain 8 of the FinFET device 5 are formed in extensions of the fin on opposite sides of the gate 6. A portion of the fin being wrapped around by the gate 6 serves as a channel of the FinFET device 5. The effective channel length of the FinFET device 5 is determined by the dimensions of the fin.

Figure 1B:
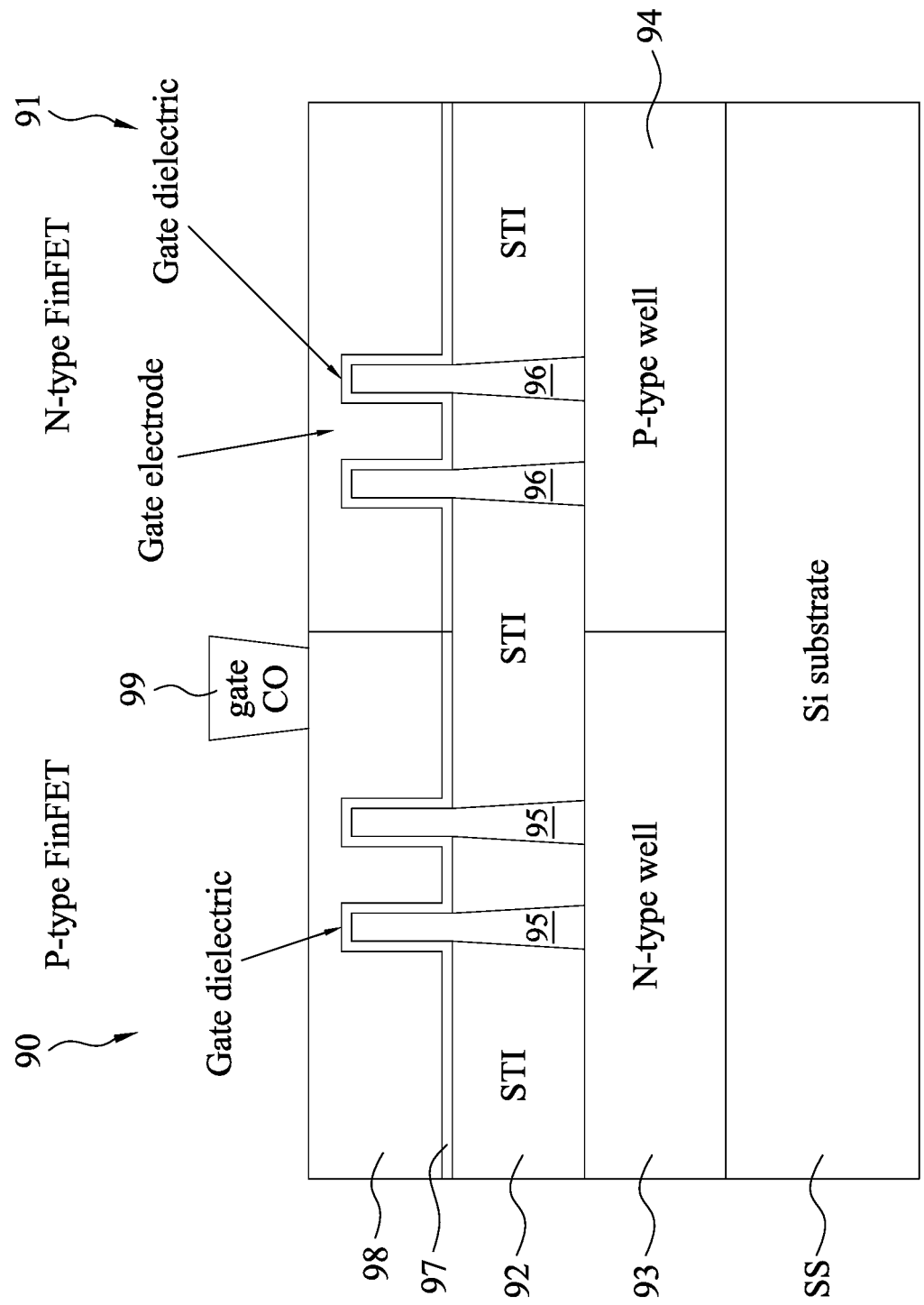
FIG. 1B is a cross-sectional view of FinFET transistors in a CMOS configuration.

FIG. 1B illustrates a diagrammatic cross-sectional side view of FinFET transistors in a CMOS configuration. The CMOS FinFET includes a substrate SS, for example a silicon substrate. An N-type well 93 and a P-type well 94 are formed in the substrate SS. A dielectric isolation structure 92 such as a shallow trench isolation (STI) is formed over the N-type well 93 and the P-type well 94. A P-type FinFET 90 is formed over the N-type well 93, and an N-type FinFET 91 is formed over the P-type well 94. The P-type FinFET 90 includes fins 95 that protrude upwardly out of the STI 92, and the N-type FinFET 91 includes fins 96 that protrude upwardly out of the STI 92. The fins 95 include the channel regions of the P-type FinFET 90, and the fins 96 include the channel regions of the N-type FinFET 91. In some embodiments, the fins 95 are included of silicon germanium, and the fins 96 are included of silicon. A gate dielectric 97 is formed over the fins 95-96 and over the STI 92, and a gate electrode 98 is formed over the gate dielectric 97. In some embodiments, the gate dielectric 97 includes a high-k dielectric material, and the gate electrode 98 includes a metal gate electrode, such as aluminum and/or other refractory metals. In some other embodiments, the gate dielectric 97 may include SiON, and the gate electrode 98 may include polysilicon. A gate contact 99 is formed on the gate electrode 98 to provide electrical connectivity to the gate.

FinFET devices offer several advantages over planar Metal-Oxide Semiconductor Field Effect Transistor (MOSFET) devices. These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, FinFET fabrication methods may still have challenges, such as lack of optimization for forming isolation structures that isolate neighboring circuit cells. For example, one or more dielectric dummy gates are formed in fins to isolate neighboring circuit cells. Fabrication of the dielectric dummy gates includes etching openings in the fins, followed by filling the openings with a dielectric material. However, if the fins are formed of silicon germanium (SiGe) for strain effect enhancement, etching the openings in the fins would break up the fins, which in turn would lead to reduced strain. For another example, one or more isolation gates are formed to wrap around fins and applied with a controlled voltage (e.g., Vdd or VSS) to isolate neighboring circuit cells. Fabrication of the isolation gates is free from etching openings in the fins and thus would prevent the strain loss. However, fabrication of the isolation gates involves an additional gate cut process (e.g. breaking up a continuous isolation gate across the P-type and N-type wells using an etching process) to separate the isolation gate in the N-well from the isolation gate in the P-well, which in turn would frustrate scaling down capability of FinFETs. Therefore, the present disclosure describes one or more FinFET cells that have reduced strain loss in SiGe fins and are fabricated without the additional gate cut process to separate the isolation gate in the N-well from the isolation gate in the P-well, as discussed in more detail below.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2:
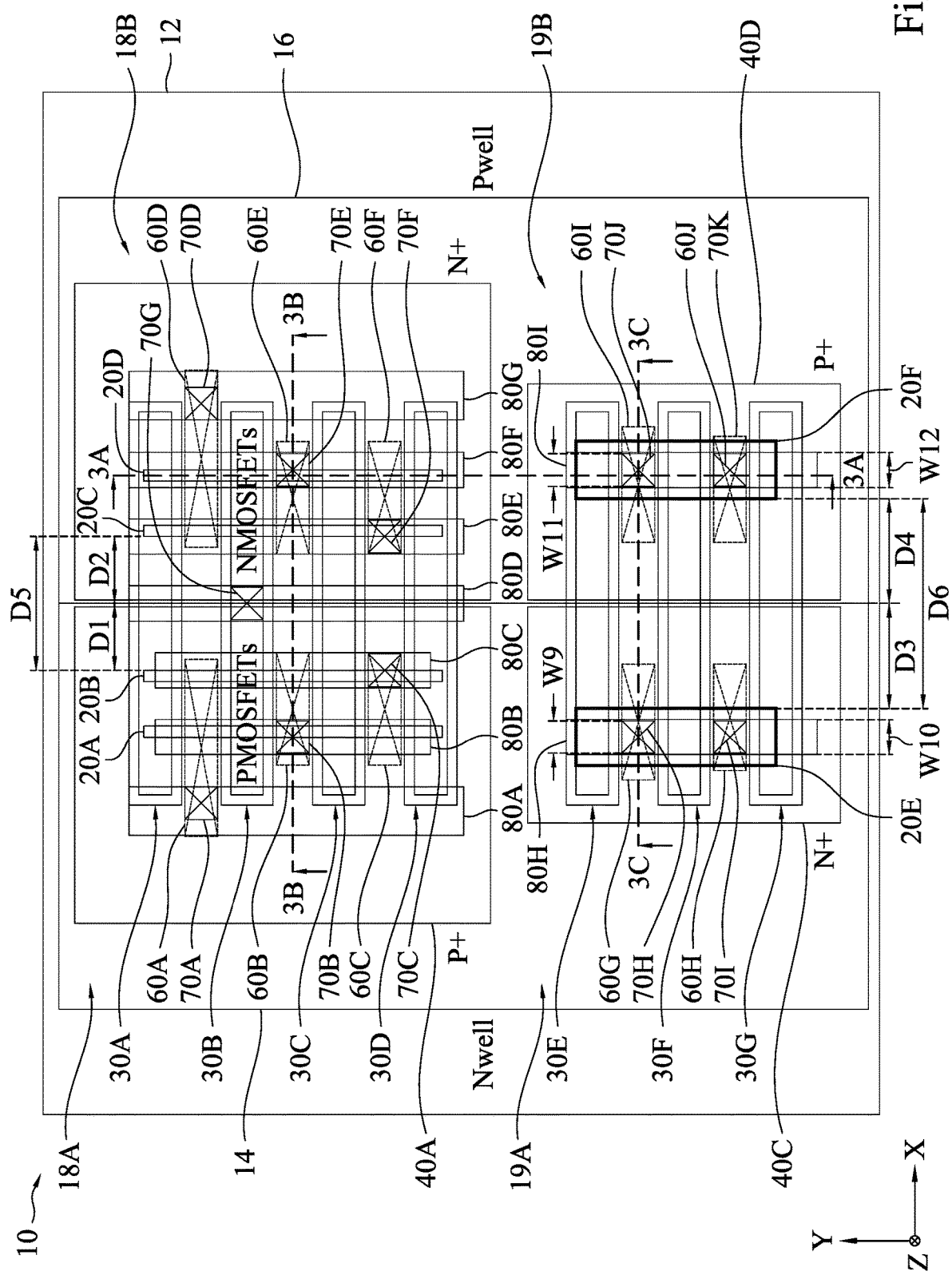
FIG. 2 is a layout view of a FinFET device P-type well strap, in accordance with one or more embodiments.
Figure 3A:
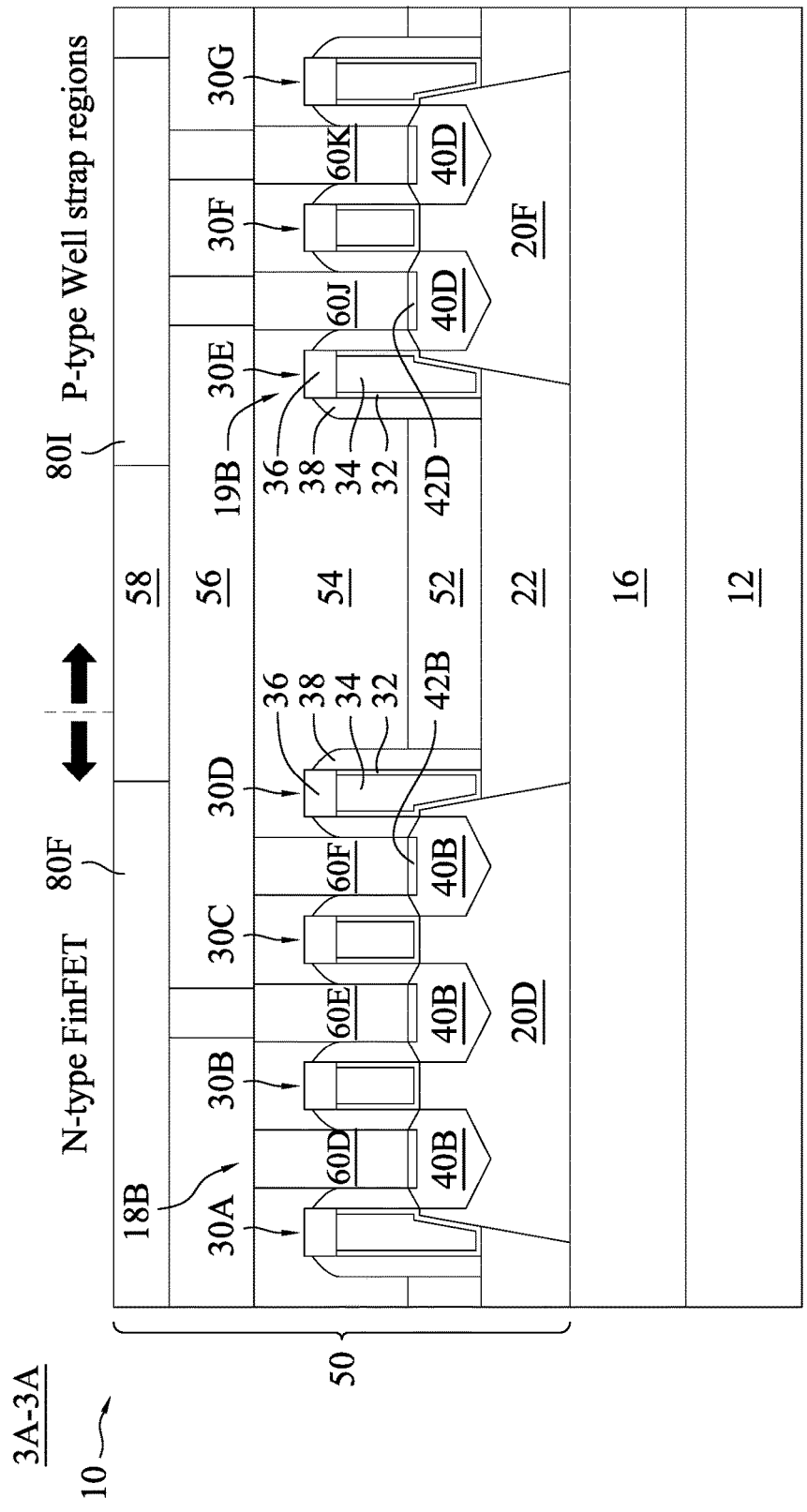
FIGS. 3A, 3B, and 3C are cross section views along line 3A-3A, line 3B-3B, and line 3C-3C in FIG. 2, respectively.
Figure 3C:
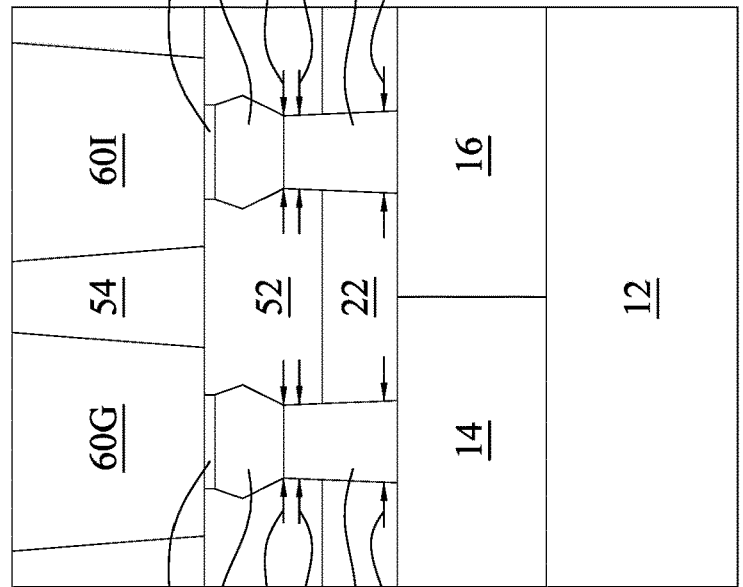
Figure 3B:
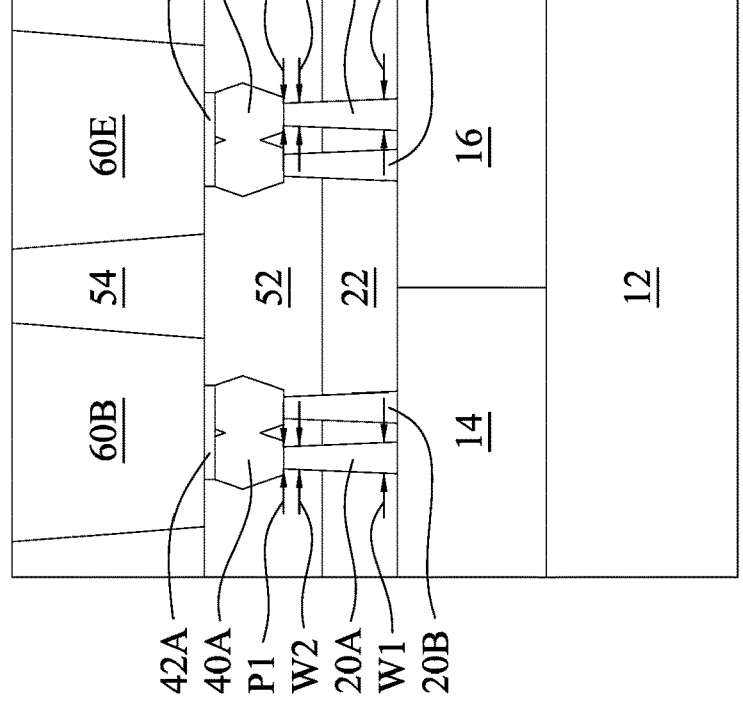

FIG. 2 is a layout view of a FinFET device 10 P-type well strap, in accordance with one or more embodiments. In some embodiments, the well strap may also be referred to as a well pickup region. FIGS. 3A, 3B, and 3C are fragmentary diagrammatic views of the FinFET device 10, in portion or entirety, according to various aspects of the present disclosure. In particular, FIG. 2 is a simplified schematic top view of the FinFET device 10 (for example, in an x-y plane); FIG. 3A is a diagrammatic cross-sectional view of FinFET device 10 along line 3A-3A of FIG. 2 (for example, in a y-z plane); FIG. 3B is a diagrammatic cross-sectional view of the FinFET device 10 along line 3B-3B of FIG. 2 (for example, in an x-z plane); and FIG. 3C is a diagrammatic cross-sectional view of the FinFET device 10 along line 3C-3C of FIG. 2 (for example, in an x-z plane). The FinFET device 10 generally refers to any fin-based device, which can be included in a microprocessor, a memory cell, and/or other IC device. In some implementations, FinFET device 10 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 2 and 3A-3C have been simplified for the sake of clarity to better understand the inventive concepts of the present disclosure. Additional features can be added in FinFET device 10, and some of the features described below can be replaced, modified, or eliminated in other embodiments of FinFET device 10.

FinFET device 10 includes a substrate (wafer) 12. In the depicted embodiment, the substrate 12 includes silicon. Alternatively or additionally, the substrate 12 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. Alternatively, the substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, the substrate 12 includes one or more group III-V materials. In some implementations, the substrate 12 includes one or more group II-IV materials.

The substrate 12 includes various doped regions configured according to design requirements of the FinFET device 10. In some implementations, the substrate 12 includes p-type doped regions (for example, p-type wells) doped with p-type dopants, such as boron (for example, BF2), indium, other p-type dopant, or combinations thereof. In some implementations, the substrate 12 includes n-type doped regions (for example, n-type wells) doped with n-type dopants, such as phosphorus, arsenic, other n-type dopant, or combinations thereof. In some implementations, the substrate 12 includes doped regions formed with a combination of p-type dopants and n-type dopants. The various doped regions can be formed directly on and/or in the substrate 12, for example, providing a p-well structure, an n-well structure, a dual-well structure, a raised structure, or combinations thereof. An ion implantation process, a diffusion process, and/or other suitable doping process can be performed to form the various doped regions. In the depicted embodiment, the substrate 12 includes an n-type doped region 14 (also referred to as an n-well) configured for a p-type metal-oxide-semiconductor (PMOS) FinFET 18A, such as a pull-up (PU) FinFET, and a p-type doped region 16 (also referred to as a p-well) configured for an n-type MOS (NMOS) FinFET 18B, such as a pull-down (PD) FinFET, such that FinFET device 10 includes a CMOS FinFET. An n-type well strap 19A is configured to electrically connect an n-type doped region 14 to a first power supply voltage, such as a power supply voltage $V_{DD}$, and a p-type well strap 19B is configured to electrically connect p-type doped region 16 to a second power supply voltage, such as a power supply voltage VSS. In some implementations, power supply voltage $V_{DD}$ is a positive power supply voltage, and power supply voltage $V_{SS}$ is an electrical ground. In some implementations, the n-type doped region 14 has an n-type dopant concentration of about $5 \times 10^{16}$ cm$^{-3}$ to about $5 \times 10^{19}$ cm$^{-3}$, and the p-type doped region 16 has a p-type dopant concentration of about $5 \times 10^{16}$ cm$^{-3}$ to about $5 \times 10^{19}$ cm$^{-3}$.

The FinFET device 10 includes a fin 20A, a fin 20B, a fin 20C, a fin 20D, a fin 20E, and a fin 20F (also referred to as active fin regions) disposed over substrate 12. In FIGS. 2 and 3A-3C, A P-type FinFET 18A includes fin 20A and fin 20B disposed over (and electrically connected to) n-type doped region 14. An N-type FinFET 18B includes the fin 20C and the fin 20D disposed over (and electrically connected to) the p-type doped region 16. An n-type well strap 19A includes fin 20E disposed over (and electrically connected to) the n-type doped region 14. A p-type well strap 19B includes fin 20F disposed over (and electrically connected to) the p-type doped region 16.

To enhance performance of FinFET device 10, a dopant concentration of fins of the FinFETs is less than a doping concentration of fins of the well straps. For example, in the depicted embodiment, the fins 20A, 20B of the P-type FinFET 18A include n-type dopants (represented by n) and the fin 20E of the n-type well strap 19A include n-type dopants (represented by n), where an n-type dopant concentration of the fin 20E is greater than an n-type dopant concentration of the fins 20A, 20B. In some implementations, the n-type dopant concentration of the fins 20E is at least three times greater than the n-type dopant concentration of the fins 20A, 20B. For example, the fins 20A, 20B have an n-type dopant concentration of about $1 \times 10^{15}$ cm$^{-3}$ to about $1 \times 10^{18}$ cm$^{-3}$, while the fin 20E has an n-type dopant concentration of $1 \times 10^{15}$ cm$^{-3}$ to about $5 \times 10^{18}$ cm$^{-3}$. In some implementations, the n-type dopant concentration of the n-type doped region 14 is greater than the n-type dopant concentration of fins 20A, 20B and is less than the n-type dopant concentration of fin 20E.

In furtherance of the depicted embodiment, the fins 20C, 20D of the N-type FinFET 18B include p-type dopants (represented by p) and the fin 20F of the p-type well strap 19B includes p-type dopants (represented by p), where a p-type dopant concentration of fins 20F is greater than a p-type dopant concentration of the fins 20C, 20D. In some implementations, the p-type dopant concentration of fin 20F is at least three times greater than the p-type dopant concentration of the fins 20C, 20D. For example, the fins 20C, 20D have a p-type dopant concentration of about $1 \times 10^{15}$ cm$^{-3}$ to about $1 \times 10^{18}$ cm$^{-3}$, while the fin 20F has a p-type dopant concentration of about $5 \times 10^{16}$ cm$^{-3}$ to about $5 \times 10^{19}$ cm$^{-3}$. In some implementations, the p-type dopant concentration of p-type doped region 16 is greater than the p-type dopant concentration of fins 20C, 20D and is less than the p-type dopant concentration of fins 20F.

To enhance performance of FinFET device 10, a width of a fin structure of a well strap is greater than a width of a fin structure of the FinFET. For example, in the depicted embodiment, lower and upper portions of the fin 20A of the P-type FinFET 18A have widths W1 and W2 along the x-direction, lower and upper portions of the fin 20C of the N-type FinFET 18B have widths W3 and W4 along the x-direction, and lower and upper portions of the fin 20E of the n-type well strap 19A have widths W5 and W6 along the x-direction. In some embodiments, the width W5 of the fin 20E is greater than the width W1 or W2 of the fin 20A and/or greater than the width W3 or W4 of the fin 20C. In some embodiments, the width W6 of the fin 20E is greater than the width W1 or W2 of the fin 20A and/or greater than the width W3 or W4 of the fin 20C. In some implementations, the width W6 of the fins 20E is about twice to about ten times of the width W2 of the fin 20A and/or is about twice to about ten times of the width W4 of the fin 20D. In FIGS. 3B and 3C, a width P3 of an interface between the fin 20E and an epitaxial source/drain feature 40C is greater than a width P1 of an interface between the fin 20A and an epitaxial source/drain feature 40A and/or is greater than a width P2 of an interface between the fin 20B and an epitaxial source/drain feature 40B. In some embodiments, the fin 20E with greater width than the fin 20A or 20B may also be referred to as a planar-like OD.

To enhance performance of FinFET device 10, a distance between a corresponding fin structure of an n-type well strap and a p-type doped region is greater than a distance between a corresponding fin structure of a p-type FinFET and a p-type doped. For example, in the depicted embodiment, in FIG. 2, the fin 20B of the P-type FinFET 18A and the p-type doped region 16 has a distance D1 therebetween along the x-direction and the fin 20E of the n-type well strap 19A and the p-type doped region 16 has a distance D3 therebetween along the x-direction. In some embodiments, the distance D3 is greater than the distance D1. In FIG. 2, a distance D5 between adjacent two fins 20E and 20F of the well straps 19A and 19B is greater than a distance D6 between adjacent two fins 20B and 20C of the FinFETs 18A and 18B.

To enhance performance of FinFET device 10, a width of a fin structure of an n-type well strap is greater than a width of a device-level contact and/or a conductive line connecting the fin of the n-type well strap. For example, in the depicted embodiment, in FIG. 2, a device-level contact 60G of the n-type well strap 19A has a width W9 along the x-direction and a conductive line 80H of the n-type well strap 19A has a width W10 along the x-direction. In some embodiments, the width W5 of the fin 20E is greater than the width W9 of the device-level contact 60G and/or is greater than the width W10 of the conductive line 80H.

In furtherance of the depicted embodiment, in the depicted embodiment, lower and upper portions of the fin 20F of the n-type well strap 19B have widths W7 and W8 along the x-direction. In some embodiments, the width W7 of the fin 20F is greater than the width W1 or W2 of the fin 20A and/or greater than the width W3 or W4 of the fin 20C. In some embodiments, the width W8 of the fin 20F is greater than the width W1 or W2 of the fin 20A and/or greater than the width W3 or W4 of the fin 20C. In some implementations, the width W8 of the fins 20F is about twice to about ten times of the width W2 of the fin 20A and/or is about twice to about ten times of the width W4 of the fin 20D. In FIGS. 3B and 3C, a width P4 of an interface between the fin 20F and an epitaxial source/drain feature 40D is greater than the width P1 of the interface between the fin 20A and the epitaxial source/drain features 40A and/or is greater than the width P2 of the interface between the fin 20B and the epitaxial source/drain features 40B. In some embodiments, the fin 20F with greater width than the fin 20A or 20B may also be referred to as a planar-like OD.

To enhance performance of the FinFET device 10, a distance between a corresponding fin structure of a p-type well strap and an n-type doped region is greater than a distance between a corresponding fin structure of an n-type FinFET and the n-type doped region. For example, in the depicted embodiment, in FIG. 2, the fin 20C of the n-type FinFET 18B and the n-type doped region 14 has a distance D2 therebetween along the x-direction and the fin 20F of the p-type well strap 19B and the n-type doped region 14 has a distance D4 therebetween along the x-direction. In some embodiments, the distance D4 is greater than the distance D2.

To enhance performance of FinFET device 10, a width of a fin structure of a p-type well strap is greater than a width of a device-level contact and/or a conductive line connecting the fin of the p-type well strap. In the depicted embodiment, in FIG. 2, a device-level contact 60I of the p-type well strap 19B has a width W11 along the x-direction and a conductive line 80I of the p-type well strap 19B has a width W12 along the x-direction. In some embodiments, the width W6 of the fin 20F is greater than the width W11 of the device-level contact 60I and/or is greater than the width W12 of the conductive line 80I.

In the FinFET device 10, the cell performance exhibits a significant sensitively to layout environment. For example, a device (e.g., Ion, Vt and Ioff) with an inner cell and an edge cell have difference behavior due to the structure thereof with a discontinuous cell layout. In some embodiments, well strap cells for N-well and P-well may be in an edge of the array or between two sub-arrays in the FinFET device 10.

In the course of IC evolution, functional density (i.e., the number of interconnected devices per chip area) has generally increased while geometry size in the FinFET device 10 (i.e., the component that can be created using a fabrication process) has decreased. Therefore, a resistance of the well pickup region may be high which would result in a worse latch up performance, and in turn adversely affects the performance of the FinFET device 10.

Hence, a fin in the well pickup region of the FinFET device 10 has a width greater than that in the transistor of the FinFET device 10, so as to lower the resistance of the well pickup region, and thus the FinFET device 10 may obtain a better latch up immunity. That is, the n-type well strap 19A and the p-type well strap 19B may provide a most stable performance for the FinFET device 10.

In some embodiments, if a fin in the well pickup region of the FinFET device 10 has a width which is less than twice of that of the transistor of the FinFET device 10, the resistance of the well pickup region may not be low enough to obtain a better latch up immunity, which in turn adversely affects the performance of the FinFET device 10. In some embodiments, if a fin in the well pickup region of the FinFET device 10 has a width which is greater than ten times of that of the transistor of the FinFET device 10, a junction leakage may be occur, which in turn adversely affects the performance of the FinFET device 10. In this context, the terms "junction leakage" as used herein is a current passing through an unintentional path from the fin to another type of a well region where the fin does not locate on.

The P-type FinFET 18A and the N-type FinFET 18B are multi-fin FinFETs and the n-type well strap 19A and the p-type well strap 19B are single-fin well straps, though the present disclosure contemplates embodiments where the P-type FinFET 18A, the N-type FinFET 18B, the n-type well strap 19A, and/or the p-type well strap 19B include more or less fins, such as a single fin). The Fins 20A-20F are oriented substantially parallel to one another, each having a width defined in an x-direction, a length defined in a y-direction, and a height defined in a z-direction. The present disclosure contemplates variations in height, width, and length of the fins 20A-20F that may arise from processing and fabrication.

For example, in FIG. 3B and FIG. 3C, widths of the fins 20A-20F each varies from an upper portion of the fins 20A-20F to a lower portion of the fins 20A-20F. In the depicted embodiment, the width tapers from the upper portion of the fins 20A-20F to the lower portion of the fins 20A-20F, such that an average width of the upper portion is less than an average width of the lower portion. In some implementations, the width can vary from about 5 nm to about 15 nm along the fins 20A-20F depending on where the width is measured along the height of the fins 20A-20F. In some implementations, a width of the fins 20A-20F varies depending on a position of the fins 20A-20F relative to one another and/or relative to other features of the FinFET device 10.

For example, a width of center fins may be greater than a width of edge fins. In another example, alternatively, a width of center fins is less than a width of edge fins. In both such implementations, the width of edge fins can represent an average width of edge fins, and the width of center fins can represent an average width of center fins. In some implementations, widths of the fins 20A, 20B of the P-type FinFET 18A is different than widths of the fins 20C, 20D of the N-type FinFET 18B. In some implementations, the widths are not tapered, such that at least one of the fins 20A-20F have substantially the same width along their height.

The fins 20A-20F each have at least one channel region, at least one source region, and at least one drain region defined along their length in the y-direction, where a channel region is disposed between a source region and a drain region (generally referred to as source/drain regions). Channel regions include a top portion defined between sidewall portions, where the top portion and the sidewall portions engage with a gate structure (as described below), such that current can flow between the source/drain regions during operation. The source/drain regions also include top portions defined between sidewall portions. In some implementations, the fins 20A-20H are a portion of the substrate 12 (such as a portion of a material layer of substrate 12). For example, where the substrate 12 includes silicon, the fins 20A-20F include silicon.

Alternatively, in some implementations, the fins 20A-20F are defined in a material layer, such as one or more semiconductor material layers, overlying the substrate 12. For example, the fins 20A-20F can include a semiconductor layer stack having various semiconductor layers (such as a heterostructure) disposed over the substrate 12. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of the FinFET device 10. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b/Si_cGe_d/Si_aGe_b/Si_cGe_d$ from bottom to top, where a, c are different atomic percentages of silicon and b, d are different atomic percentages of germanium).

The fins 20A-20F are formed over the substrate 12 by any suitable process. In some implementations, a combination of deposition, lithography and/or etching processes are performed to define the fins 20A-20F extending from the substrate 12 as illustrated in FIGS. 2 and 3A-3C. For example, forming the fins 20A-20F includes performing a lithography process to form a patterned resist layer over substrate 12 (or a material layer, such as a heterostructure, disposed over the substrate 12) and performing an etching process to transfer a pattern defined in the patterned resist layer to the substrate 12 (or the material layer, such as the heterostructure, disposed over the substrate 12).

The lithography process can include forming a resist layer on the substrate 12 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of the substrate 12 (or a material layer disposed over the substrate 12). The etching process can include a dry etching process (for example, a reactive ion etching (RIE) process), a wet etching process, other suitable etching process, or combinations thereof. After the etching process, the patterned resist layer is removed from the substrate 12, for example, by a resist stripping process.

Alternatively, the fins 20A-20F are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming the fins 20A-20F. Further, in some implementations, the exposure process can implement maskless lithography, electron-beam (e-beam) writing, ion-beam writing, and/or nanoimprint technology for patterning the resist layer and/or other layers.

In some implementations, the doped region 14 and/or the doped region 16 are formed after forming the fins 20A-20F. In such implementations, a lithography process is performed to mask (cover) the fins 20C, 20D, and 20F when forming the doped region 14 (for example, by an ion implantation process and/or a diffusion process), and a lithography process is performed to mask the fins 20A, 20B, and 20E when forming the doped region 16 (for example, by an ion implantation process and/or a diffusion process). In some implementations, the doped region 14 and/or the doped region 16 are formed before forming the fins 20A-20F. In some implementations, additional lithography processes and/or doping processes are performed to increase a dopant concentration in fins of the n-type well strap 19A and/or fins of the p-type well strap 19B. For example, a lithography process is performed to mask the fins 20A-20D, and fin 20F when a doping process is performed to increase a dopant concentration of the fin 20E of the n-type well strap 19A. In another example, a lithography process is performed to mask the fins 20A-20D, and the fin 20E when a doping process is performed to increase a dopant concentration of the fin 20F of the p-type well strap 19A. Any suitable doping process is contemplated by the present disclosure for increasing a dopant concentration of the fins 20E and 20F.

An isolation feature(s) 22 is formed over and/or in the substrate 12 to isolate various regions, such as various device regions, of the FinFET device 10. For example, the isolation feature 22 separates and isolates active device regions and/or passive device regions from each other, such as the P-type FinFET 18A, the N-type FinFET 18B, the n-type well strap 19A, and the p-type well strap 19B. The isolation feature 22 further separates and isolates the fins 20A-20F from one another. In the depicted embodiment, the isolation feature 22 surrounds a bottom portion of the fins 20A-20F. The isolation feature 22 includes silicon oxide, silicon nitride, silicon oxynitride, other suitable isolation material (for example, including silicon, oxygen, nitrogen, carbon, or other suitable isolation constituent), or combinations thereof. The isolation feature 22 can include different structures, such as shallow trench isolation (STI) structures, deep trench isolation (DTI) structures, and/or local oxidation of silicon (LOCOS) structures. In some implementations, STI features can be formed by etching a trench in the substrate 12 (for example, by using a dry etch process and/or wet etch process) and filling the trench with insulator material (for example, by using a chemical vapor deposition process or a spin-on glass process).

A chemical mechanical polishing (CMP) process may be performed to remove excessive insulator material and/or planarize a top surface of the isolation feature 22. In some implementations, STI features can be formed by depositing an insulator material over the substrate 12 after forming the fins 20A-20F, such that the insulator material layer fills gaps (trenches) between the fins 20A-20F, and etching back the insulator material layer to form the isolation feature 22. In some implementations, the isolation feature 22 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, the isolation feature 22 includes a dielectric layer disposed over a doped liner layer (including, for example, boron silicate glass (BSG) or phosphosilicate glass (PSG)).

Various gate structures are disposed over the fins 20A-20F, such as a gate structure 30A, a gate structure 30B, a gate structure 30C, a gate structure 30D, a gate structure 30E, a gate structure 30F, and a gate structure 30G. The gate structures 30A-30G extend along the x-direction (for example, substantially perpendicular to the fins 20A-20F). In the depicted embodiment, the gate structure 30B and gate structure 30C are disposed over the channel regions of the fins 20A-20D. In some implementations, the gate structure 30B and the gate structure 30C wrap respective channel regions of the fins 20A-20D, thereby interposing respective source/drain regions of the fins 20A-20D. The gate structure 30B and the gate structure 30C engage respective channel regions of the fins 20A-20D, such that current can flow between respective source/drain regions of the fins 20A-20D during operation.

In furtherance of the depicted embodiment, gate structure 30B and the gate structure 30C are active gate structures, whereas the gate structure 30A and the gate structure 30D-30G are dummy gate structures. "Active gate structure" generally refers to an electrically functional gate structure of the FinFET device 10, whereas "dummy gate structure" generally refers to an electrically non-functional gate structure of the FinFET device 10. In some implementations, a dummy gate structure mimics physical properties of an active gate structure, such as physical dimensions of the active gate structure, yet is electrically inoperable (in other words, does not enable current to flow between source/drain regions) in the FinFET device 10. In FIGS. 2 and 3A-3C, the gate structure 30A and the gate structures 30D-30G wrap portions of the fins 20A-20F, positioned such that the gate structure 30A and the gate structures 30D-30G interpose respective source/drain regions of the fins 20A-20F. In some implementations, the gate structure 30A and the gate structures 30D-30G enable a substantially uniform processing environment, for example, enabling uniform epitaxial material growth in source/drain regions of the fins 20A-20F (for example, when forming epitaxial source/drain features), uniform etch rates in source/drain regions of the fins 20A-20F (for example, when forming source/drain recesses), and/or uniform, substantially planar surfaces (for example, by reducing (or preventing) CMP-induced dishing effects).

The gate structures 30A-30G include gate stacks configured to achieve desired functionality according to design requirements of FinFET device 10, such that the gate structures 30A-30G include the same or different layers and/or materials. In the depicted embodiment, the gate structures 30A-30G have gate stacks that include a gate dielectric 32, a gate electrode 34, and a hard mask layer 36. The gate dielectric 32 is conformally disposed over the fins 20A-20F and the isolation feature 22, such that the gate dielectric 32 has a substantially uniform thickness. In the depicted embodiment, the gate dielectric 32 is disposed on sidewall surfaces and bottom surfaces of the FinFET device 10 defining the gate structures 30A-30G. The gate dielectric 32 includes a dielectric material, such as silicon oxide, high-k dielectric material, other suitable dielectric material, or combinations thereof.

In the depicted embodiment, the gate dielectric 32 includes a high-k dielectric material (and thus may be referred to as a high-k dielectric layer), such as hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). In some implementations, the gate dielectric 32 further includes an interfacial layer (including a dielectric material, such as silicon oxide) disposed between the high-k dielectric layer and the fins 20A-20F and the isolation feature 22.

The gate electrode 34 is disposed over gate dielectric 32. The gate electrode 34 includes an electrically conductive material. In some implementations, the gate electrode 34 includes multiple layers, such as a capping layer, a work function layer, a glue/barrier layer, and a metal fill (or bulk) layer. The capping layer can include a material that prevents or eliminates diffusion and/or reaction of constituents between the gate dielectric 32 and other layers of the gate structures 30A-30G (in particular, gate layers including metal). In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. The work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. The glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. The metal fill layer can include a suitable conductive material, such as Al, W, and/or Cu. The gate dielectric 32 and/or the gate electrode 34 may include numerous other layers, for example, capping layers, interface layers, diffusion layers, barrier layers, hard mask layers, or combinations thereof. The hard mask layer 36 includes any suitable material, such as silicon and nitrogen (for example, silicon nitride).

In some implementations, since the gate structures 30A-30D span the P-type FinFET 18A and the N-type FinFET 18B and the gate structures 30E-30G span the n-type well strap 19A and the p-type well strap 19B, the gate structures 30A-30D may have different layers in regions corresponding with the P-type FinFET 18A and the N-type FinFET 18B, and the gate structures 30E-30G may have different layers in regions corresponding with the n-type well strap 19A and the p-type well strap 19B.

Gate stacks of the gate structures 30A-30G are fabricated according to a gate last process, a gate first process, or a hybrid gate last/gate first process. In gate last process implementations, one or more of the gate structures 30A-30G include dummy gate stacks that are subsequently replaced with metal gate stacks. The dummy gate stacks include, for example, an interfacial layer (including, for example, silicon oxide) and a dummy gate electrode layer (including, for example, polysilicon). In such implementations, the dummy gate electrode layer is removed to form openings (trenches) in which the gate dielectric 32 and/or the gate electrode 34 are subsequently formed. In some implementations, a dummy gate stack of at least one of the gate structures 30A-30G is replaced with a metal gate stack, while a dummy gate stack of at least one of the gate structures 30A-30G remains. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof.

The gate structures 30A-30G further include respective gate spacers 38 disposed adjacent to (for example, along sidewalls of) the respective gate stacks. The gate spacers 38 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over the substrate 12 and subsequently anisotropically etched to form the gate spacers 38. In some implementations, the gate spacers 38 include a multi-layer structure, such as a first dielectric layer that includes silicon nitride and a second dielectric layer that includes silicon oxide. In some implementations, the gate spacers 38 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over the substrate 12 and subsequently anisotropically etched to form a first spacer set adjacent to the gate stacks, and a second dielectric layer including silicon and nitrogen can be deposited over the substrate 12 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in the fins 20A-20F (both of which are not shown in FIGS. 2 and 3A-3C) before and/or after forming the gate spacers 38.

Epitaxial source features and epitaxial drain features (referred to as epitaxial source/drain features) are disposed over the source/drain regions of the fins 20A-20F. For example, semiconductor material is epitaxially grown on the fins 20A-20F, forming the epitaxial source/drain features 40A-40D. In some implementations, the epitaxial source/drain features 40A-40D are formed over the source/drain regions of fins 20A-20F after a fin recess process (for example, an etch back process), such that the epitaxial source/drain features 40A-40D are grown from recessed the fins 20A-20F. In some implementations, the epitaxial source/drain features 40A-40D wrap the source/drain regions of the fins 20A-20F. In such implementations, fins 20A-20F may not be subjected to a fin recess process. In FIG. 3B and FIG. 3C, epitaxial source/drain features 40A-40D extend (grow) laterally along the x-direction (in some implementations, substantially perpendicular to fins 20A-20F), such that the epitaxial source/drain features 40A-40D are merged epitaxial source/drain features that span more than one fin. For example, the epitaxial source/drain feature 40A spans the fins 20A, 20B; and the epitaxial source/drain feature 40B spans the fins 20C, 20D.

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of the substrate 12. The epitaxial source/drain features 40A-40D are doped with n-type dopants and/or p-type dopants. The P-type FinFET 18A and the n-type well strap 19A have oppositely doped epitaxial source/drain features, and the N-type FinFET 18B and the p-type well strap 19B have oppositely doped epitaxial source/drain features. In the depicted embodiment, the P-type FinFET 18A and the p-type well strap 19B include a p-type dopant, and the N-type FinFET 18B and n-type well strap 19A include an n-type dopant. For example, for the P-type FinFET 18A (having a p-channel) and the p-type well strap 19B, the epitaxial source/drain features 40A, 40D are epitaxial layers including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer).

In furtherance of the example, for the N-type FinFET 18B (having an n-channel) and the n-type well strap 19A, the epitaxial source/drain features 40B, 40C are epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer). It is noted that, in FIG. 2, the epitaxial source/drain features 40A-40D are depicted as oxide definition (OD) regions, such the epitaxial source/drain features 40A, 40D can alternatively be referred to as P+OD regions and the epitaxial source/drain features 40B, 40C can alternatively be referred to as N+OD regions. In some implementations, the epitaxial source/drain features 40A-40D include materials and/or dopants that achieve desired tensile stress and/or compressive stress in the channel region. In some implementations, the epitaxial source/drain features 40A-40D are doped during deposition by adding impurities to a source material of the epitaxy process. In some implementations, the epitaxial source/drain features 40A-40D are doped by an ion implantation process subsequent to a deposition process. In some implementations, annealing processes are performed to activate dopants in the epitaxial source/drain features 40A-40D and/or other source/drain regions of the FinFET device 10, such as HDD regions and/or LDD regions.

In some implementations, silicide layers are formed on the epitaxial source/drain features 40A-40D. In some implementations, the silicide layers 42A-42D are formed by depositing a metal layer over the epitaxial source/drain features 40A-40D. The metal layer includes any material suitable for promoting silicide formation, such as nickel, platinum, palladium, vanadium, titanium, cobalt, tantalum, ytterbium, zirconium, other suitable metal, or combinations thereof. An integrated circuit device 10 is then heated (for example, subjected to an annealing process) to cause constituents of the epitaxial source/drain features 40A-40D (for example, silicon and/or germanium) to react with the metal. The silicide layers thus include metal and a constituent of the epitaxial source/drain features 40A-40D (for example, silicon and/or germanium). In some implementations, the silicide layers include nickel silicide, titanium silicide, or cobalt silicide. Any un-reacted metal, such as remaining portions of the metal layer, is selectively removed by any suitable process, such as an etching process. In some implementations, the silicide layers and the epitaxial source/drain features 40A-40D are collectively referred to as the epitaxial source/drain features of the integrated circuit device 10.

A multilayer interconnect (MLI) feature 50 is disposed over the substrate 12. The MLI feature 50 electrically couples various devices (for example, transistors, resistors, capacitors, and/or inductors) and/or components (for example, gate structures and/or source/drain features) of the FinFET device 10, such that the various devices and/or components can operate as specified by design requirements of the FinFET device 10. The MLI feature 50 includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature 50. During operation of the FinFET device 10, the interconnect features are configured to route signals between the devices and/or the components of FinFET device 10 and/or distribute signals (for example, clock signals, voltage signals, and/or ground signals) to the devices and/or the components of the FinFET device 10. It is noted that though the MLI feature 50 is depicted with a given number of dielectric layers and conductive layers, the present disclosure contemplates MLI feature 50 having more or less dielectric layers and/or conductive layers.

The MLI feature 50 includes one or more dielectric layers, such as an interlayer dielectric layer 52 (ILD-0) disposed over the substrate 12, an interlayer dielectric layer 54 (ILD-1) disposed over the ILD layer 52, an interlayer dielectric layer 56 (ILD-2) disposed over the ILD layer 54, and an interlayer dielectric layer 58 (ILD-3) disposed over the ILD layer 56. The ILD layers 52-58 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK® (Dow Chemical, Midland, Mich.), polyimide, other low-k dielectric material, or combinations thereof. In the depicted embodiment, the ILD layers 52-58 are dielectric layers that include a low-k dielectric material (generally referred to as low-k dielectric layers). In some implementations, low-k dielectric material generally refers to materials having a dielectric constant (k) that is less than 3. The ILD layers 52-58 can include a multilayer structure having multiple dielectric materials. The MLI feature 50 can further include one or more contact etch stop layers (CESLs) disposed between the ILD layers 52-58, such as a CESL disposed between the ILD layer 52 and the ILD layer 54, a CESL disposed between the ILD layer 54 and the ILD layer 56, and a CESL disposed between the ILD layer 56 and the ILD layer 58. In some implementations, a CESL is disposed between substrate 12 and/or the isolation feature 22 and the ILD layer 52. CESLs include a material different than the ILD layers 52-58, such as a dielectric material that is different than the dielectric material of the ILD layers 52-58. For example, where the ILD layers 52-58 include a low-k dielectric material, CESLs include silicon and nitrogen, such as silicon nitride or silicon oxynitride. The ILD layers 52-58 are formed over the substrate 12 by a deposition process, such as CVD, PVD, ALD, HDPCVD, MOCVD, RPCVD, PECVD, LPCVD, ALCVD, APCVD, plating, other suitable methods, or combinations thereof. In some implementations, the ILD layers 52-58 are formed by a flowable CVD (FCVD) process that includes, for example, depositing a flowable material (such as a liquid compound) over the substrate 12 and converting the flowable material to a solid material by a suitable technique, such as thermal annealing and/or ultraviolet radiation treating. Subsequent to the deposition of the ILD layers 52-58, a CMP process and/or other planarization process is performed, such that the ILD layers 52-58 have substantially planar surfaces.

Device-level contacts 60A-60J, vias 70A-70K, and conductive lines 80A-80I (collectively referred to as a metal one (M1) layer of MLI feature 50) are disposed in ILD layers 52-58 to form interconnect structures. Device-level contacts 60A-60J, vias 70A-70K, and conductive lines 80A-80I include any suitable electrically conductive material, such as Ta, Ti, Al, Cu, Co, W, TiN, TaN, other suitable conductive materials, or combinations thereof. Various conductive materials can be combined to provide the device-level contacts 60A-60J, the vias 70A-70K, and/or the conductive lines 80A-80I with various layers, such as a barrier layer, an adhesion layer, a liner layer, a bulk layer, other suitable layer, or combinations thereof. In some implementations, the device-level-contacts 60A-60J include Ti, TiN, and/or Co; the vias 70A-70K include Ti, TiN, and/or W; and the conductive lines 80A-80I include Cu, Co, and/or Ru. The Device-level contacts 60A-60J, the vias 70A-70K, and the conductive lines 80A-80I are formed by patterning the ILD layers 52-58. The patterning ILD layers 52-58 can include lithography processes and/or etching processes to form openings (trenches), such as contact openings, via openings, and/or line openings in the respective ILD layers 52-58. In some implementations, the lithography processes include forming a resist layer over the respective ILD layers 52-58, exposing the resist layer to patterned radiation, and developing the exposed resist layer, thereby forming a patterned resist layer that can be used as a masking element for etching opening(s) in the respective ILD layers 52-58. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of the ILD layers 52-58, the device-level contacts 60A-60J, the vias 70A-70K, and/or the conductive lines 80A-80I.

The device-level contacts 60A-60J (also referred to as local interconnects or local contacts) electrically couple and/or physically couple IC device features, such as features of the P-type FinFET 18A, the N-type FinFET 18B, the n-type well strap 19A, and the p-type well strap 19B to the vias 70A-70K of the MLI feature 50. For example, the device-level contacts 60A-60J are metal-to-device (MD) contacts, which generally refer to contacts to a conductive region, such as source/drain regions, of the FinFET device 10. In the depicted embodiment, the device-level contact 60A, the device-level contact 60B, and the device-level contact 60C are disposed on the respective epitaxial source/drain features 40A, such that the device-level contacts 60A, 60B, and 60C physically (or directly) connect the source/drain regions of the P-type FinFET 18A respectively to the via 70A, the via 70B, and the via 70C; and the device-level contact 60D, the device-level contact 60E, and the device-level contact 60F are disposed on respective the epitaxial source/drain features 40B, such that the device-level contacts 60D, 60E, and 60F physically (or directly) connect the source/drain regions of the N-type FinFET 18B respectively to the via 70D, the via 70E, and the via 70F. In furtherance of the depicted embodiment, the device-level contact 60G and the device-level contact 60H are disposed on respective on the epitaxial source/drain features 40C, such that the device-level contacts 60G, 60H physically (or directly) connect the source/drain regions of the n-type well strap 19A respectively to the via 70H and the via 70I; and device-level contact 60I and device-level contact 60J are disposed on respective on the epitaxial source/drain features 40D, such that the device-level contacts 60I, 60J physically (or directly) connect the source/drain regions of the p-type well strap 19B respectively to the via 70J and the via 70K. The device-level contacts 60A-60J extend through ILD layer 52 and/or ILD layer 54, though the present disclosure contemplates embodiments where the device-level contacts 60A-60J extend through more or less ILD layers and/or CESLs of the MLI feature 50.

The vias 70A-70K electrically couple and/or physically couple conductive features of the MLI feature 50 to one another. In the depicted embodiment, via 70A is disposed on the device-level contact 60A, such that the via 70A physically (or directly) connects the device-level contact 60A to the conductive line 80A; via 70B is disposed on the device-level contact 60B, such that the via 70B physically (or directly) connects the device-level contact 60B to the conductive line 80B; via 70C is disposed on the device-level contact 60D, such that the via 70C physically (or directly) connects device-level contact 60C to the conductive line 80C; and the via 70D is disposed on the device-level contact 60D, such that the via 70D physically (or directly) connects the device-level contact 60D to the conductive line 80G. The vias 70A, 70B, and 70C electrically couple source/drain regions of the P-type FinFET 18A to the conductive lines 80A, 80B, and 80C (one of which is electrically connected to a power supply voltage $V_{DD}$ (in some implementations, configured as a positive supply voltage depending on design requirements)), and the vias 70D, 70E, and 70F electrically couple source/drain regions of the N-type FinFET 18B to the conductive lines 80G, 80F, and 80E (one of which is electrically connected to a power supply voltage $V_{SS}$ (in some implementations, configured as ground and/or a negative supply voltage). In furtherance of the depicted embodiment, the via 70H is disposed on the device-level contact 60G, such that the via 70H physically (or directly) connects the device-level contact 60G to the conductive line 80H; the via 70I is disposed on the device-level contact 60H, such that via the 70I physically (or directly) connects the device-level contact 60G to the conductive line 80H; the via 70J is disposed on device-level contact 60I, such that the via 70J physically (or directly) connects the device-level contact 60I to the conductive line 80I; and the via 70K is disposed on the device-level contact 60J, such that the via 70K physically (or directly) connects the device-level contact 60J to the conductive line 80I. The vias 70H, 70I electrically couple source/drain regions of the n-type well strap 19A to the conductive line 80H (which is electrically connected to power supply voltage $V_{DD}$), and the vias 70J, 70K electrically couple source/drain regions of the p-type well strap 19B to the conductive line 80I (which is electrically connected to power supply voltage $V_{SS}$). The vias 70A-70F and the vias 70H-70K extend through ILD layer 54, though the present disclosure contemplates embodiments where vias 70A-70F and vias 70H-70K extend through more or less ILD layers and/or CESLs of MLI feature 50. In some implementations, the MLI feature 50 further includes vias that the interconnect conductive lines 80A-80I (in other words, the M1 layer) to conductive lines disposed in other ILD layers (such as a metal two (M2) layer of the MLI feature 50, not shown) overlying the ILD layers 52-58, thereby electrically and/or physically coupling the M1 layer to the M2 layer.

The via 70G that electrically couples and/or physically couples an IC device feature to a conductive feature of the MLI feature 50. In FIG. 2, via 70G is disposed on the gate structure 30B, such that the via 70G physically (or directly) connects the gate structure 30B to the conductive line 80D. The via 70G extends through ILD layer 52, ILD layer 54, and the ILD layer 56, though the present disclosure contemplates embodiments where the via 70G extends through more or less ILD layers and/or CESLs of the MLI feature 50.

In such implementations, the via 70G is physically and electrically coupled with the gate structure 30B. In alternative implementations, the MLI feature 50 further includes a device-level contact that electrically couples and/or physically couples the gate structure 30B to the via 70G. For example, the device-level contact is disposed on the gate structure 30B, such that the device-level contact physically (or directly) connects the gate structure 30B to the via 70G, and via the 70G physically (or directly) connects the device-level contact to the conductive line 80D. Such device-level contact is thus referred to as a gate contact (CG) or metal-to-poly (MP) contact, which generally refers to a contact to a gate structure, such as a poly gate structure or a metal gate structure. In such implementations, the device-level contact extends through the ILD layer 52 and the ILD layer 54, and the via 70G extends through ILD layer 56, though the present disclosure contemplates embodiments where the device-level contact and/or the via 70G extend through more or less ILD layers and/or CESLs of Well straps, such as the n-type well strap 19A and the p-type well strap 19B, can be implemented in memory arrays to improve performance.

In some embodiments, the layout is represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, the layout is presented by at least one first mask corresponding to the fins 20A-20F, at least one second mask corresponding to the gate structures 30A-30G, at least one third mask corresponding to the device-level contacts 60A-60J, at least one fourth mask corresponding to the vias 70A-70K, and at least one fifth mask corresponding to the conductive lines 80A-80I.

Figure 4:
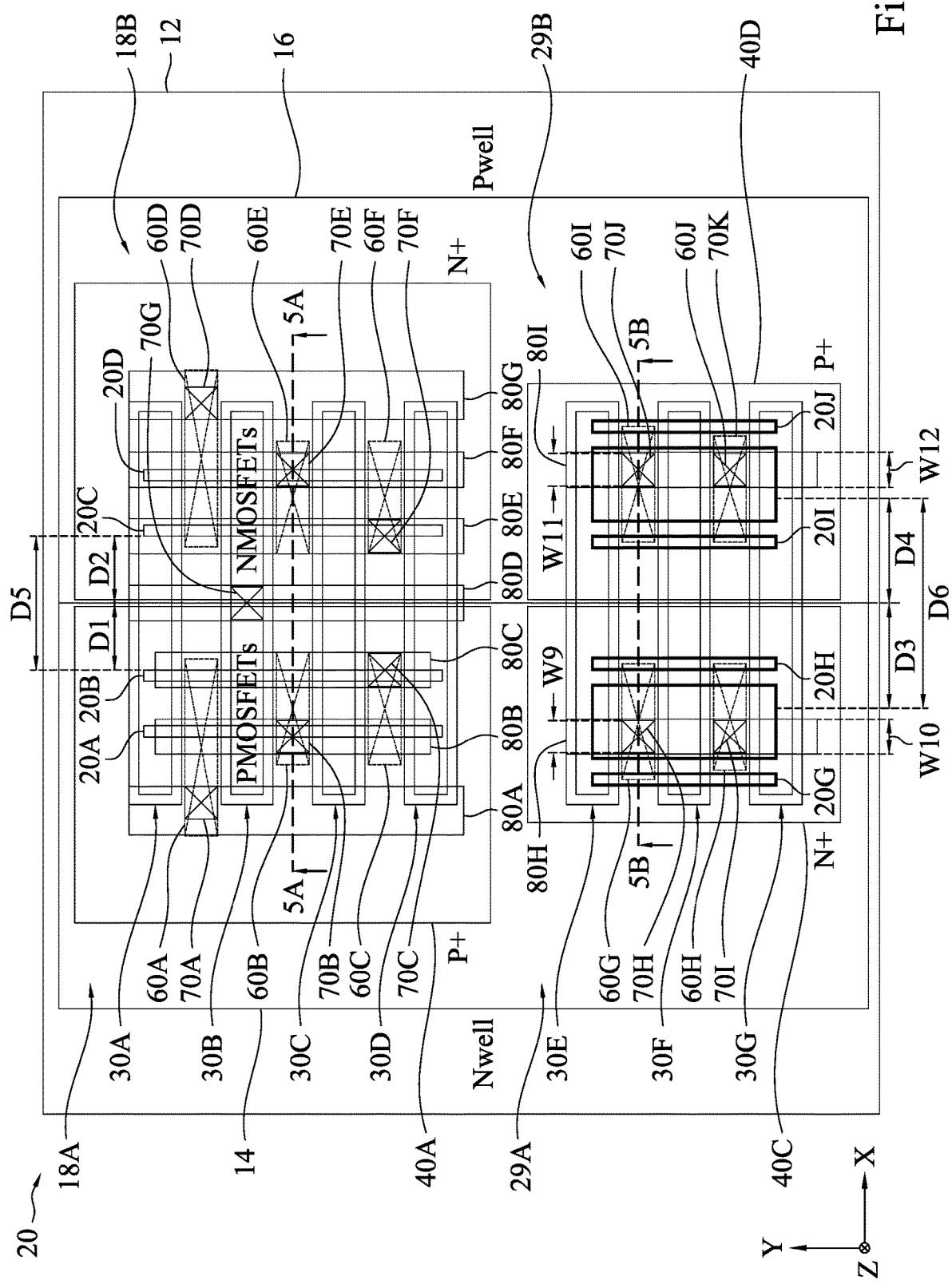
FIG. 4 is a layout view of a FinFET device P-type well strap, in accordance with one or more embodiments.

FIG. 4 is a layout view of FinFET device 20 P-type well strap, in accordance with one or more embodiments. In particular, FIG. 4 is a simplified schematic top view of FinFET device 20 (for example, in an x-y plane); FIG. 5A is a diagrammatic cross-sectional view of the FinFET device 20 along line 5A-5A of FIG. 4 (for example, in a y-z plane); and FIG. 5B is a diagrammatic cross-sectional view of the FinFET device 20 along line 5B-5B of FIG. 4 (for example, in an x-z plane).

The layout view of the FinFET device 20 is similar in many respects to the layout view of the FinFET device 10. Accordingly, similar features in FIGS. 2-5B are identified by the same reference numerals for clarity and simplicity. FIGS. 4, 5A, and 5B have been simplified for the sake of clarity to better understand the inventive concepts of the present disclosure. Additional features can be added in the FinFET device 20, and some of the features described below can be replaced, modified, or eliminated in other embodiments of the FinFET device 20.

It is noted that, the difference between the present embodiment and the embodiment in FIGS. 2-3C is in that an n-type well strap 29A further includes fins 20G and 20H thereon and that a p-type well strap 29B further includes fins 20I and 20J thereon. Therefore, the present embodiment replaces the n-type well strap 19A and p-type well strap 19B as shown in FIGS. 2-3C with the n-type well strap 29A and p-type well strap 29B.

Figure 5B:
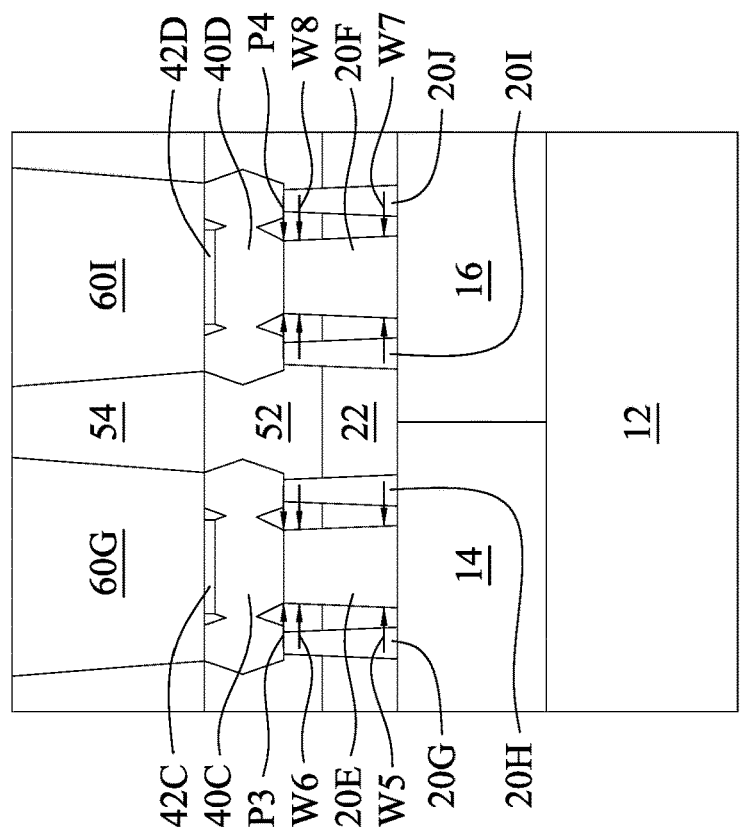
FIGS. 5A and 5B are cross section views along line 5A-5A and line 5B-5B in FIG. 4, respectively.
Figure 5A:
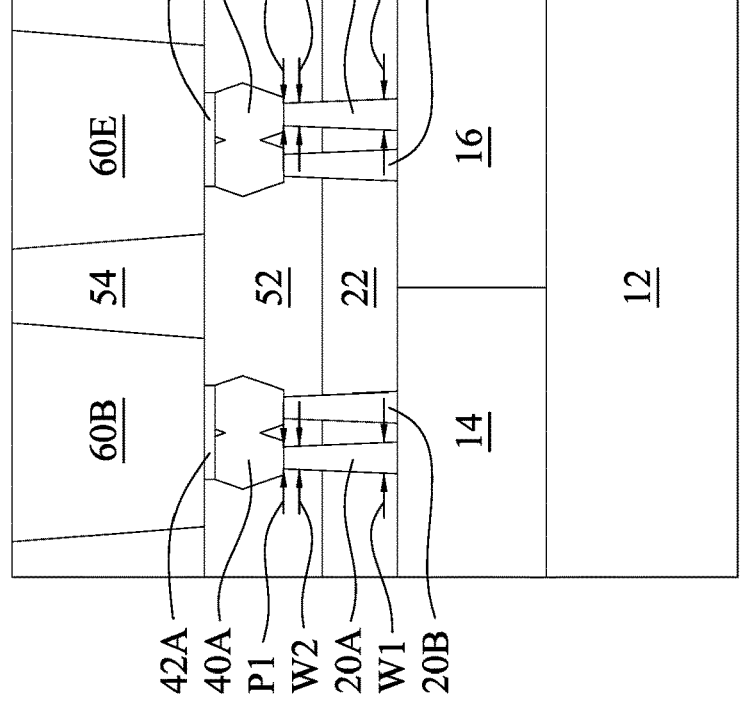

In FIGS. 4 and 5B, the fins 20G and 20H of the n-type well strap 29A are symmetrically disposed around the fin 20E and the fins 20I and 20J of the p-type well strap 29B are symmetrically disposed around the fin 20F. In some embodiments, widths of the fins 20G and 20H each is less than the width W10 of the fin 20E and is substantially equal to a width of a fin of the FinFET. In some embodiments, widths of the fins 20G and 20H each is about 0.9 to about 1.1 times of a width of a fin of the FinFET. In some embodiments, widths of the fins 20I and 20J each is less than the width W12 of the fin 20F and is substantially equal to a width of a fin of the FinFET. In some embodiments, widths of the fins 20I and 20J each is about 0.9 to about 1.1 times of a width of a fin of the FinFET.

Figure 6:
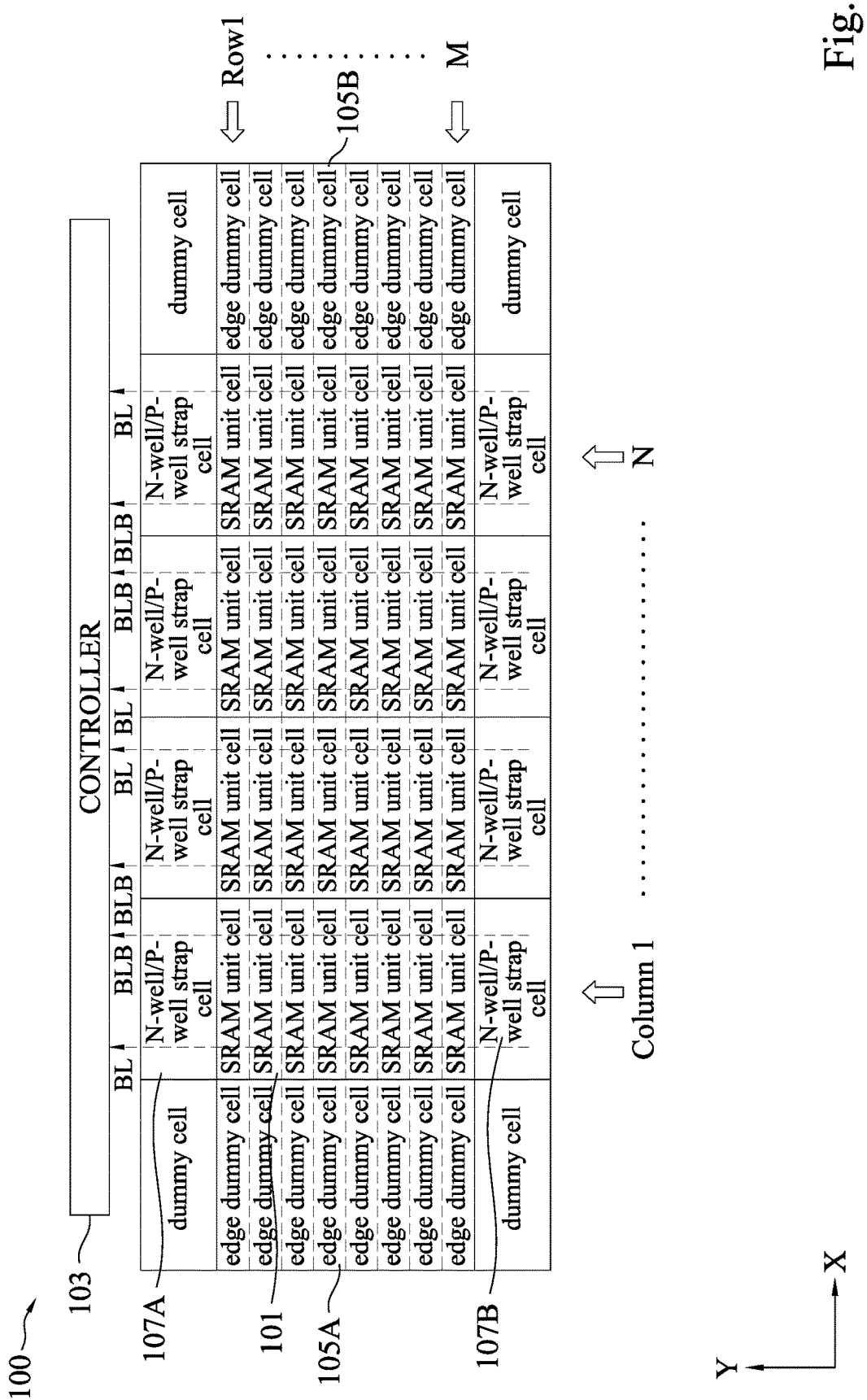
FIG. 6 is a plan view of a static random access memory (SRAM) array, in accordance with one or more embodiments.

FIG. 6 is a diagrammatic plan view of a memory array 100, which can implement well straps configured as described herein, according to various aspects of the present disclosure. In the depicted embodiment, the memory array 100 is a static random access memory (SRAM) array. However, the present disclosure contemplates embodiments, where memory array 100 is another type of memory, such as a dynamic random access memory (DRAM), a non-volatile random access memory (NVRAM), a flash memory, or other suitable memory. The memory array 100 may be included in a microprocessor, a memory, and/or other IC device. In some implementations, the memory array 100 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 6 has been simplified for the sake of clarity to better understand the inventive concepts of the present disclosure. Additional features can be added in the memory array 100, and some of the features described below can be replaced, modified, or eliminated in other embodiments of the memory array 100.

The memory array 100 includes memory cells 101, such as SRAM memory cells, configured to store data. In some implementations, the memory cells 101 include various p-type FinFETs and/or n-type FinFETs. The memory cells 101 are arranged in column 1 to column N extending along a first direction (here, in a y-direction) and row 1 to row M extending along a second direction (here, in an x-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 101 in true form and complementary form on a column-by-column basis. Row 1 to row M each includes a word line (WL) (not shown) that facilitates access to respective the memory cells 101 on a row-by-row basis. Each memory cell 101 is electrically connected to a respective BL, a respective BLB, and a respective WL, which are electrically connected to a controller 103. A controller 103 is configured to generate one or more signals to select at least one WL and at least one bit line pair (here, BL and BLB) to access at least one of memory cells 101 for read operations and/or write operations. The controller 103 includes any circuitry suitable to facilitate read/write operations from/to the memory cells 101, including but not limited to, a column decoder circuit, a row decoder circuit, a column selection circuit, a row selection circuit, a read/write circuit (for example, configured to read data from and/or write data to the memory cells 101 corresponding to a selected bit line pair (in other words, a selected column)), other suitable circuit, or combinations thereof. In some implementations, the controller 103 includes at least one sense amplifier configured to detect and/or amplify a voltage differential of a selected bit line pair. In some implementations, the sense amplifier is configured to latch or otherwise store data values of the voltage differential.

A perimeter of the memory array 100 is configured with dummy cells, such as edge dummy cells and well strap cells, to ensure uniformity in performance of the memory cells 101. Dummy cells are configured physically and/or structurally similar to memory cells 101, but do not store data. For example, dummy cells can include p-type wells, n-type wells, fin structures (including one or more fins), gate structures, source/drain features, and/or contact features. Well strap cells generally refer to dummy cells that are configured to electrically couple a voltage to an n-type well of memory cells 101, a p-type well of memory cells 101, or both. In the depicted embodiment, row 1 to row M each begin with an edge dummy cell 105A and end with an edge dummy cell 105B, such that row 1 to row M of memory cells 101 are disposed between edge dummy cells 105A and edge dummy cells 105B. Edge dummy cells 105A and edge dummy cells 105B are arranged in respective columns extending along the first direction (here, the y-direction). In some implementations, the column of edge dummy cells 105A and/or the column of edge dummy cells 105B are substantially parallel to at least one bit line pair (here, BL and BLB) of memory array 100. In some implementations, edge dummy cells 105A and/or edge dummy cells 105B are configured to connect respective memory cells 101 to respective WLs. In some implementations, edge dummy cells 105A and/or edge dummy cells 105B include circuitry for driving WLs. In some implementations, edge dummy cells 105A and/or edge dummy cells 105B are electrically connected to a power supply voltage $V_{DD}$ (for example, a positive power supply voltage) and/or a power supply voltage $V_{SS}$ (for example, an electrical ground) depending on design requirements of memory array 100.

In furtherance of the depicted embodiment, column 1 to column N each begin with a well strap cell 107A and end with a well strap cell 107B, such that column 1 to column N of memory cells 101 are disposed between well strap cells 107A and well strap cells 107B. Well strap cells 107A and well strap cells 107B are arranged in respective rows extending along the second direction (here, the x-direction). In some implementations, the row of well strap cells 107A and the row of well strap cells 107B are substantially parallel to at least one WL of memory array 100. Well strap cells 107A are disposed between one of edge dummy cells 105A and one of edge dummy cells 105B, and well strap cells 107B are disposed between one of edge dummy cells 105A and one of edge dummy cells 105B. In the depicted embodiment, well strap cells 107A and/or well strap cells 107B include an n-type well strap, a p-type well strap, or both an n-type well strap and a p-type well strap. In some implementations, well strap cells 107A and/or well strap cells 107B include an n-type well strap region having one or more n-type well straps disposed adjacent to a p-type well strap region having one or more p-type well straps. The n-type well strap region and the p-type well strap region may be disposed between dummy regions of the well strap cells 107A and/or the well strap cells 107B.

In some implementations, the n-type well strap is configured as n-type well strap 19A described above. For example, an n-type well strap of well strap cells 107A and/or well strap cells 107B is configured to electrically couple an n-type well that corresponds with at least one p-type FinFET of memory cells 101 to a voltage source (for example, $V_{DD}$), where a dopant concentration of a fin structure of the n-type well strap is greater than a dopant concentration of a fin structure of the at least one p-type FinFET. In some implementations, the p-type FinFET includes a fin doped with an n-type dopant of a first dopant concentration, and the n-type well strap includes a fin doped with the n-type dopant of a second dopant concentration, where the second dopant concentration is at least three times greater than the first dopant concentration. In some implementations, the n-well region has a third dopant concentration of the n-type dopant, where the third dopant concentration is greater than the first dopant concentration. In some implementations, the fins of the p-type FinFET and the n-type well strap have source/drain features doped with different type dopants. For example, the p-type FinFET includes source/drain features doped with a p-type dopant and the n-type well strap includes source/drain features doped with an n-type dopant.

In some implementations, the n-type well strap is configured as p-type well strap 19B described above. For example, a p-type well strap of well strap cells 107A and/or well strap cells 107B is configured to electrically couple a p-type well that corresponds with at least one n-type FinFET of memory cells 101 to a voltage source (for example, $V_{SS}$), where a dopant concentration of a fin structure of the p-type well strap is greater than a dopant concentration of a fin structure of the at least one n-type FinFET. In some implementations, the n-type FinFET includes a fin doped with a p-type dopant of a first dopant concentration, and the p-type well strap includes a fin doped with the p-type dopant of a second dopant concentration, where the second dopant concentration is at least three times greater than the first dopant concentration. In some implementations, the p-well has a third dopant concentration of the p-type dopant, where the third dopant concentration is greater than the first dopant concentration. In some implementations, the fins of the n-type FinFET and the p-type well strap have source/drain features doped with different type dopants. For example, the n-type FinFET includes source/drain features doped with an n-type dopant, and the p-type well strap includes source/drain features doped with a p-type dopant.

Figure 7:
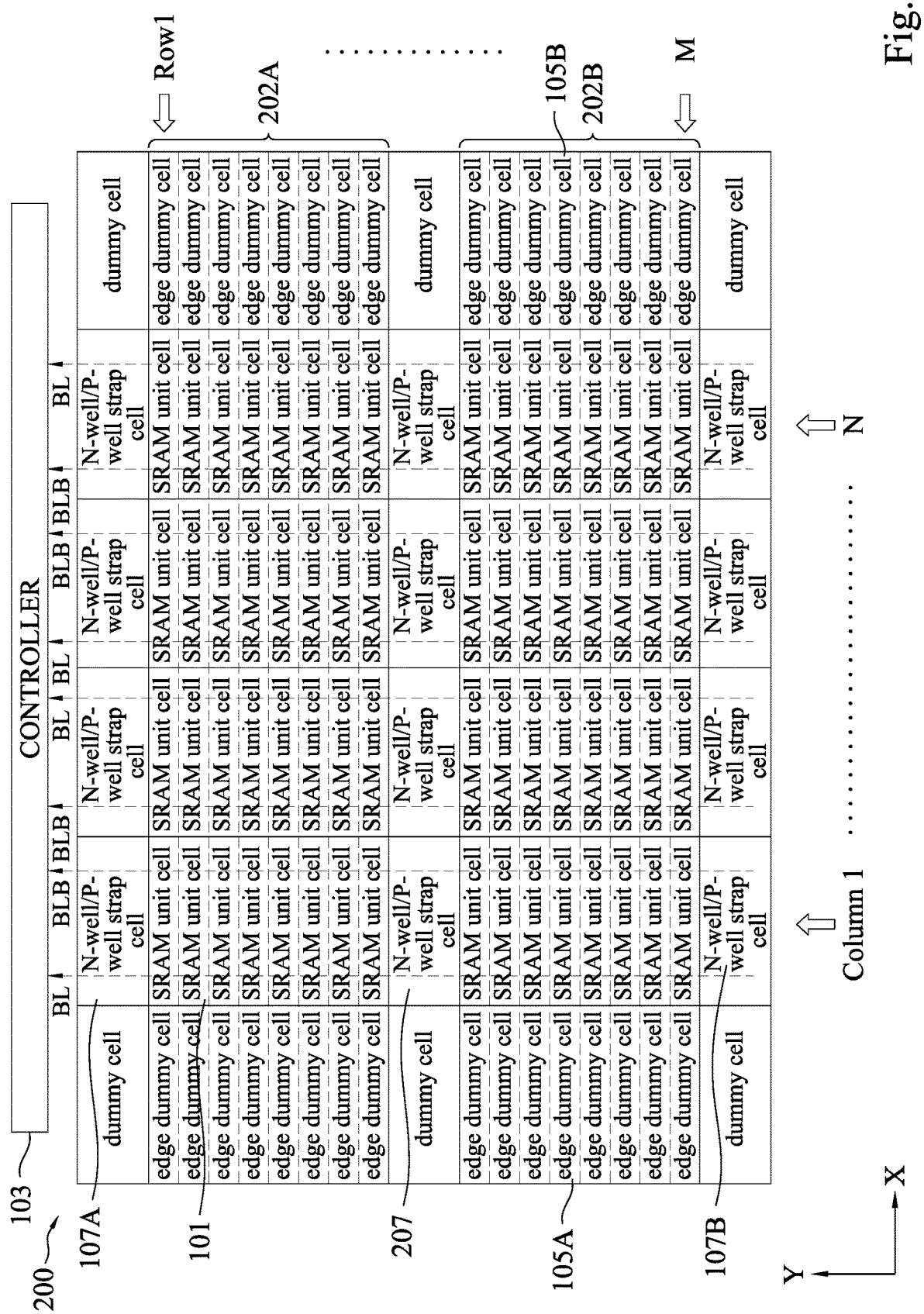
FIG. 7 is a plan view of a SRAM array, in accordance with one or more embodiments.
Figure 8:
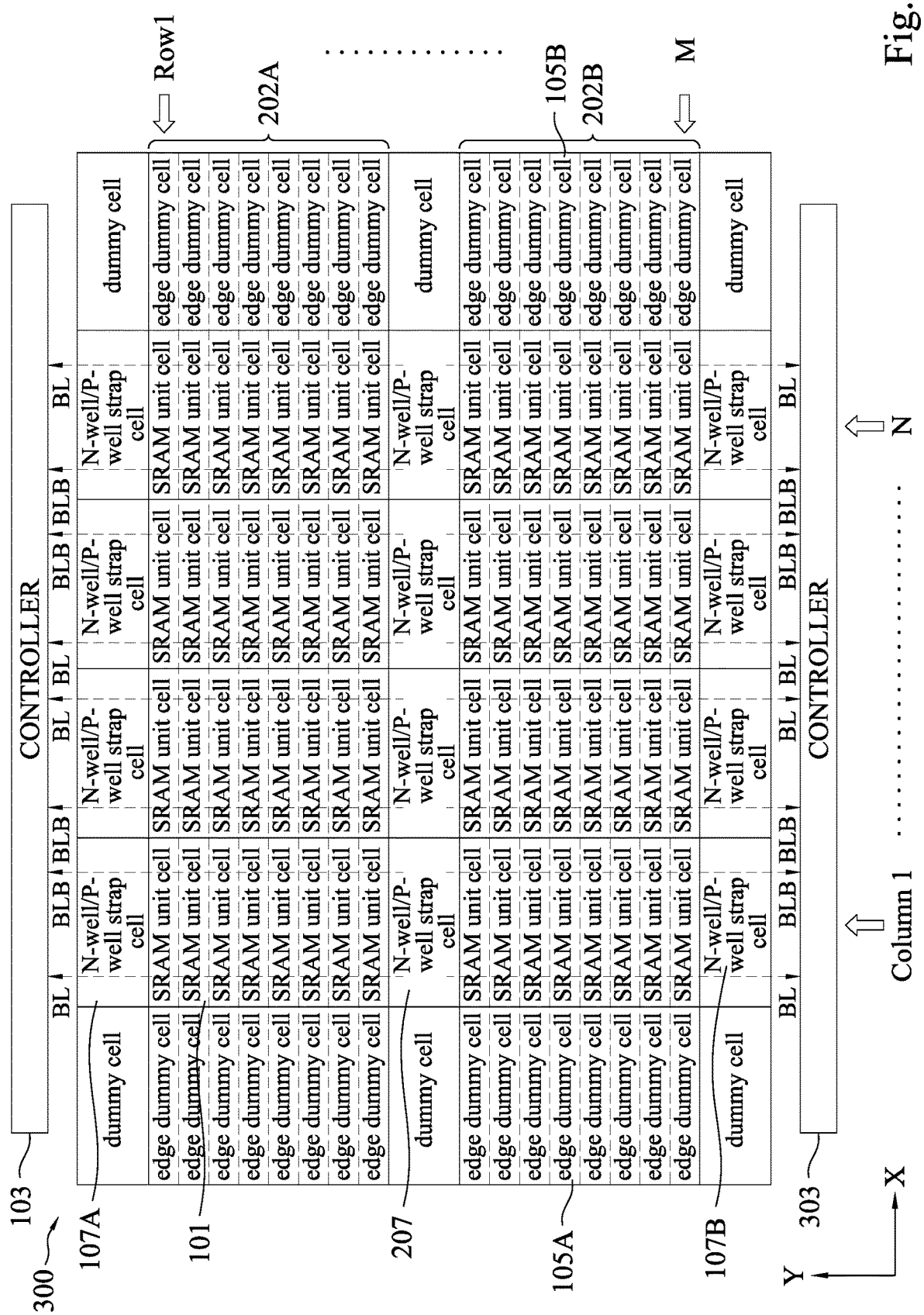
FIG. 8 is a plan view of a SRAM array, in accordance with one or more embodiments.

FIG. 7 is a diagrammatic plan view of a memory array 200, such as a SRAM array, which can implement well straps configured as described herein, according to various aspects of the present disclosure. Memory array 200 is similar in many respects to memory array 200. For example, in the depicted embodiment, memory array 200 is a SRAM array. Accordingly, similar features in FIG. 8 and FIG. 7 are identified by the same reference numerals for clarity and simplicity. Memory array 200 may be included in a microprocessor, a memory, and/or other IC device. In some implementations, memory array 200 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 8 has been simplified for the sake of clarity to better understand the inventive concepts of the present disclosure. Additional features can be added in memory array 200, and some of the features described below can be replaced, modified, or eliminated in other embodiments of memory array 200.

In FIG. 7, memory array 200 includes memory cells 101, controller 103, edge dummy cells 105A, edge dummy cells 105B, well strap cells 107A, and well strap cells 107B. In contrast to memory array 100, memory array 200 divides memory cells 101 into a memory array 202A and a memory array 202B (which can be referred to as sub-arrays). Each memory cell 101 of memory array 202A is electrically connected to a respective BL, a respective BLB, and a respective WL, which are electrically connected to controller 103, and each memory cell 101 in memory array 202B is electrically connected to a respective BL, a respective BLB, and a respective WL, which are electrically connected to controller 103.

Memory array 200 further includes a row of well strap cells 207 extending along the second direction (here, the x-direction), where the row of well strap cells 307 is disposed between memory array 202A and memory array 202B. Memory cells 101 in memory array 202A are disposed between well strap cells 107A and well strap cells 207, and memory cells 101 in memory array 202B are disposed between well strap cells 207 and well strap cells 107B. Column 1 to column N of memory cells 101 in memory array 202A thus each begin with one of well strap cells 107A and end with one of well strap cells 207, and column 1 to column N of memory cells 101 in memory array 202B thus each begin with one of well strap cells 207 and end with one of well strap cells 107B. In furtherance of the depicted embodiment, the row of well strap cells 307 is also disposed between one of edge dummy cells 105A and one of edge dummy cells 105B. In some implementations, the row of well strap cells 207 is substantially parallel to at least one WL of memory array 200.

Well strap cells 207 are similar to well strap cells 107A and/or well strap cells 107B. For example, well strap cells 207 include an n-type well strap, a p-type well strap, or both an n-type well strap and a p-type well strap. In some implementations, well strap cells 207 include an n-type well strap region having one or more n-type well straps that is adjacent to a p-type well strap region having one or more p-type well straps. The n-type well strap region and the p-type well strap region may be disposed between dummy regions. In some implementations, the n-type well strap is configured as n-type well strap 19A described above. For example, an n-type well strap of well strap cells 207 is configured to electrically couple an n-type well that corresponds with at least one p-type FinFET of memory cells 101 to a voltage source (for example, $V_{DD}$), where a dopant concentration of a fin structure of the n-type well strap is greater than a dopant concentration of a fin structure of the at least one p-type FinFET. In some implementations, the dopant concentration of the fin structure of the n-type well strap is at least three times greater than the dopant concentration of the fin structure of the at least one p-type FinFET. In some implementations, the fin structures of the n-type well strap and the p-type FinFET have oppositely doped source/drain features (or OD regions). In some embodiments, a width of a fin structure of an n-type well strap is greater than a width of a fin structure of at least one p-type FinFET in the memory array 202A or memory array 202B. In some embodiments, a distance between a corresponding fin structure of an n-type well strap and a p-type doped region is greater than a distance between a corresponding fin structure of a p-type FinFET in the memory array 202A or memory array 202B and the p-type doped region. In some embodiments, a width of the fin of an n-type well strap is greater than a width of a device-level contact and/or a conductive line connecting the fin of the n-type well strap.

In some implementations, the p-type well strap is configured as p-type well strap 19B described above. For example, a p-type well strap of well strap cells 207 is configured to electrically couple a p-type well that corresponds with at least one n-type FinFET of memory cells 101 to a voltage source (for example, $V_{SS}$), where a dopant concentration of a fin structure of the p-type well strap is greater than a dopant concentration of a fin structure of the at least one n-type FinFET. In some implementations, the dopant concentration of the fin structure of the p-type well strap is at least three times greater than the dopant concentration of the fin structure of the at least one n-type FinFET. In some implementations, the fin structures of the p-type well strap and the n-type FinFET have oppositely doped source/drain features (or OD regions). In some embodiments, a width of a fin structure of a p-type well strap is greater than a width of a fin structure of the at least one n-type FinFET in the memory array 202A or memory array 202B. In some embodiments, a distance between a corresponding fin structure of a p-type well strap and an n-type doped region is greater than a distance between a corresponding fin structure of an n-type FinFET in the memory array 202A or memory array 202B and the n-type doped region. In some embodiments, a width of the fin of a p-type well strap is greater than a width of a device-level contact and/or a conductive line connecting the fin of the n-type well strap.

FIG. 8 is a diagrammatic plan view of a memory array 300, such as a SRAM array, which can implement well straps configured as described herein, according to various aspects of the present disclosure. Memory array 200 is similar in many respects to memory array 200. For example, in the depicted embodiment, memory array 200 is a SRAM array. Accordingly, similar features in FIG. 8 and FIG. 7 are identified by the same reference numerals for clarity and simplicity. Memory array 200 may be included in a microprocessor, a memory, and/or other IC device. In some implementations, memory array 200 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 8 has been simplified for the sake of clarity to better understand the inventive concepts of the present disclosure. Additional features can be added in memory array 200, and some of the features described below can be replaced, modified, or eliminated in other embodiments of memory array 200.

In FIG. 8, memory array 300 includes memory cells 101, controller 103, edge dummy cells 105A, edge dummy cells 105B, well strap cells 107A, and well strap cells 107B. In contrast to memory array 200, each bit line pair is broken into a bit line pair for memory array 202A and a bit line pair for memory array 202B, such that column 1 to column N each have two bit line pairs, not a continuous bit line pair. The memory array 300 further includes a controller 303, where BLs, BLBs, and WLs for memory array 202A are electrically connected to controller 103, while BLs, BLBs, and WLs for memory array 202B are electrically connected to controller 303. The controller 303 is similar to controller 103. Accordingly, each memory cell 101 of memory array 202A is electrically connected to a respective BL, a respective BLB, and a respective WL, which are electrically connected to controller 103, and each memory cell 101 in memory array 202B is electrically connected to a respective BL, a respective BLB, and a respective WL, which are electrically connected to controller 303.

Figure 9:
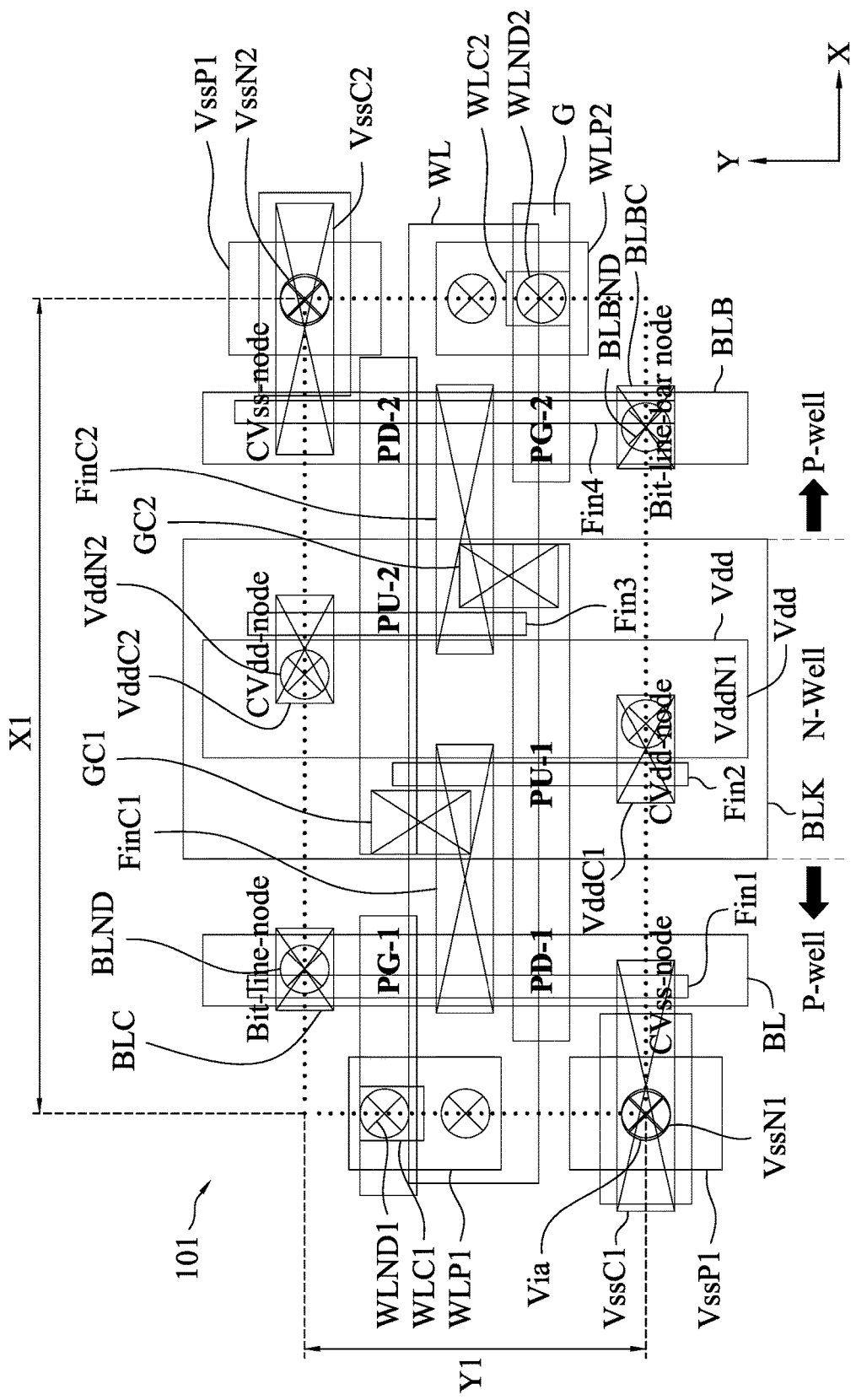
FIG. 9 is a layout view of a SRAM cell, in accordance with one or more embodiments.

FIG. 9 is a layout view of the SRAM cell, in accordance with one or more embodiments. The memory cell 101 is a six-transistor (6T) SRAM cell. The memory cell 101 is described as a finFET device. As such, FIG. 9 includes local interconnects, fin structures, and wells for a 6T SRAM cell using single fin finFET devices. The memory cell 101 also includes semiconductor fin structures Fin1, Fin2, Fin3, and Fin4. The memory cell 101 includes vias in one or more layers that are over or under a corresponding contact or landing pad. Vias are illustrated as circular shapes with an "X" in the center. The vias extend vertically (into and out of the page) and are configured to provide connections between conductive layers on different levels of the memory cell 101. The memory cell 101 has a pitch Y1 in the first direction Y and pitch X1 in the second direction X. In some embodiments, the ratio of X1 to Y1 is greater than or equal to 2.

Fin structures Fin1 and Fin4 are over P-wells, respectively. Fin structures Fin2 and Fin3 are over an N-well region to provide the semiconductor region for the first pull up transistor PU-1 and the second pull up transistor PU-2. In some embodiments, the N-well region also provides a contact for the body or bulk terminal BLK of the first pull up transistor PU-1 and the second pull up transistor PU-2.

Fin structure Fin1 provides channel, source and drain regions for the first pull down transistor PD-1 and the first pass gate PG-1. Fin structure Fin2 provides channel, source and drain regions for the first pull up transistor PU-1. Fin structure Fin3 provides channel, source and drain regions for the second pull up transistor PU-2. Fin structure Fin4 provides channel, source and drain regions for the second pull down transistor PD-2 and the second pass gate PG-2.

Gate material G, which forms the gate electrodes for each of transistors PU-1, PU-2, PD-1, PD-2, PG-1 and PG-2 is over fin structures Fin1, Fin2, Fin3 and Fin4. The source and drain regions for transistors PU-1, PU-2, PD-1, PD-2, PG-1 and PG-2 are in the corresponding fin structures on opposite sides of the gate electrode of each corresponding transistor PU-1, PU-2, PD-1, PD-2, PG-1 and PG-2.

Fin structures Fin1, Fin2, Fin3 and Fin4 are configured as connection points to conductive features on levels of the memory cell 101 that are above the fin structures Fin1, Fin2, Fin3 and Fin4 such as bit line portion BL, complementary bit line portion BLB, word line portion WL, first voltage line $V_{SS}$ and second voltage line Vdd.

First pass gate PG-1 is electrically connected with word line portion WL at word line node WLND1 by way of fin structure Fin1, word line portion landing pad WLP1, word line portion contact WLC1 and at least one via. Second pass gate PG-2 is electrically connected with word line portion WL at word line node WLND2 by way of fin structure Fin4, word line portion landing pad WLP2, word line portion contact WLC2 and at least one via. First pass gate PG-1 is electrically connected with bit line portion BL by way of fin structure Fin1, bit line portion contact BLC and at least one via at bit line node BLND. Second pass gate PG-2 is electrically connected with complementary bit line portion BLB by way of fin structure Fin4, complementary bit line portion contact BLBC and at least one via at complementary bit line node BLBND.

First pull-up transistor PU-1 is electrically connected to second voltage line Vdd by way of fin structure Fin2, voltage contact VddC1 and at least one via at voltage node VddN1. Second pull-up transistor PU-2 is electrically connected to second voltage line Vdd by way of fin structure Fin3, voltage contact VddC2 and at least one via at voltage node VddN2.

First pull-down transistor PD-1 is electrically connected to first voltage line $V_{SS}$ by way of fin structure Fin1, voltage line landing pad $V_{SS}$P1, voltage contact $V_{SS}$C1 and at least one via at voltage node $V_{SS}$N1. Second pull-down transistor PD-2 is electrically connected to first voltage line $V_{SS}$ by way of fin structure Fin4, voltage line landing pad $V_{SS}$P2, voltage contact $V_{SS}$C2 and at least one via at voltage line $V_{SS}$N2.

The various contacts are configured to provide vertical connections between conductive features of the memory cell 101 on different levels of the memory cell 101. In some embodiments, some of the contacts are over one or more of the fin structures Fin1, Fin2, Fin3 or Fin4, and some of the contacts are over the gate material G of one or more of transistors PU-1, PU-2, PD-1, PD-2, PG-1 and PG-2. Some of the contacts are configured to electrically connect elements of the memory cell 101 that are on a same level. For example, fin structure Fin1 is coupled with fin structure Fin2 by a first fin contact FinC1. Similarly, fin structure Fin3 is coupled with fin structure Fin4 by a second fin contact FinC2. In some embodiments, one or more of first fin contact FinC1 is coupled with the gate of second pull up transistor PU-2 by way of a first gate contact GC1, and second fin contact FinC2 is coupled with the gate of first pull up transistor PU-1 by way of a second gate contact GC2.

First fin contact FinC1 and first gate contact GC1 together couple the gate of second pull up transistor PU-2 with the source/drain regions of first pull up transistor PU-1 (i.e., fin structure Fin2) and the source/drain regions of first pull down transistor PD-1 (i.e., fin structure Fin1), forming storage node SN. Similarly, second fin contact FinC2 and second gate contact GC2 together couple the gate of first pull up transistor PU-1 with the source/drain regions of second pull up transistor PU-2 (i.e., fin structure Fin3) and the source/drain regions of second pull down transistor PD-2 (i.e., fin structure Fin4), forming storage node SNB.

Figure 10:
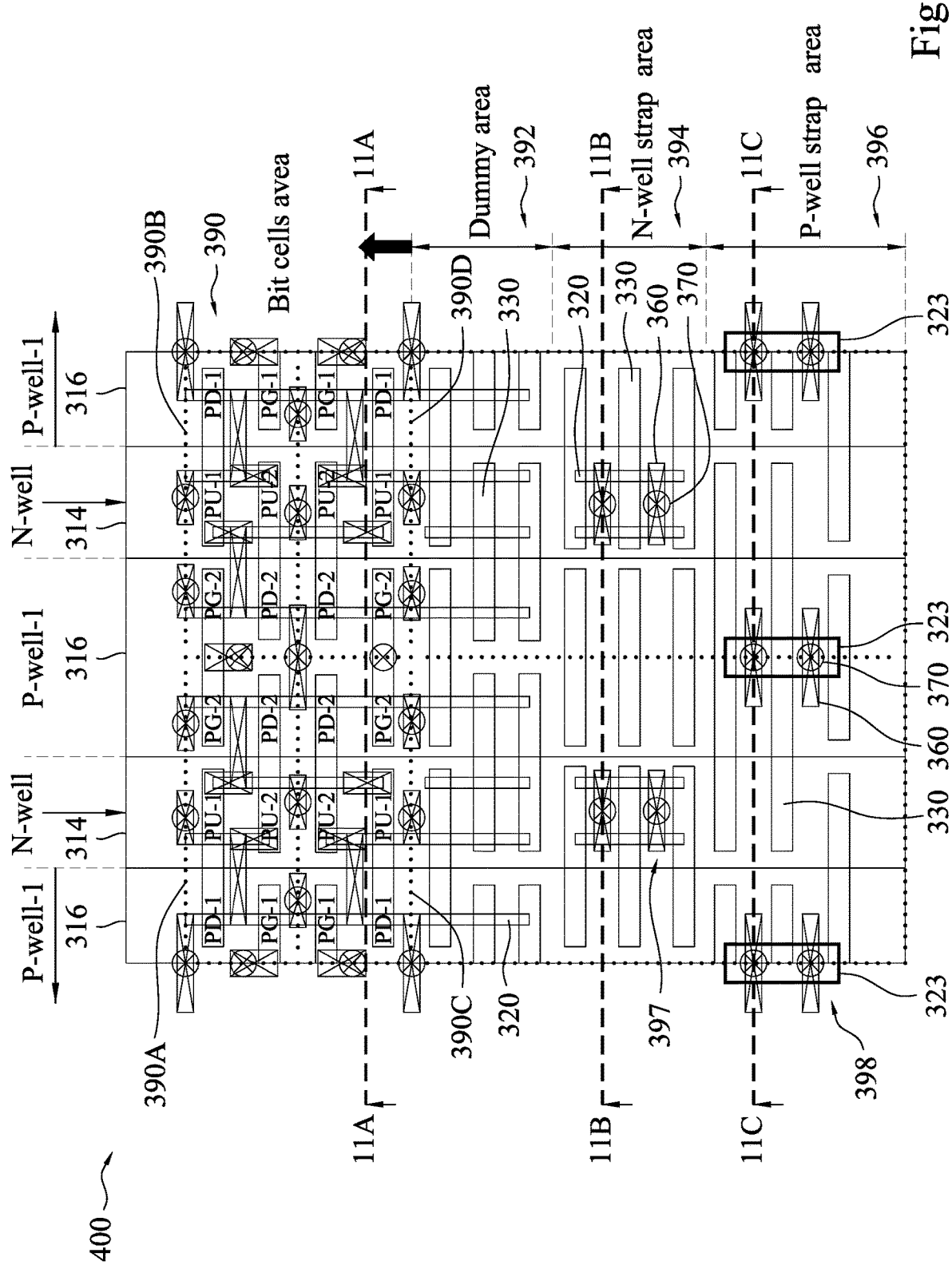
FIG. 10 is a layout view of a SRAM array with columns of SRAM cells having a row of N-type/P-type well strap cells at an end of the columns of SRAMS cells, in accordance with one or more embodiments.
Figure 11A:
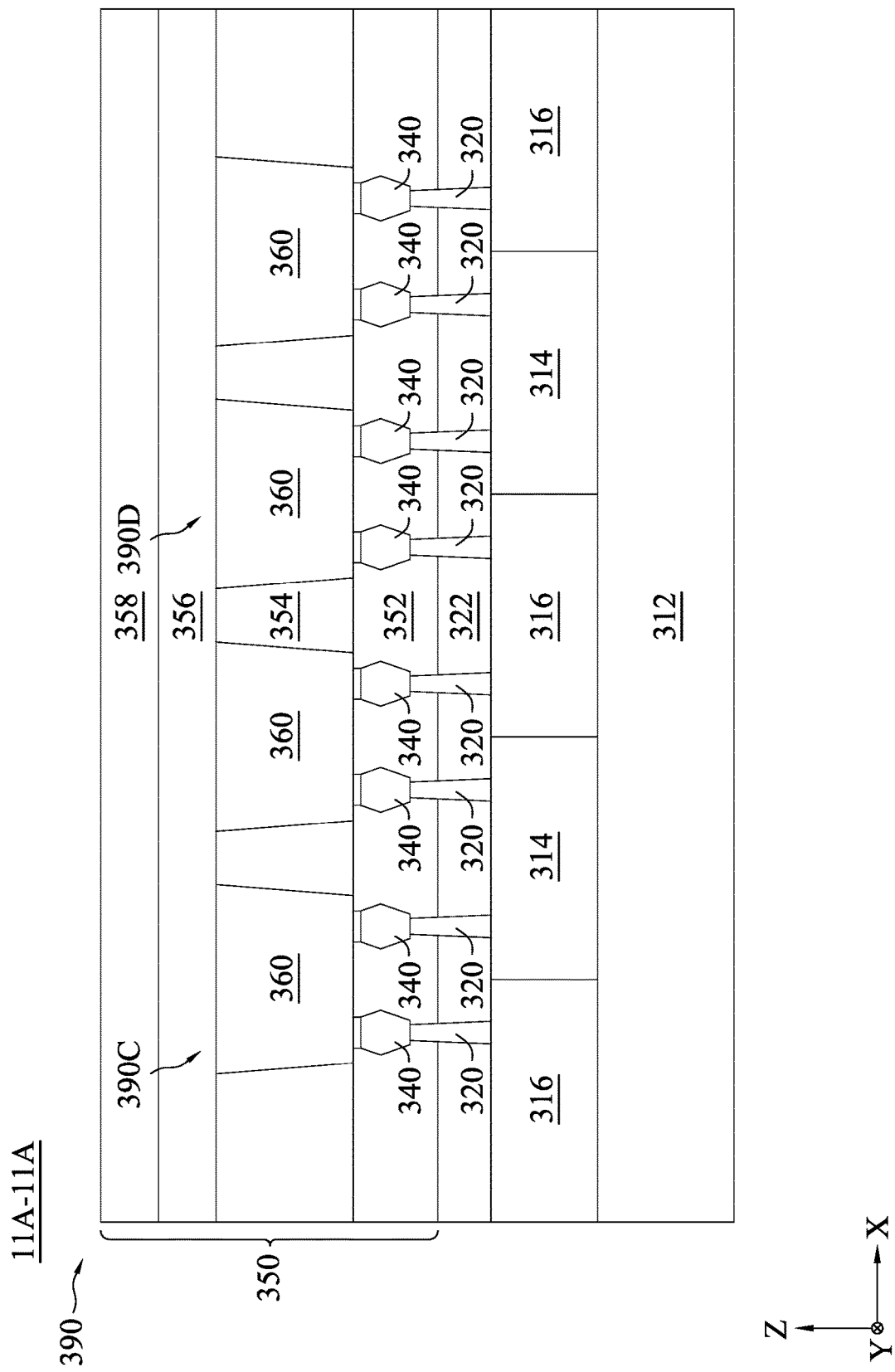
FIGS. 11A, 11B, and 11C are cross-sectional views along line 11A-11A, line 11B-11B, and line 5C-5C in FIG. 10, respectively.
Figure 11B:
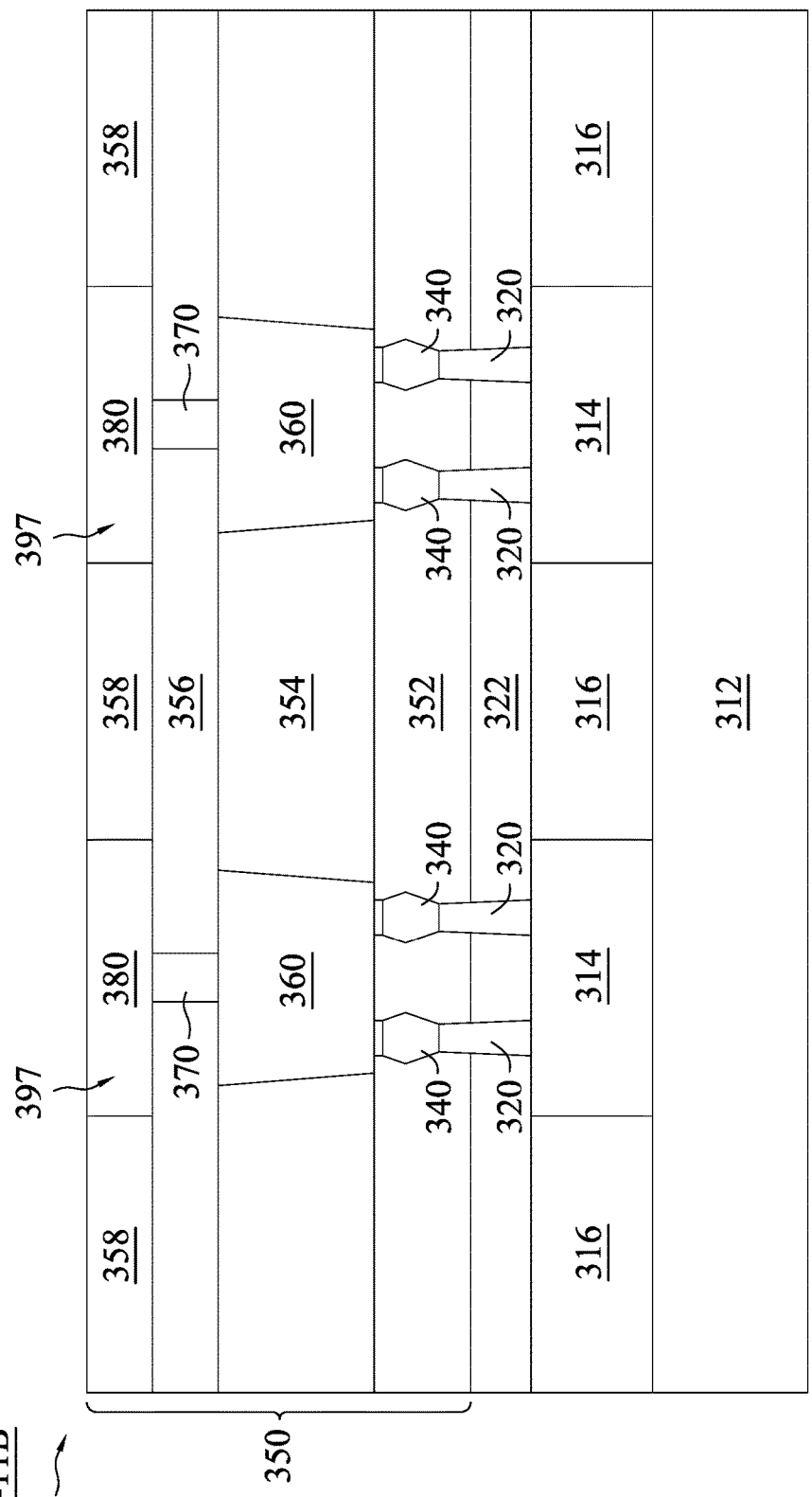
Figure 11C:
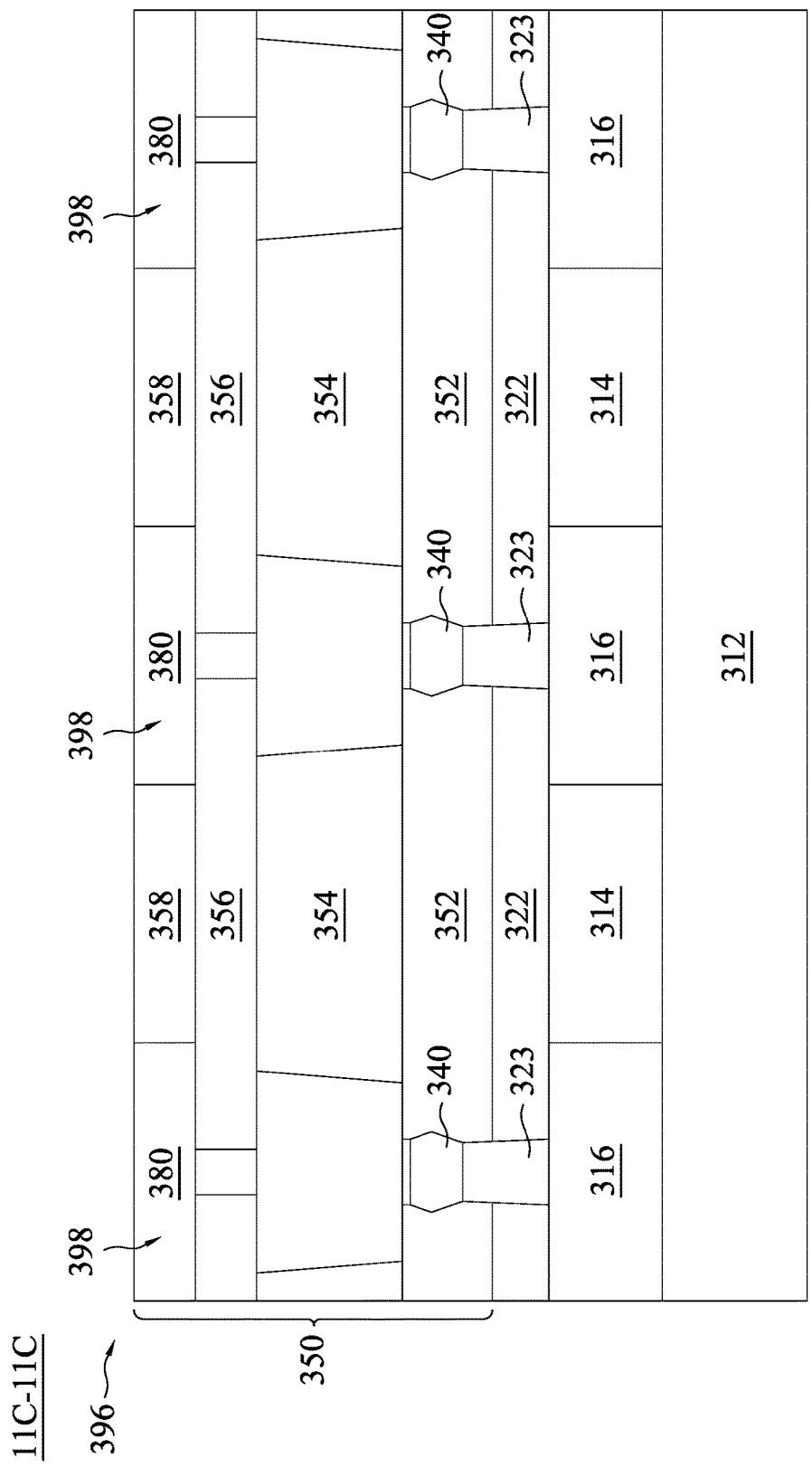

FIG. 10 is a layout view of a SRAM array 400 with columns of SRAM cells having a row of N-type/P-type well strap cells at an end of the columns of SRAMS cells, in accordance with one or more embodiments. In some embodiments, the row of N-type/P-type well strap cells may also be referred to as a well pickup region. In particular, FIG. 10 is a fragmentary top view of a portion of the SRAM array 400 (for example, in an x-y plane). FIG. 11A is a diagrammatic cross-sectional view of the portion of the SRAM array 400 along line 11A-411A of FIG. 10 (for example, in an x-z plane). FIG. 11B is a diagrammatic cross-sectional view of the portion of the SRAM array 400 along line 11B-11B of FIG. 10 (for example, in the x-z plane). FIG. 11C is a diagrammatic cross-sectional view of the portion of SRAM array 400 along line 11C-11C of FIG. 10 (for example, in the x-z plane). In some implementations, the portion of SRAM array 400 represents a portion of the memory array 100, the memory array 200, or the memory array 300. FIGS. 10 and 11A-11C have been simplified for the sake of clarity to better understand the inventive concepts of the present disclosure. Additional features can be added in the SRAM array 400, and some of the features described below can be replaced, modified, or eliminated in other embodiments of the SRAM array 400.

In FIGS. 10 and 11A-11C, SRAM array 400 includes a substrate 312 having various doped regions disposed therein, such as n-wells 314 and p-wells 316. Substrate 312, n-wells 314, and p-wells 316 are similar to the substrate 12, the n-well 14, and the p-well 16 described above with reference to FIGS. 2 and 3A-3C. SRAM array 400 further includes various features disposed over the n-wells 314 and the p-wells 316, where the various features are configured to achieve desired functionality. For example, SRAM array 400 includes fins 320 (similar to the fins 20A-20D described above with reference to FIGS. 2 and 3A-3C), fins 323 (similar to the fin 20F described above with reference to FIGS. 2 and 3A-3C), isolation features 322 (similar to the isolation feature 22 described above with reference to FIGS. 2 and 3A-3C), gate structures 330 (similar to the gate structures 30A-30G described above with reference to FIGS. 2 and 3A-3C), epitaxial source/drain features 340 (similar to the epitaxial source/drain features 40A-40D described above with reference to FIGS. 2 and 3A-3C), an MLI feature 350 (similar to the MLI feature 50 described above with reference to FIGS. 2 and 3A-3C), ILD layers 352-358 (similar to the ILD layers 52-58 described above with reference to FIGS. 2 and 3A-3C), device-level contacts 360 (similar to the device-level contacts 60A-60J described above with reference to FIGS. 2 and 3A-3C), vias 370 (similar to the vias 70A-70I), and conductive lines 380 (similar to the conductive lines 80A-80G described above with reference to FIGS. 2 and 3A-3C). For example, in FIG. 10, the various features are configured to form a SRAM cell area 390, a dummy area 392, an n-type well strap area 394, and a p-type well strap area 396. In the depicted embodiment, the dummy area 392 is disposed between The SRAM cell area 390 and a well strap area (here, the n-type well strap area 394 and the p-type well strap area 396). In furtherance of the depicted embodiment, the n-type well strap area 394 is disposed adjacent to the p-type well strap area 396.

The SRAM cell area 390 includes a SRAM cell 390A, a SRAM cell 390B, a SRAM cell 390C, and a SRAM cell 390D. SRAM cells 390A-390D include a single port SRAM, a dual-port SRAM, other type SRAM, or combinations thereof. In the depicted embodiment, the SRAM cells 390A-390D include single port SRAMs. For example, each of the SRAM cells 390A-390D include six transistors: a pass-gate transistor PG-1, a pass-gate transistor PG-2, a pull-up transistor PU-1, a pull-up transistor PU-2, a pull-down transistor PD-1, and a pull-down transistor PD-1. Each of the SRAM cells 390A-390D includes one n-type well 314 disposed between two p-type wells 316, where pull-up transistors PU-1, PU-2 are disposed over n-type well 314 and pass-gate transistors PG-1, PG-2 and pull-down transistors PD-1, PD-2 are disposed over the p-type wells 316. The pull-up transistors PU-1, PU-2 are p-type FinFETs, the pass-gate transistors PG-1, PG-2 are n-type FinFETs, and the pull-down transistors PD-1, PD-2 are p-type transistors. In some implementations, the pull-up transistors PU-1, PU-2 are configured as the p-type FinFET 18A described above with reference to FIGS. 2 and 3A-3C, while the pass-gate transistors PG-1, PG-2 and the pull-down transistors PD-1, PD-2 are configured as the n-type FinFET 18B described above with reference to FIGS. 2 and 3A-3C.

For example, the pass-gate transistors PG-1, PG-2 and/or the pull-down transistors PD-1, PD-2 each include a fin structure (including one or more fins 320) disposed over the p-type well 316 and a respective gate structure 330 disposed over a channel region of the fin structure, such that the gate structure 330 interposes source/drain regions of the fin structure. The fin structures of the pass-gate transistors PG-1, PG-2 and/or p the pull-down transistors PD-1, PD-2 include p-type dopants (p) and are electrically connected to the p-type well 316 (FIG. 11A). The fin structures of the pass-gate transistors PG-1, PG-2 and/or the pull-down transistors PD-1, PD-2 further include n-type epitaxial source/drain features (FIG. 11A) (in other words, the epitaxial source/drain features 340 of the pass-gate transistors PG-1, PG-2 and/or the pull-down transistors PD-1, PD-2 include n-type dopants). The gate structures 330 and/or the epitaxial source/drain features 340 of the pass-gate transistors PG-1, PG-2 and/or the pull-down transistors PD-1, PD-2 are electrically connected to a voltage source (for example, $V_{SS}$) by the MLI feature 350 (in particular, respective contacts 360, vias 370, and/or the conductive lines 380 disposed in ILD layers 352-358).

In furtherance of the example, the pull-up transistors PU-1, PU-2 each include a fin structure (including one or more fins 320) disposed over the n-type well 314 and a respective gate structure 330 disposed over a channel region of the fin structure, such that the gate structure 330 interposes source/drain regions of the fin structure. The fin structures of the pull-up transistors PU-1, PU-2 include n-type dopants (n) and are electrically connected to the n-type well 314 (FIG. 11A). The fin structures of the pull-up transistors PU-1, PU-2 further include p-type epitaxial source/drain features (FIG. 11A) (in other words, the epitaxial source/drain features 340 of the pull-up transistors PU-1, PU-2 include p-type dopants). The gate structures 330 and/or the epitaxial source/drain features 340 of the pull-up transistors PU-1, PU-2 are electrically connected to a voltage source (for example, $V_{DD}$) by the MLI feature 350 (in particular, respective contacts 360, vias 370, and/or the conductive lines 380 disposed in the ILD layers 352-358).

The n-type well strap area 394 includes fin-based n-type well strap structures 397 configured to electrically connect the n-type wells 314 to a voltage source (for example, $V_{SS}$). The n-type well strap structures 397 are structurally similar to the pull-up transistors PU-1, PU-2. For example, each n-type well strap structure 397 includes a fin structure (including one or more fins 320) disposed over the n-type well 314 and a respective gate structure 330 disposed over a channel region of the fin structure, such that the gate structure 330 interposes source/drain regions of the fin structure. The fin structures of the n-type well strap structures 397 include n-type dopants and are electrically connected to the n-type well 314. In some implementations, a dopant concentration of the fin structures of the n-type well strap structures 397 is greater than a dopant concentration of the fin structures of the pull-up transistors PU-1, PU-2. In some implementations, the dopant concentration of the fin structures of the n-type well strap structures 397 is at least three times greater than a dopant concentration of the fin structures of the pull-up transistors PU-1, PU-2. Increasing the dopant concentration of the fin structures of the n-type well strap structures 398 can reduce pick-up resistance and latch-up in the SRAM array 400. Further, in contrast to the fin structures of the pull-up transistors PU-1, PU-2, the fin structures of the n-type well strap structures 397 further include n-type epitaxial source/drain features (in other words, the epitaxial source/drain features 340 of the n-type well strap structures 397 include n-type dopants), which are electrically connected to the voltage source by the MLI feature 350 (in particular, respective contacts 360, the vias 370, and/or the conductive lines 380 disposed in ILD layers 352-358).

The p-type well strap area 396 includes fin-based p-type well strap structures 398 configured to electrically connect the p-type wells 316 to a voltage source (for example, $V_{DD}$). The p-type well strap structures 398 are structurally similar to the pass-gate transistors PG-1, PG-2 and/or the pull-down transistors PD-1, PD-2. For example, each p-type well strap structure 398 includes a fin structure (including one or more fins 320) disposed over the p-type well 316 and a respective gate structure 330 disposed over a channel region of the fin structure, such that the gate structure 330 interposes source/drain regions of the fin structure. The fin structures of the p-type well strap structures 398 include p-type dopants and are electrically connected to p-type well 316 (FIG. 11C). In some implementations, a dopant concentration of the fin structures of the p-type well strap structures 398 is greater than a dopant concentration of the fin structures of the pass-gate transistors PG-1, PG-2 and/or the pull-down transistors PD-1, PD-2 (see FIG. 11A and FIG. 11C). In some implementations, the dopant concentration of the fin structures of the p-type well strap structures 398 is at least three times greater than a dopant concentration of the fin structures of the pass-gate transistors PG-1, PG-2 and/or the pull-down transistors PD-1, PD-2. Increasing the dopant concentration of the fin structures of the p-type well strap structures 398 can reduce pick-up resistance and latch-up in SRAM array 400. Further, in contrast to the fin structures of the pass-gate transistors PG-1, PG-2 and/or the pull-down transistors PD-1, PD-2, the fin structures of the p-type well strap structures 398 further include p-type epitaxial source/drain features (in other words, the epitaxial source/drain features 340 of the p-type well strap structures 398 include n-type dopants), which are electrically connected to the voltage source by the MLI feature 350 (in particular, respective contacts 360, the vias 370, and/or the conductive lines 380 disposed in the ILD layers 352-358).

To enhance performance of the transistors in the SRAM array 400, a width of a fin structure of a p-type well strap is greater than a width of a fin structure of a transistor in a SRAM cell area. For example, the width of a fin 323 of a p-type well strap 396 along the x-direction is greater than the width of a fin 320 of a transistor in the SRAM cell area 392 along the x-direction. In FIGS. 11A and 11C, a width of an interface between a fin structure of a p-type well strap and an epitaxial source/drain feature is greater than a width of an interface between a fin structure of a transistor in a SRAM cell area and an epitaxial source/drain feature. In some embodiments, the fin 323 with greater width than the fin of the transistor may also be referred to as a planar-like OD.

To enhance performance of the transistors in the SRAM array 400, a distance between a corresponding fin structure of a p-type well strap and an n-well is greater than a distance between a corresponding fin structure of an n-type transistor in a SRAM cell area and the n-well. For example, a distance between the fin 323 of a p-type well strap 396 and an n-well 314 is greater than a distance between the fin 320 of an n-type transistor in the SRAM cell area 390 and the n-well 314.

In the SRAM array 400, the cell performance exhibits a significant sensitively to layout environment. For example, a device (e.g., Ion, Vt and Ioff) with an inner cell and an edge cell have difference behavior due to the structure thereof with a discontinuous cell layout. In some embodiments, well strap cells for N-well and P-well may be in an edge of the array or between two sub-arrays in the SRAM array 400.

In the course of IC evolution, functional density (i.e., the number of interconnected devices per chip area) has generally increased while geometry size in the SRAM array 400 (i.e., the component that can be created using a fabrication process) has decreased. Therefore, a resistance of the well pickup region may be high which would result in a worse latch up performance, and in turn adversely affects the performance of the SRAM array 400.

Hence, a fin in the well pickup region of the SRAM array 400 has a width greater than that in the transistor of the SRAM array 400, so as to lower the resistance of the well pickup region, and thus the SRAM array 400 may obtain a better latch up immunity. That is, the p-type well strap area 396 may provide a most stable performance for the SRAM array 400.

In some embodiments, if a fin in the well pickup region of the FinFET device 10 has a width which is less than twice of that of the transistor of the FinFET device 10, the resistance of the well pickup region may not be low enough to obtain a better latch up immunity, which in turn adversely affects the performance of the FinFET device 10. In some embodiments, if a fin in the well pickup region of the FinFET device 10 has a width which is greater than ten times of that of the transistor of the FinFET device 10, a junction leakage may be occur, which in turn adversely affects the performance of the FinFET device 10. In this context, the terms "junction leakage" as used herein is a current passing through an unintentional path from the fin to another type of a well region where the fin does not locate on.

Figure 12:
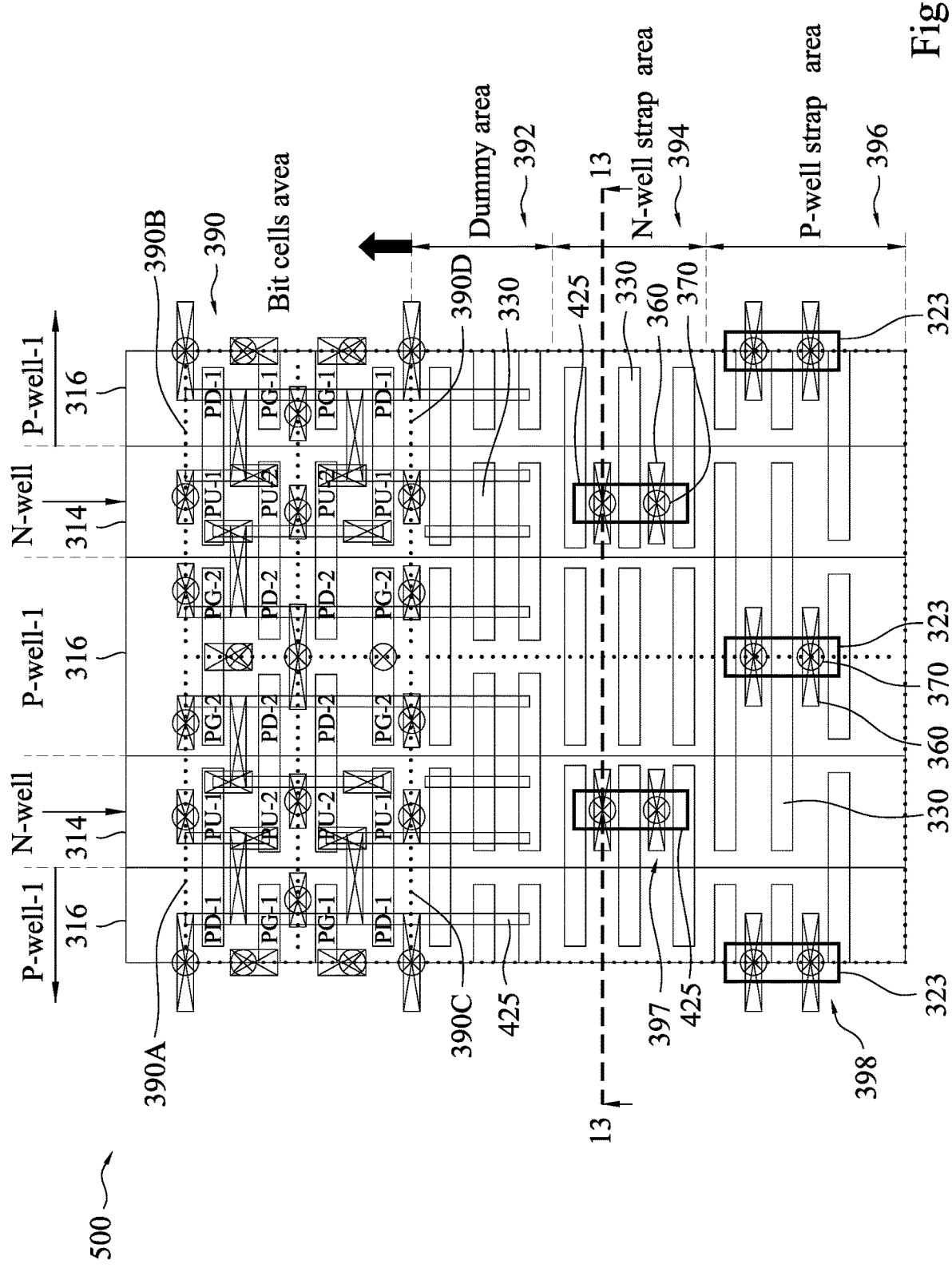
FIG. 12 is a layout view of a SRAM array with columns of SRAM cells having a row of N-type/P-type well strap cells at an end of the columns of SRAMS cells, in accordance with one or more embodiments.
Figure 13:
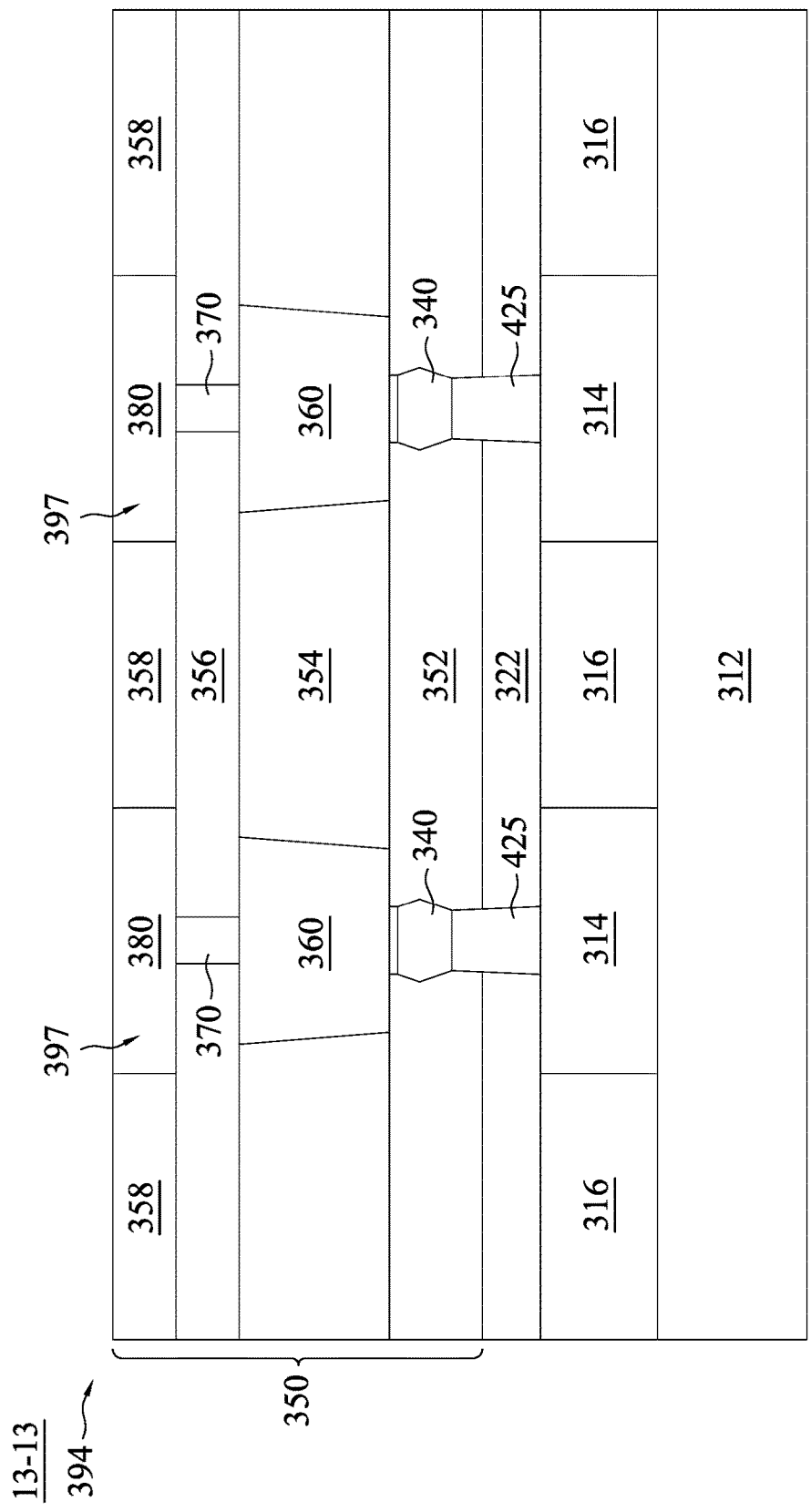
FIG. 13 is a cross-sectional view along line 13-13 in FIG. 12.

FIG. 12 is a layout view of a SRAM array 500 with columns of SRAM cells having a row of N-type/P-type well strap cells at an end of the columns of SRAMS cells, in accordance with one or more embodiments. In some embodiments, the row of N-type/P-type well strap cells may also be referred to as a well pickup region. In particular, FIG. 12 is a fragmentary top view of a portion of the SRAM array 500 (for example, in an x-y plane). FIG. 13 is a diagrammatic cross-sectional view of the portion of the SRAM array 500 along line 13-13 of FIG. 12 (for example, in an x-z plane).

The SRAM array 500 is similar in many respects to the SRAM array 400.

Accordingly, similar features in FIGS. 10-13 are identified by the same reference numerals for clarity and simplicity. FIGS. 12 and 13 have been simplified for the sake of clarity to better understand the inventive concepts of the present disclosure. Additional features can be added in the SRAM array 500, and some of the features described below can be replaced, modified, or eliminated in other embodiments of the SRAM array 500.

It is noted that, the difference between the present embodiment and the embodiment in FIGS. 10-11C is in that a width of a fin structure in an n-type well strap area shown in FIGS. 12 and 13 is greater than that shown in FIGS. 10-11C. The present embodiment replaces the fins 320 of the n-type well strap 394 as shown in FIGS. 10-11C with fins 425. Specifically, the adjacent two fins 320 of the n-type well strap 394 as shown in FIGS. 10-11C is replaced by one fin 425.

To enhance performance of the transistors in the SRAM array 500, a width of a fin structure of an n-type well strap is greater than a width of a fin structure of a transistor in a SRAM cell area. For example, the width of a fin 425 of an n-type well strap 394 along the x-direction is greater than the width of a fin 320 of a transistor in the SRAM cell area 392 along the x-direction. In FIG. 12, a width of an interface between a fin structure of an n-type well strap and an epitaxial source/drain feature is greater than a width of an interface between a fin structure of a transistor in a SRAM cell area and an epitaxial source/drain feature.

To enhance performance of the transistors in the SRAM array 500, a distance between a corresponding fin structure of an n-type well strap and a p-well is greater than a distance between a corresponding fin structure of a p-type transistor in a SRAM cell area and the p-well. For example, a distance between the fin 425 of the n-type well strap 394 and the p-well 316 is greater than a distance between the fin 320 of a p-type transistor in the SRAM cell area 390 and the p-well 316.

In the SRAM array 500, the cell performance exhibits a significant sensitively to layout environment. For example, a device (e.g., Ion, Vt and Ioff) with an inner cell and an edge cell have difference behavior due to the structure thereof with a discontinuous cell layout. In some embodiments, well strap cells for N-well and P-well may be in an edge of the array or between two sub-arrays in the SRAM array 500.

In the course of IC evolution, functional density (i.e., the number of interconnected devices per chip area) has generally increased while geometry size in the SRAM array 500 (i.e., the component that can be created using a fabrication process) has decreased. Therefore, a resistance of the well pickup region may be high which would result in a worse latch up performance, and in turn adversely affects the performance of the SRAM array 500.

Hence, a fin in the well pickup region of the SRAM array 500 has a width greater than that in the transistor of the SRAM array 500, so as to lower the resistance of the well pickup region, and thus the SRAM array 500 may obtain a better latch up immunity. That is, the n-type well strap area 394 and/or the p-type well strap area 396 may provide a most stable performance for the SRAM array 500.

In some embodiments, if a fin in the well pickup region of the FinFET device 10 has a width which is less than twice of that of the transistor of the FinFET device 10, the resistance of the well pickup region may not be low enough to obtain a better latch up immunity, which in turn adversely affects the performance of the FinFET device 10. In some embodiments, if a fin in the well pickup region of the FinFET device 10 has a width which is greater than ten times of that of the transistor of the FinFET device 10, a junction leakage may be occur, which in turn adversely affects the performance of the FinFET device 10. In this context, the terms "junction leakage" as used herein is a current passing through an unintentional path from the fin to another type of a well region where the fin does not locate on.

Figure 14:
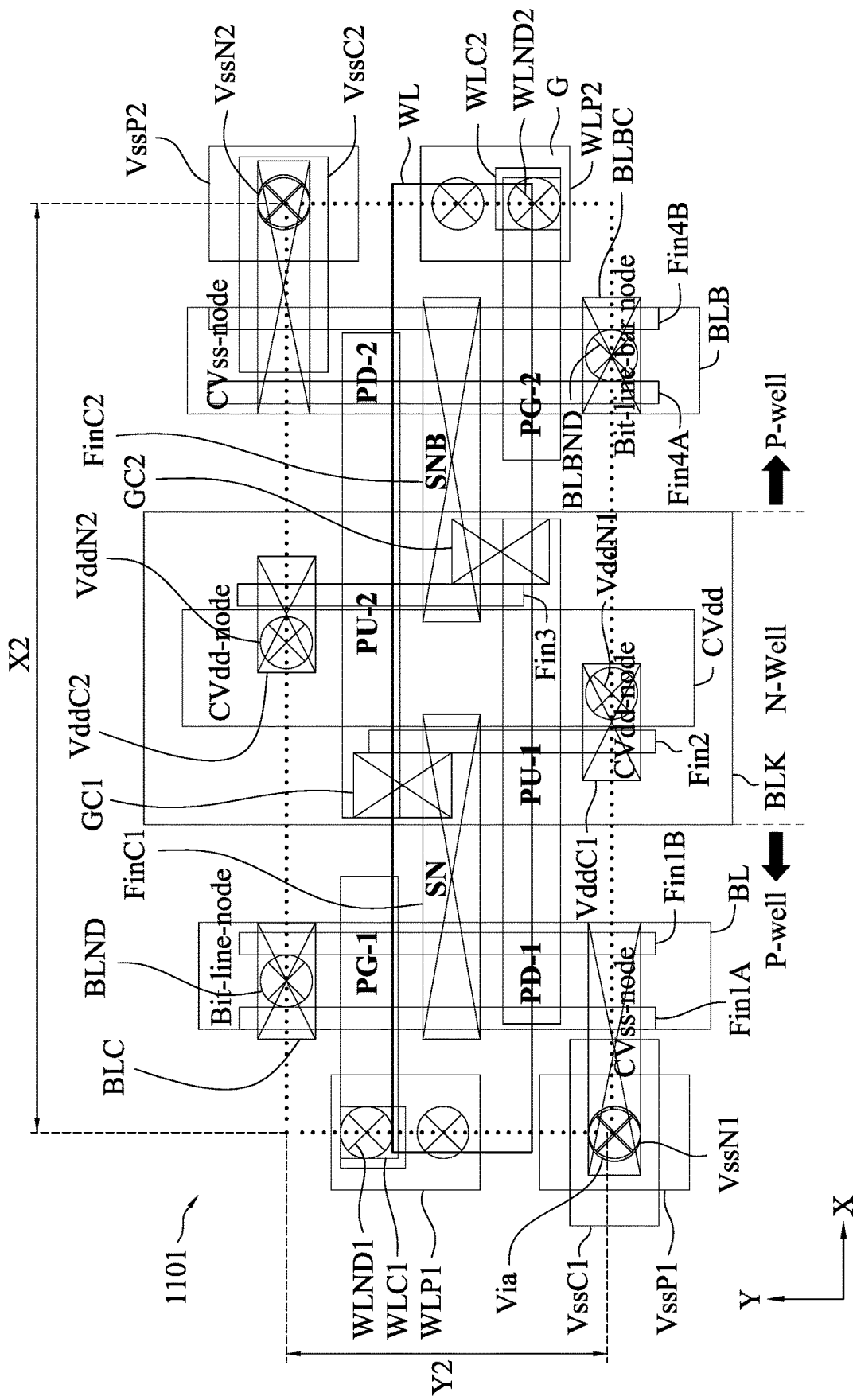
FIG. 14 is a layout view of a SRAM cell, in accordance with one or more embodiments.

FIG. 14 is a layout view of a SRAM cell 1101, in accordance with one or more embodiments. SRAM cell 1101 is a six-transistor (6T) SRAM cell. SRAM cell 1101 differs from the memory cell 101 (FIG. 9) in that SRAM cell 1101 is a multi-fin finFET SRAM cell. SRAM cell 1101 is capable of functioning in a similar manner to that of the memory cell 101. In use, compared to the memory cell 101, SRAM cell 1101 has added drive strength, which makes it possible to simplify the power connections to SRAM cells that are multi-fin finFET structures.

Compared to the memory cell 101, the fin structure for pull down transistor PD-1 and pass gate transistor PG-1 is doubled to two fin structures that include fin structures Fin1A and Fin1B, electrically coupled in parallel. Gate material G for first pass gate PG-1 extends over both fin structures Fin1A and Fin1B. Bit line contact BLC couples fin structures Fin1A and Fin1B together at one source/drain terminal of first pass gate PG-1. Source/drain terminals for first pull down transistor PD-1 are formed on fin structures Fin1A and Fin1B. Gate material G for first pull down transistor PD-1 extends over both fin structures Fin1A and Fin1B. Voltage contact $V_{SS}C1$ couples fin structures Fin1A and Fin1B together at one source/drain terminal of first pull down transistor PD-1. First fin contact FinC1 of storage node SN couples the remaining source/drain terminals of first pass gate PG-1 and first pull down transistor PD-1 together so that the two fin structures Fin1A and Fin1B form a single, larger drive transistor for first pass gate PG-1 and first pull down transistor PD-1. Second pass gate PG-2 and second pull down transistor PD-2 are similarly formed over fin structures Fin4A and Fin4B. Fin structures Fin4A and Fin 4B are similarly electrically coupled in parallel by complementary bit line contact BLBC, voltage contact $V_{SS}C2$, and second fin contact FinC2 of storage node SNB so that the two fin structures Fin4A and Fin4B form a single, larger drive transistor for second pass gate PG-2 and second pull down transistor PD-2.

Compared to the memory cell 101, the first fin contact FinC1 of storage node SN is wider in the second direction X, which makes it possible to extend over both fin structures Fin1A and Fin1B. Similarly, compared to the memory cell 101, the second fin contact FinC2 of storage node SNB is wider, which makes it possible to extend over both fin structures Fin4A and Fin4B. SRAM cell 1101 has a pitch Y2 in the first direction Y direction and pitch X2 in the second direction X. In some embodiments, the ratio of X2 to Y2 is greater than or equal to 3. The pitch X2 in the second direction X is greater than the pitch X1 (FIG. 9) in the memory cell 101, because SRAM cell 1101 includes the multi-fin structure described above. In some embodiments, pitch X2 is at least 1.1 times pitch X1. Pitch Y2, however, is substantially equal to pitch Y1 (FIG. 9) of the memory cell 101. In some embodiments, pitch Y2 is optionally different from pitch Y1. In some embodiments, a ratio of the width of the first fin contact FinC1 of storage node SN included in SRAM cell 1101 to the width of the first fin contact FinC1 of storage node SN included in the memory cell 101 corresponds to the ratio of pitch X2 to pitch X1. For example, in some embodiments, the width of the first fin contact FinC1 of storage node SN included in SRAM cell 1101 is at least 1.1 times the width of the first fin contact FinC1 of storage node SN included in the memory cell 101. In some embodiments, the width of the first fin contact FinC1 of storage node SN included in SRAM cell 1101 is independent of the ratio of pitch X2 to pitch X1.

To increase the drive strength of the SRAM cell 1101, additional fin structures are optionally added in place of one or more of fin structures Fin1, Fin2, Fin3 or Fin4 of the memory cell 101. For example, SRAM cell 1101 is capable of including three, four or more fin structures in place of fin structures Fin1A and Fin1B, and/or fin structures Fin4A and Fin4B. In these alternative embodiments, pitch X2 is capable of being increased even further compared to pitch X1. In embodiments that include more than two fin structures in place of fin structure Fin1 and fin structure Fin4, the fin contacts FinC1 and FinC2 of storage nodes SN and SNB further extend beyond that which is shown in FIG. 14 to correspond to the added pitch between the fin structures, which makes it possible to couple the source and drain portions together so as to form the multi-fin FinFET transistor.

Figure 15:
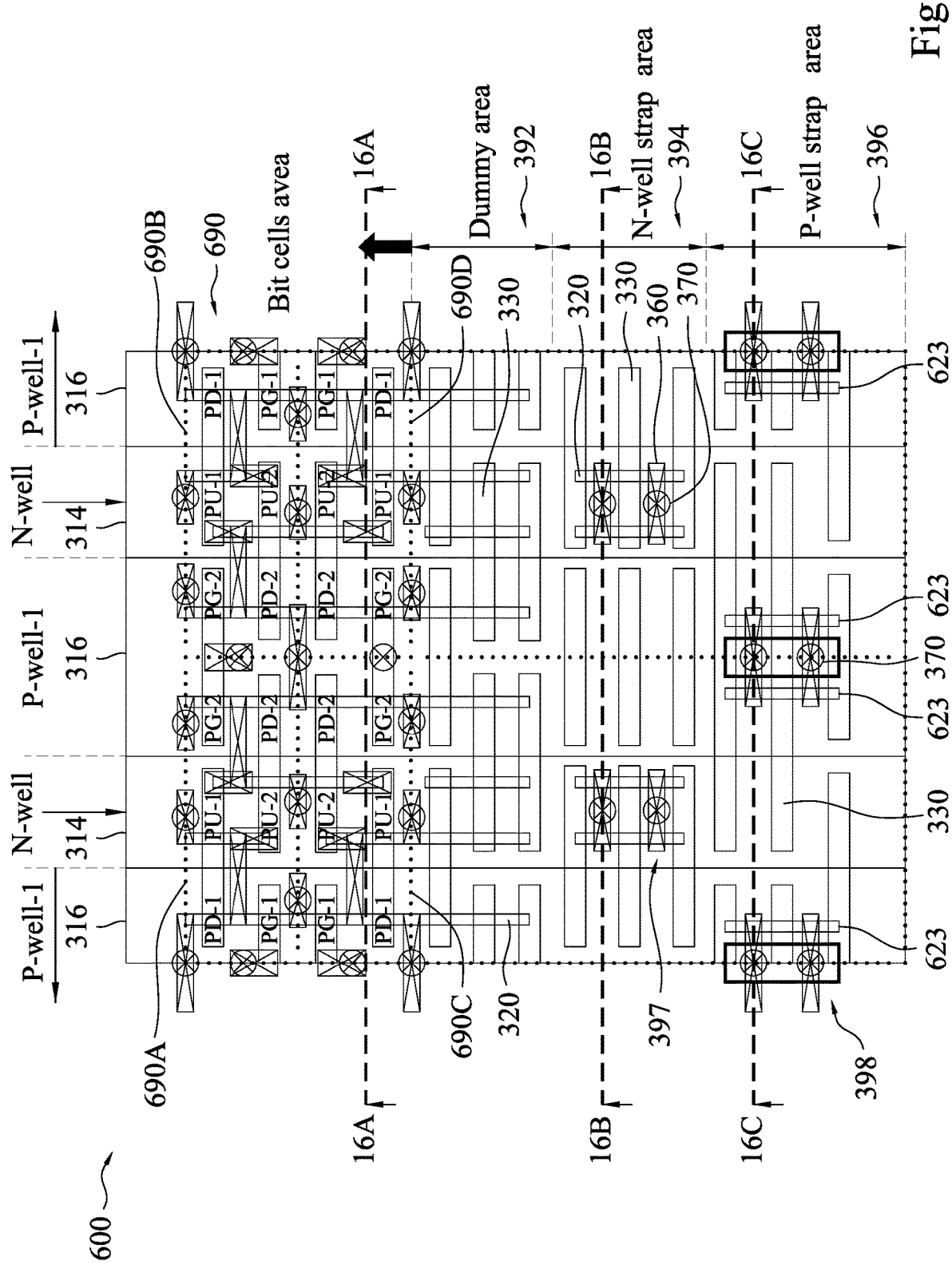
FIG. 15 is a layout view of a SRAM array with columns of SRAM cells having a row of N-type/P-type well strap cells at an end of the columns of SRAMS cells, in accordance with one or more embodiments.
Figure 16A:
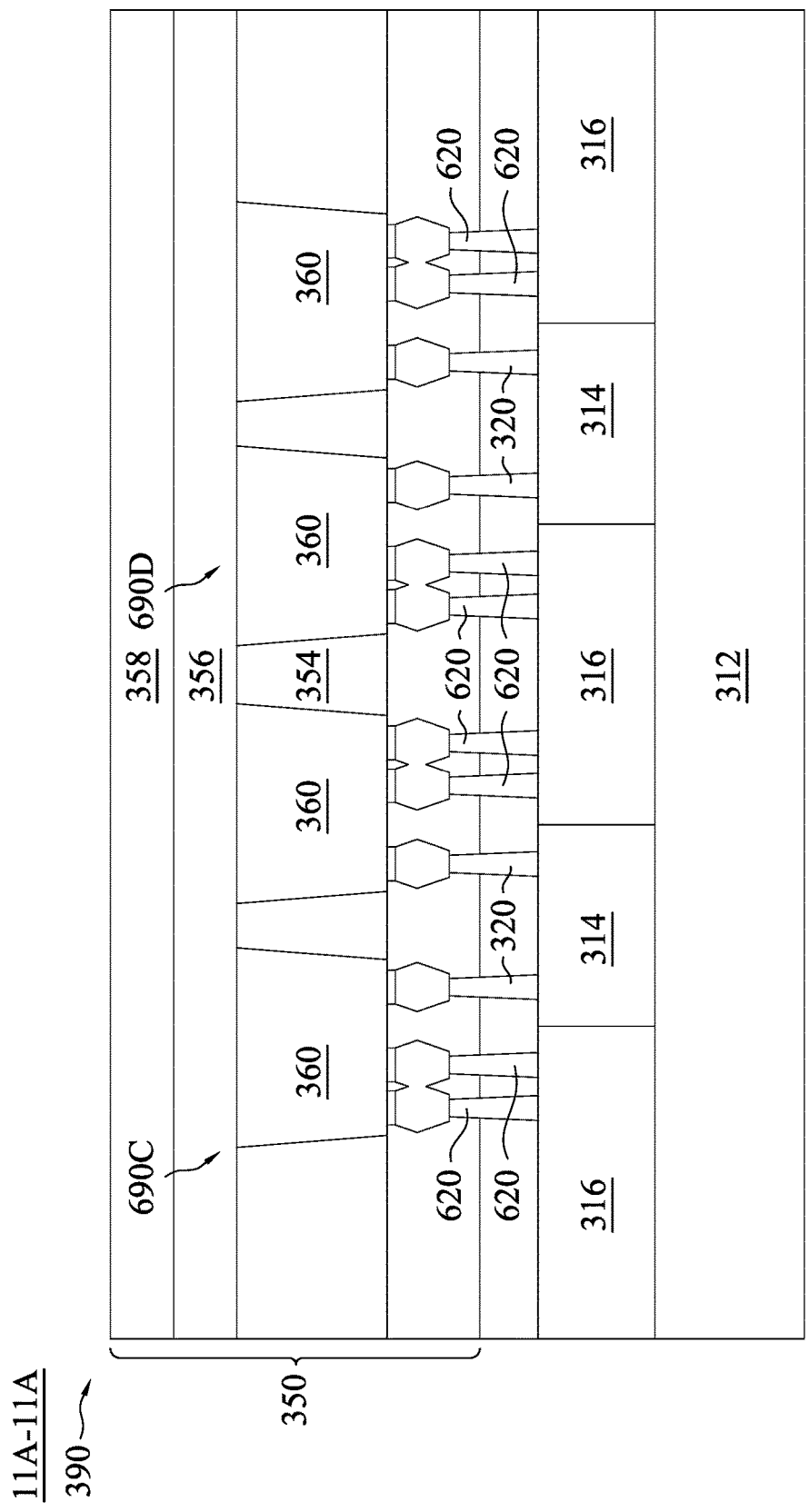
FIGS. 16A, 16B, and 16C are cross section views along line 16A-16A, line 16B-16B, and line 16C-16C in FIG. 15, respectively.
Figure 16B:
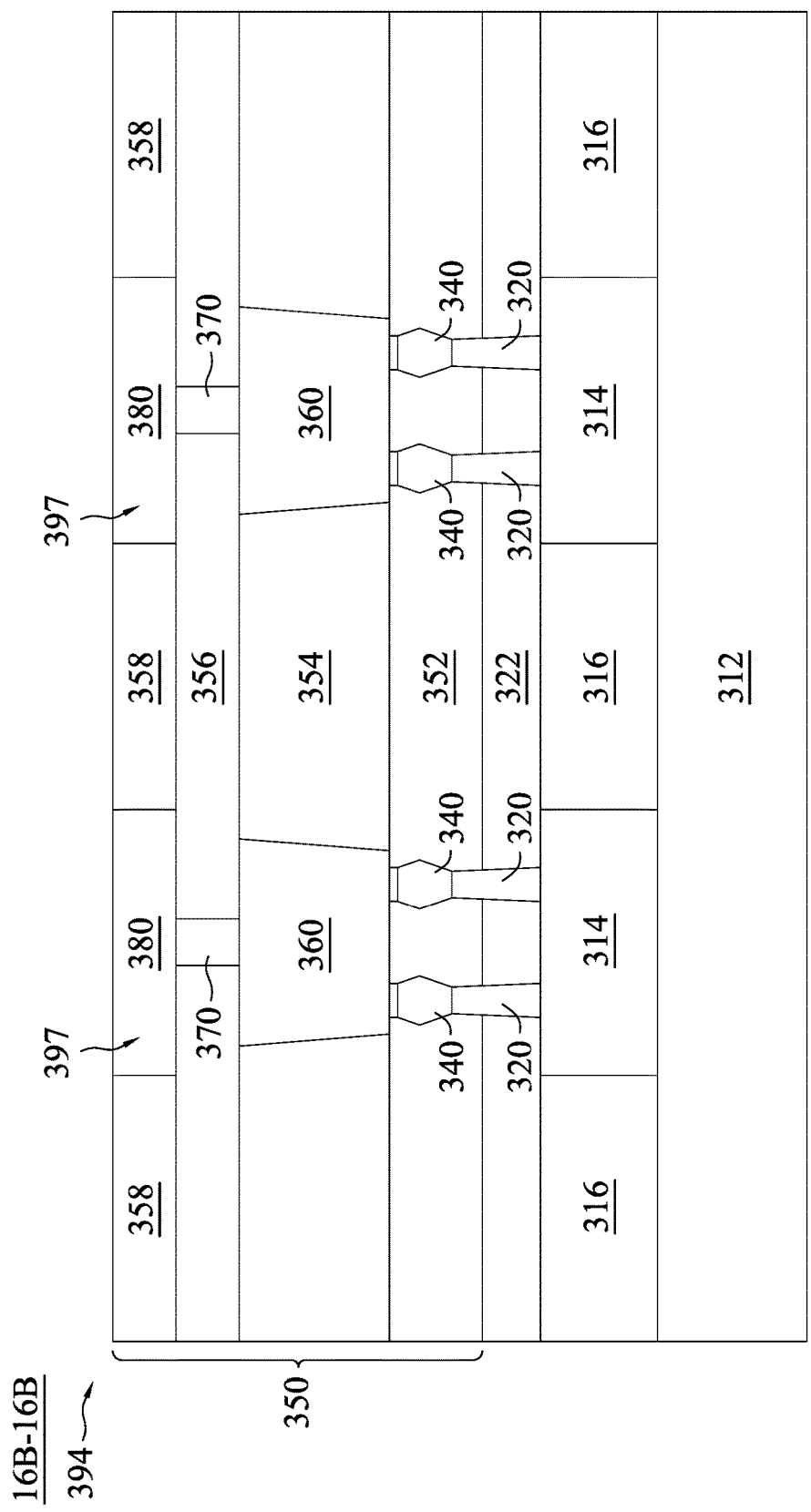
Figure 16C:
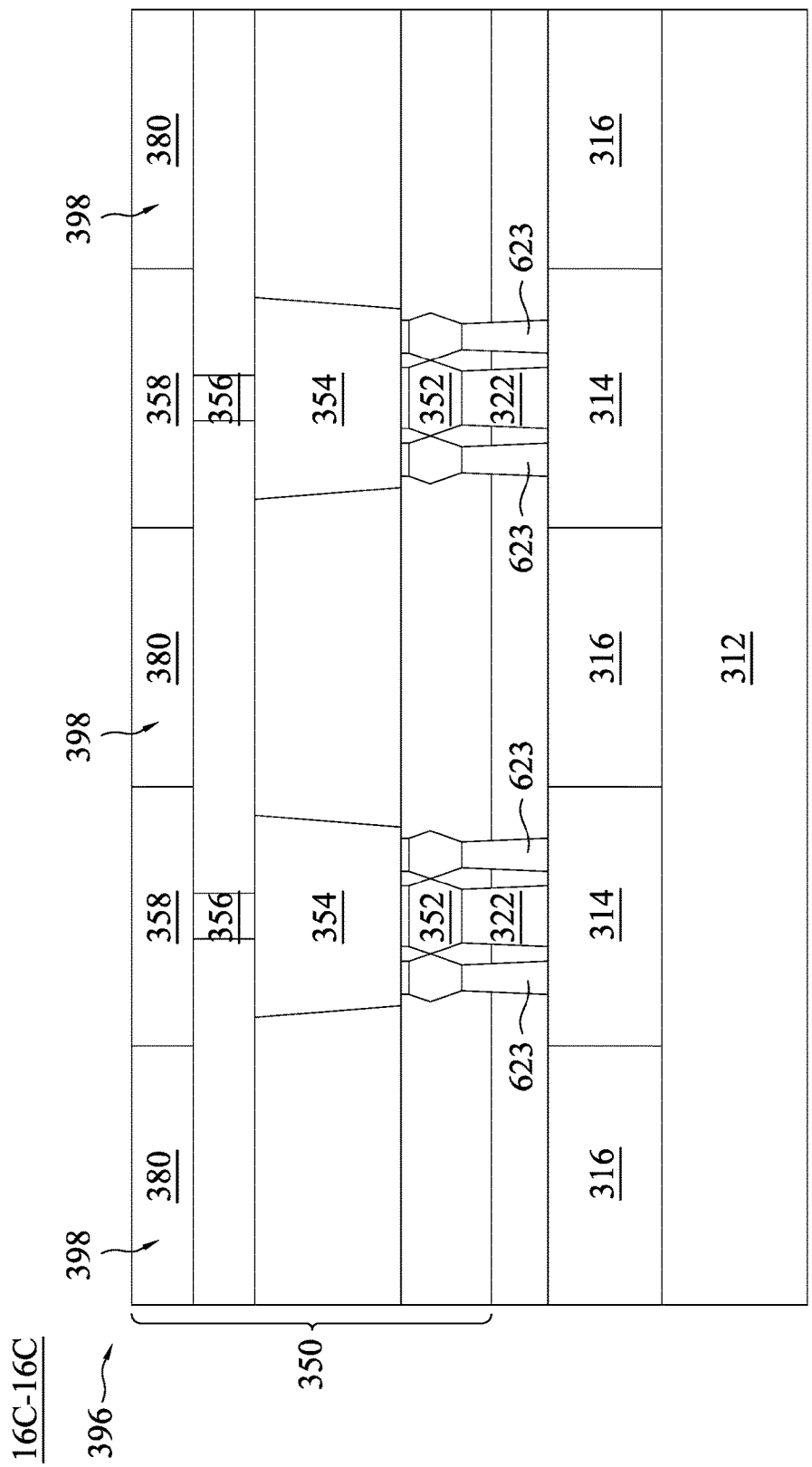

FIG. 15 is a layout view of a SRAM array 600 with columns of SRAM cells having a row of N-type/P-type well strap cells at an end of the columns of SRAMS cells, in accordance with one or more embodiments. In some embodiments, the row of N-type/P-type well strap cells may also be referred to as a well pickup region. In particular, FIG. 15 is a fragmentary top view of a portion of the SRAM array 600 (for example, in an x-y plane). FIG. 16A is a diagrammatic cross-sectional view of the portion of the SRAM array 600 along line 16A-416A of FIG. 15 (for example, in an x-z plane). FIG. 16B is a diagrammatic cross-sectional view of the portion of the SRAM array 600 along line 16B-16B of FIG. 15 (for example, in the x-z plane). FIG. 16C is a diagrammatic cross-sectional view of the portion of SRAM array 600 along line 16C-16C of FIG. 15 (for example, in the x-z plane). In some implementations, the portion of SRAM array 600 represents a portion of the memory array 100, the memory array 200, or the memory array 300. FIGS. 15 and 16A-16C have been simplified for the sake of clarity to better understand the inventive concepts of the present disclosure. Additional features can be added in the SRAM array 600, and some of the features described below can be replaced, modified, or eliminated in other embodiments of the SRAM array 600.

The SRAM array 600 is similar in many respects to the SRAM array 400.

Accordingly, similar features in FIGS. 10, 11A-11C, 15, and 16A-16C are identified by the same reference numerals for clarity and simplicity. FIGS. 15 and 16A-16C have been simplified for the sake of clarity to better understand the inventive concepts of the present disclosure. Additional features can be added in the SRAM array 600, and some of the features described below can be replaced, modified, or eliminated in other embodiments of the SRAM array 600. It is noted that, the difference between the present embodiment and the embodiment in FIGS. 10-11C is in that SRAM cells 690A-690D are multi-fin finFET SRAM cells and the p-type well strap area 396 further includes fins 624 thereon.

In FIGS. 15 and 16A-16C, compared to the SRAM array 400, the fins 624 of the p-type well strap area 396 are symmetrically disposed around the fin 323. In some embodiments, a width of the fin 624 is less than a width the fin 323 and is substantially equal to a width of a fin of the FinFET in the SRAM cell area 390. For example, the fins 320 in the SRAM cell area 390 of the SRAM array 600 of are similar to the fin structures Fin2 and Fin3 described above with reference to FIG. 14, the fins 620 in the SRAM cell area 390 of the SRAM array 600 are similar to the fin structures Fin1A, Fin1B, Fin4A, and Fin4B described above with reference to FIGS. 14, the fins 323 in the p-type well strap area 396 of the SRAM array 600 are similar to the fin 20F described above with reference to FIGS. 4, 5A, and 5B, and the fins 623 in the p-type well strap area 396 of the SRAM array 600 are similar to the fins 20G-20J described above with reference to FIGS. 4, 5A, and 5B.

Figure 17:
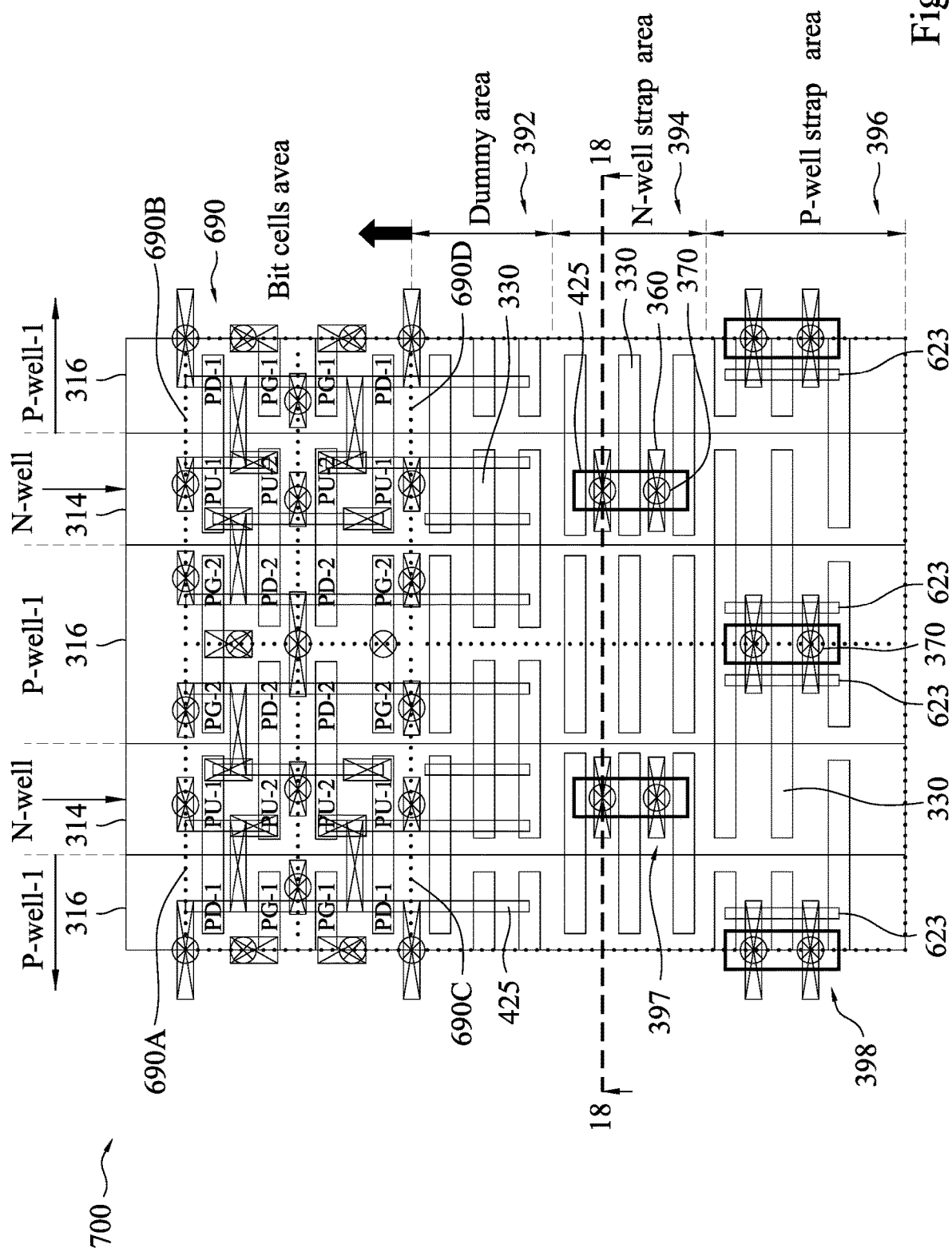
FIG. 17 is a layout view of a SRAM array with columns of SRAM cells having a row of N-type/P-type well strap cells at an end of the columns of SRAMS cells, in accordance with one or more embodiments.
Figure 18:
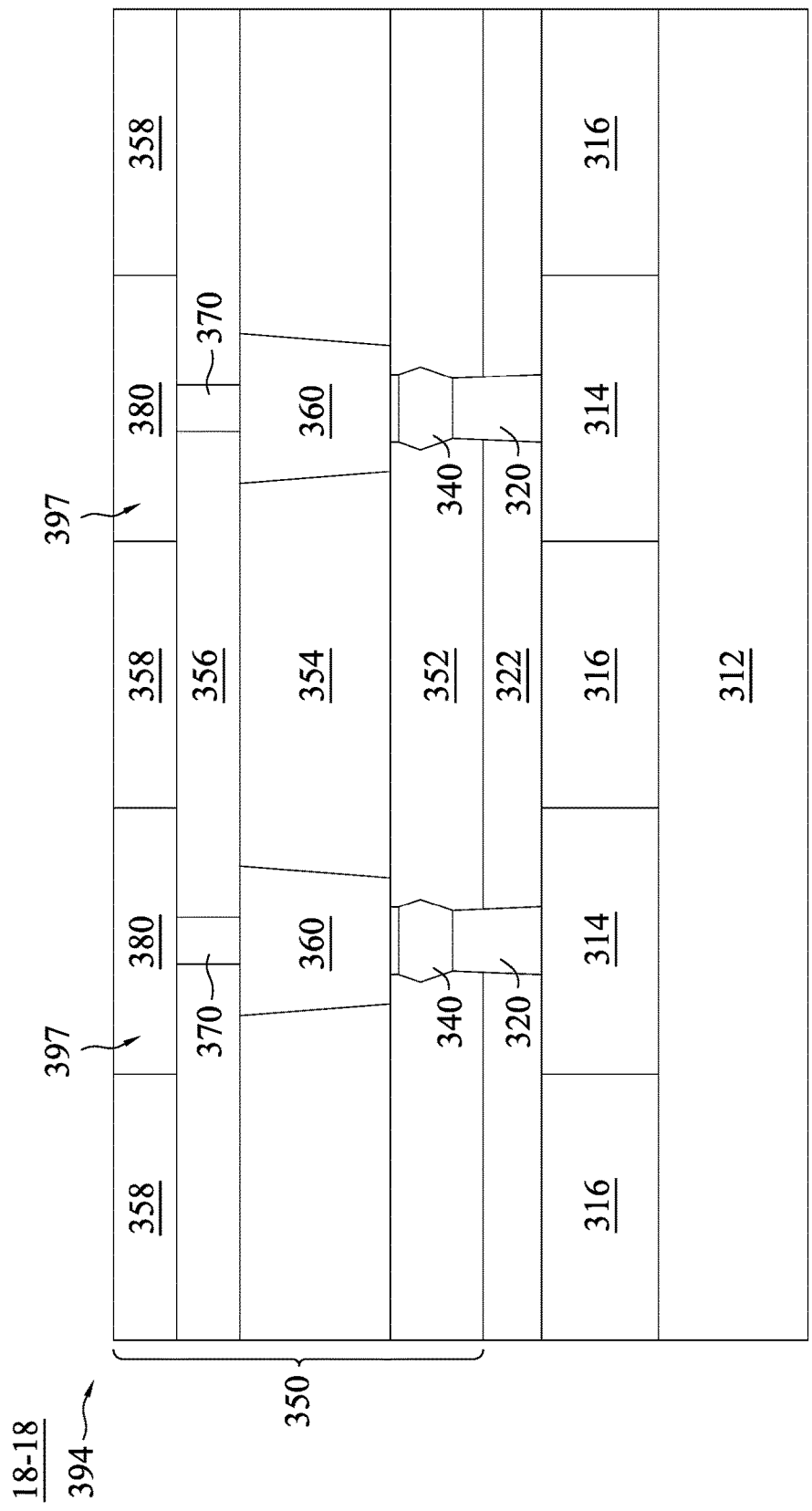
FIG. 18 is cross-sectional views along line 18-18 in FIG. 17.

FIG. 17 is a layout view of a SRAM array with columns of SRAM cells having a row of N-type/P-type well strap cells at an end of the columns of SRAMS cells, in accordance with one or more embodiments. In some embodiments, the row of N-type/P-type well strap cells may also be referred to as a well pickup region. FIG. 18 is cross-sectional views along line 18-18 in FIG. 17. In particular, FIG. 17 is a fragmentary top view of a portion of the SRAM array 700 (for example, in an x-y plane). FIG. 18 is a diagrammatic cross-sectional view of the portion of the SRAM array 700 along line 18-18 of FIG. 17 (for example, in an x-z plane).

The SRAM array 700 is similar in many respects to the SRAM array 600. Accordingly, similar features in FIGS. 15-18 are identified by the same reference numerals for clarity and simplicity. FIGS. 17 and 18 have been simplified for the sake of clarity to better understand the inventive concepts of the present disclosure. Additional features can be added in the SRAM array 700, and some of the features described below can be replaced, modified, or eliminated in other embodiments of the SRAM array 700.

It is noted that, the difference between the present embodiment and the embodiment in FIGS. 15-16C is in that a width of a fin structure in an n-type well strap area shown in FIGS. 17 and 18 is greater than that shown in FIGS. 15-16C. The present embodiment replaces the fins 320 of the n-type well strap 394 as shown in FIGS. 15-16C with fins 425. Specifically, the adjacent two fins 320 of the n-type well strap 394 as shown in FIGS. 15-16C is replaced by one fin 425.

To enhance performance of the transistors in the SRAM array 700, a width of a fin structure of an n-type well strap is greater than a width of a fin structure of a transistor in a SRAM cell area. For example, the width of a fin 425 of an n-type well strap 394 along the x-direction is greater than the width of a fin 320 of a transistor in the SRAM cell area 392 along the x-direction. In FIG. 18, a width of an interface between a fin structure of an n-type well strap and an epitaxial source/drain feature is greater than a width of an interface between a fin structure of a transistor in a SRAM cell area and an epitaxial source/drain feature.

To enhance performance of the transistors in the SRAM array 700, a distance between a corresponding fin structure of an n-type well strap and a p-well is greater than a distance between a corresponding fin structure of a p-type transistor in a SRAM cell area and the p-well. For example, a distance between the fin 425 of the n-type well strap 394 and the p-well 316 is greater than a distance between the fin 320 of a p-type transistor in the SRAM cell area 390 and the p-well 316.

Figure 19:
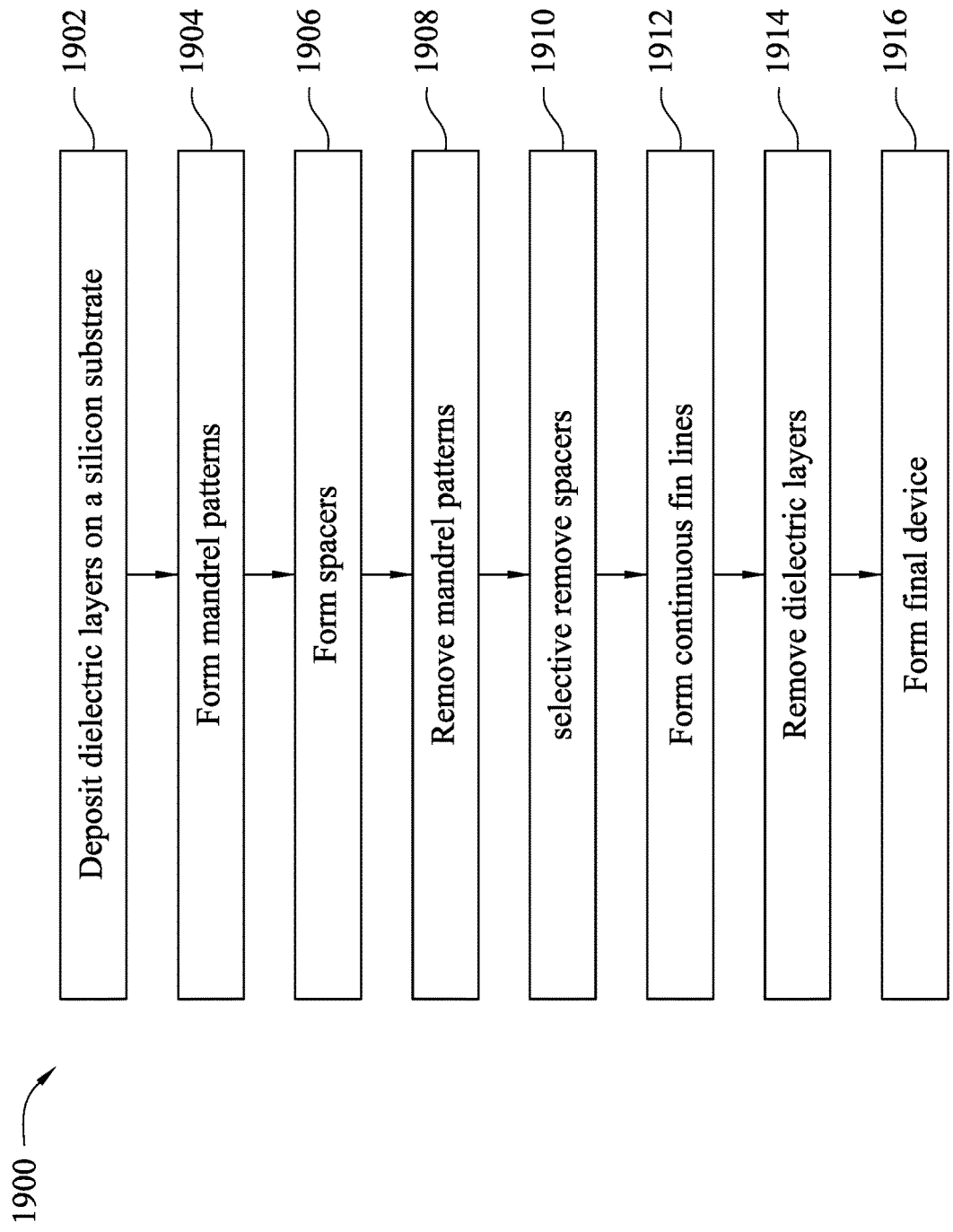
FIG. 19 is a method of forming an IC with embedded SRAM cells, according to various aspects of the present disclosure.

FIG. 19 shows a method 1900 of forming the fin active lines of at least one of the memory arrays as shown above using the masks, in accordance with an embodiment. Additional operations can be provided before, during, and after the method 1900, and some operations described can be replaced, eliminated, or moved around for additional embodiments of the method. The method 1900 will be described in conjunction with FIGS. 20-26C.

Figure 20:
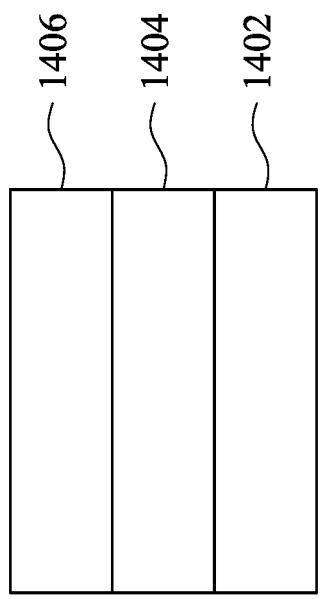

At operation 1902, the method 1900 (FIG. 19) deposits dielectric layers 1404 and 1406 over a silicon substrate 1402 (e.g., semiconductor wafer). Referring to FIG. 20, shown therein is the silicon substrate 1402 with the first dielectric layer 1404 (such as silicon oxide) and the second dielectric layer 1406 (such as silicon nitride) formed thereon. Materials suitable for the dielectric layers 1404 and 1406 include, but not limited to, silicon oxide, silicon nitride, poly-silicon, $Si_3N_4$, SiON, TEOS, nitrogen-containing oxide, nitride oxide, high K material (K>5), or combinations thereof. The dielectric+c layers 1404 and 1406 are formed by a procedure that includes deposition. For example, the first dielectric layer 1404 of silicon oxide is formed by thermal oxidation. The second dielectric layer 1406 of silicon nitride (SiN) is formed by chemical vapor deposition (CVD). For example, the SiN layer is formed by CVD using chemicals including Hexachlorodisilane (HCD or $Si_2C_{16}$), Dichlorosilane (DCS or $SiH_2C_{12}$), Bis(TertiaryButylAmino) Silane (BTBAS or $C_8H_{22}N_2Si$) and Disilane (DS or $Si_2H_6$). In an embodiment, the dielectric layer 1406 is about 20 nm to about 200 nm thick.

The method 1900 (FIG. 19) proceeds to operation 1904 to form mandrel patterns 1502a and 1502b in the dielectric layer 1406. Referring to FIG. 21A (top view), FIG. 21B (cross-sectional view along the line B-B of FIG. 21A), and FIG. 21C (cross-sectional view along the line C-C of FIG. 21A), the mandrel patterns 1502 are formed by patterning the dielectric layer 1406 with a procedure including a lithography process and an etching process. In the present embodiment, the mandrel pattern 1502a is in a SRAM cell area of a memory array and the mandrel pattern 1502b is in a well strap area of the memory array. Specifically, the mandrel pattern 1502a includes patterned mandrel layers 1504a and the mandrel pattern 1502b includes patterned mandrel layers 1504b. In some embodiments, adjacent two patterned mandrel layers 1504a has a distance A1 therebetween, adjacent two patterned mandrel layers 1504b has a distance A2, and the distance A2 is less than the distance A1. In some embodiments, the distance A1 of the patterned mandrel layers 1504a is greater than about twice a width of the mandrel layers 1504a along the direction X. In some embodiments, the distance A2 of the patterned mandrel layers 1504*b* is less than about twice a width of the mandrel layers 1504*a* along the direction X.

In the present embodiment, a photoresist layer is formed on the dielectric layer 1406 using a spin-coating process and soft baking process. Then, the photoresist layer is exposed to a radiation using a mask. The exposed photoresist layer is developed using post-exposure baking (PEB), developing, and hard baking thereby forming a patterned photoresist layer over the dielectric layer 1406. Subsequently, the dielectric layer 1406 is etched through the openings of the patterned photoresist layer, forming a patterned dielectric layer 1406. The patterned photoresist layer is removed thereafter using a suitable process, such as wet stripping or plasma ashing. In one example, the etching process includes applying a dry (or plasma) etch to remove the dielectric layer 1406 within the openings of the patterned photoresist layer. In another example, the etching process includes applying a wet etch with a hydrofluoric acid (HF) solution to remove the SiO layer 1406 within the openings. During the above photolithography process, the pattern regularity of the mandrel patterns 1502 helps improve pattern critical dimension uniformity in view of optical proximity effect.

The method 1900 (FIG. 19) proceeds to operation 1906 to form spacers 1602*a* and 1620*b*. Referring to FIG. 22A (top view), FIG. 22B (cross-sectional view along the line B-B of FIG. 22B), and FIG. 22C (cross-sectional view along the line C-C of FIG. 22A), shown therein are spacers 1602*a* formed on the sidewalls of the mandrel patterns 1502*a* and spacers 1602*b* formed on the sidewalls of the mandrel patterns 1502*b* and fills a space between adjacent two of the patterned mandrel layers 1504*b*. In the present embodiment, the spacers 1602*b* are in a SRAM cell area of a memory array and the spacers 1602*b* are in a well strap area of the memory array. In some embodiments, a width of the spacer 1602*b* is greater than a width of the spacer 1602*a* along the direction X. In some implementations, the width of the spacer 1602*b* is about twice to about ten times of the width of the spacer 1602*a*.

The spacers 1602 include one or more material different from the mandrel patterns 1502. In an embodiment, the spacers 1602 may include a dielectric material, such as titanium nitride, silicon nitride, or titanium oxide. Other materials suitable for the spacers 1602 include, but not limited to, poly-silicon, $SiO_2$, $Si_3N_4$, SiON, TEOS, nitrogen-containing oxide, nitride oxide, high K material (K>5), or combinations thereof. The spacers 1602 can be formed by various processes, including a deposition process and an etching process. For example, the deposition process includes a chemical vapor deposition (CVD) process or a physical vapor deposition (PVD) process. For example, the etching process includes an anisotropic etch such as plasma etch.

The method 1900 (FIG. 19) proceeds to operation 1908 to remove the mandrel patterns 1502*a* and 1502*b*. Referring to FIG. 23A (top view), FIG. 23B (cross-sectional view along the line B-B of FIG. 23A), and FIG. 23C (cross-sectional view along the line C-C of FIG. 23A), the spacers 1602*a* and 1602*b* remain over the dielectric layer 1404 after the mandrel patterns 1502*a* and 1502*b* have been removed, e.g., by an etching process selectively tuned to remove the dielectric material 1406 but not the spacer material. The etching process can be a wet etching, a dry etching, or a combination thereof.

The method 1900 (FIG. 19) proceeds to operation 1910 to selective remove the spacers 1602*a* and to selective remove the spacers 1602*b*, and thus there is no need to perform a fin cut process with to remove dummy fin lines in the subsequent process. Referring to FIG. 24A (top view), FIG. 24B (cross-sectional view along the line B-B of FIG. 24A), and FIG. 24C (cross-sectional view along the line C-C of FIG. 24A), the dummy spacers 1602*a*1 (see FIG. 23B) in the SRAM cell area are removed thereby leaving the spacers 1602*a*2 on the dielectric layer 1404, and dummy spacers 1602*b*1 (see FIG. 23C) in the well strap area are removed thereby leaving the spacers 1602*b*2 on the dielectric layer 1404.

In the present embodiment, the dummy spacers 1602*a*1 and 1602*b*1 are removed by a procedure including a lithography process and an etching process. For example, a photoresist layer is formed on the silicon substrate using a spin-coating process and soft baking process. Then, the photoresist layer is exposed to a radiation using a mask where openings to be formed. The exposed photoresist layer is subsequently developed and stripped thereby forming a patterned photoresist layer. The spacers 1602*a*2 and 1602*b*2 are protected by the patterned photoresist layer while the dummy spacers 1602*a*1 and 1602*b*1 are not protected as such. Subsequently, the dummy spacers 1602*a* and 1602*b*1 are etched through the openings of the patterned photoresist layer. The patterned photoresist layer is removed thereafter using a suitable process, such as wet stripping or plasma ashing.

The method 1900 (FIG. 19) proceeds to operation 1912 to form fin lines 1802*a* and 1802*b* in the silicon substrate 1402. Referring to FIGS. 25B and 25C which are cross-sectional view along the line B-B and line C-C of FIG. 25A, the silicon substrate 1402 is etched with the spacers 1602*a*2 as an etch mask to form the fin lines 1802*a* in the SRAM cell area of the memory array and the silicon substrate 1402 is etched with the spacers 1602*b*2 as an etch mask to form the fin lines 1802*b* in the well strap area of the memory array. In some embodiments, a width of the fin line 1802*b* is greater than a width of the fin line 1802*a* along the direction X. In some implementations, the width of the fin line 1802*b* is about twice to about ten times of the width of the fin line 1802*a*.

The method 1900 (FIG. 19) proceeds to operation 1914 to remove spacers 1602*a*2 and 1602*b*2 (see FIGS. 25B and 25C) and the dielectric layer 1404. Referring to FIGS. 26B and 26C which are cross-sectional view along the line B-B and line C-C of FIG. 26A, the spacers 1602 and the dielectric layer 1404 are subsequently removed thereby forming the fin lines 1802*a* in the SRAM cell area of the memory array and forming the fin lines 1802*b* in the well strap area of the memory array.

The method 1900 (FIG. 19) proceeds to operation 1916 to form a final device with the fin lines 1802*a* and 1802*b*. For example, the operation 1916 may include implanting dopant for well and channel doping, forming gate dielectric, forming lightly doped source/drain, forming gate stacks, and so on.

Figure 27:
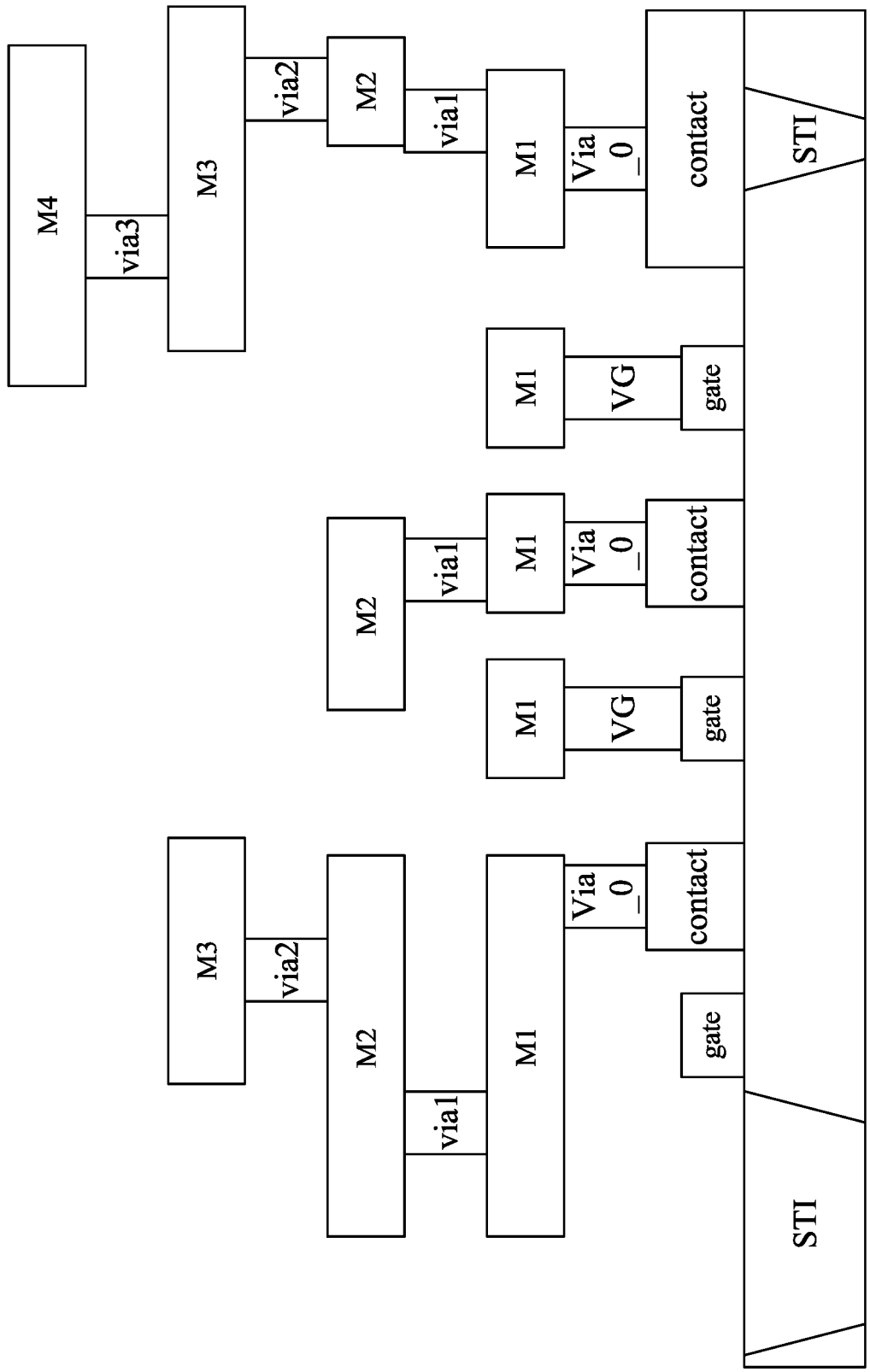
FIG. 27 a cross-sectional view of the layers involved in a SRAM cell array in accordance with some embodiments.

FIG. 27 illustrates a schematic cross-sectional view of a plurality of layers involved in SRAM cell 10, which layers are formed on a semiconductor chip or wafer. It is noted that FIG. 27 is schematically illustrated to show various levels of interconnect structure and transistors, and may not reflect the actual cross-sectional view of SRAM cell 10. The interconnect structure includes a contact level, an OD (wherein the term "OD" represents "active region") level, via levels Via_0 level, Via_1 level, Via_2 level, and Via_3 level, and metal-layer levels M1 level, M2 level, M3 level, and M4 level. Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contact plugs) for connecting gate electrodes of transistors (such as the illustrated exemplary transistors PU-1 and PU-2) to an overlying level such as the Via_0 level, and source/drain contacts (marked as "contact") for connecting the source/drain regions of transistors to the overlying level.

Based on the above discussion, it can be seen that the present disclosure offers advantages. It is understood, however, that other embodiments may offer additional advantages, and not all advantages are necessarily disclosed herein, and that no particular advantages is required for all embodiments.

An advantage is that a fin in the well pickup region of the FinFET device has a width greater than that in the transistor of the FinFET device, so as to lower the resistance of the well pickup region, and thus the FinFET device may obtain a better latch up immunity. That is, the well strap area may provide a most stable performance for the FinFET device.

In some embodiments, an integrated circuit device includes a substrate, a fin field-effect transistor (FinFET), and a well strap. The substrate has a first doped region of a first type dopant. The FinFET is over the doped region and includes a first semiconductor fin and a first source/drain region in the first semiconductor fin, wherein the first source/drain region is of a second type dopant that has a different conductivity type than the first type dopant. The well strap is over the doped region, includes a second semiconductor fin and a second source/drain region in the second semiconductor fin, wherein the second source/drain region is of the first type dopant. A width of the second semiconductor fin is greater than a width of the first semiconductor fin.

In some embodiments, an integrated circuit device includes a memory cell, an n-type strap, and a p-type well strap. The memory cell includes a fin field-effect transistor (FinFET) including a first fin structure. The n-type well strap has n-type source/drain regions over an n-type well. The p-type well strap has p-type source/drain regions over a p-type well. The p-type well strap is spaced apart from the memory cell by the n-type well strap and includes a second fin structure. The width of the second fin structure of the p-type well strap is greater than a width of the first fin structure of the memory cell.

In some embodiments, a method of manufacturing an integrated circuit device, incudes: doping a substrate with a first type dopant to form a well region; forming a first semiconductor fin and a second semiconductor fin wider than the first semiconductor fin over the well region; forming a first source/drain region of a second type dopant on the first semiconductor fin, the second type dopant is of a different conductivity type than the first type dopant; and forming a second source/drain region of the first type dopant on the second semiconductor fin.

In some embodiments, a method of manufacturing an integrated circuit device includes: doping a substrate with a first type dopant to form a well region; forming a first semiconductor fin and a second semiconductor fin wider than the first semiconductor fin over the well region; forming a first source/drain region of a second type dopant on the first semiconductor fin, the second type dopant is of a different conductivity type than the first type dopant; forming a second source/drain region of the first type dopant on the second semiconductor fin. In some embodiments, the second semiconductor fin has a width in a range from about twice to about ten times a width of the first semiconductor fin. In some embodiments, the method further includes: forming a source/drain via over the second source/drain region, wherein when in a plan view, the second semiconductor fin encloses the via. In some embodiments, the method further includes: forming a conductive line extending along a lengthwise direction of the second semiconductor fin and electrically connected to the second source/drain structure, wherein the second semiconductor fin has a wider width than the conductive line. In some embodiments, the second semiconductor fin has a greater concentration of the first type dopant than the first semiconductor fin. In some embodiments, the first type dopant comprises boron. In some embodiments, the first type dopant is a P-type dopant and the first semiconductor fin is of a pass-gate transistor. In some embodiments, the first type dopant is a P-type dopant and the first semiconductor fin is of a pull-down transistor. In some embodiments, the first doped region is an N-type dopant and the first semiconductor fin is a pull-up transistor. In some embodiments, the method further includes: forming a third semiconductor fin over the well region, wherein the third semiconductor fin is electrically connected to the second semiconductor fin and has a narrower width than the second semiconductor fin.

In some embodiments, a method of manufacturing an integrated circuit device includes: forming a first semiconductor fin on a memory cell region; forming a first source/drain structure on the first semiconductor fin; forming a first conductive line extending along a lengthwise direction of the first semiconductor fin and electrically connected to the first source/drain structure, wherein the first semiconductor fin has a narrower width than the first conductive line; forming a second semiconductor fin on a well strap region; forming a second source/drain structure on the second semiconductor fin; forming a second conductive line extending along a lengthwise direction of the second semiconductor fin and electrically connected to the second source/drain structure, wherein the second semiconductor fin has a wider width than the second conductive line. In some embodiments, the second semiconductor fin has a wider width than the first semiconductor fin. In some embodiments, the second semiconductor fin has a same conductivity type as the first semiconductor fin. In some embodiments, the second semiconductor fin has a different conductivity type than the first semiconductor fin. In some embodiments, the second source/drain structure has a same conductivity type as the second semiconductor fin. In some embodiments, the second semiconductor fin has a greater dopant concentration than the first semiconductor fin.

In some embodiments, a method of manufacturing an integrated circuit device includes: forming first, second, third semiconductor fins extending upwardly from a well region of a substrate, wherein the second semiconductor fin is between the first and third semiconductor fins and has a wider width than the first and third semiconductor fins; forming a gate structure extending across the first, second, and third semiconductor fins; forming a source/drain structure on the first, second, and third semiconductor fins, wherein the source/drain structure on the first, second, and third semiconductor fins is doped with a dopant has the same conductivity type as the well region. In some embodiments, the method further includes: forming a fourth semiconductor fin extending upwardly from the well region of the substrate, wherein the fourth semiconductor fin has a narrower width than the second semiconductor fin; and forming a second source/drain structure on the fourth semiconductor fin, wherein the second source/drain structure has a different conductivity type than the well region. In some embodiments, the method further includes: forming a source/drain via over the first source/drain structure, wherein the source/drain via has a narrower width than the second semiconductor fin along a lengthwise direction of the gate structure. In some embodiments, the method further includes: forming a conductive line extending along a lengthwise direction of the second semiconductor fin and electrically connected to the second semiconductor fin, wherein the conductive line has a width narrower than the second semiconductor fin and wider than the first and third semiconductor fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit device, comprising:
   doping a substrate with a P-type dopant to form a P-type well region;
   forming a first semiconductor fin and a second semiconductor fin wider than the first semiconductor fin over the P-type well region;
   forming a first source/drain region with an N-type dopant on the first semiconductor fin over the P-type well region;
   forming a second source/drain region with the P-type dopant on the second semiconductor fin over the P-type well region;
   forming a first conductive line extending along a lengthwise direction of the first semiconductor fin and electrically connected to the first source/drain region, wherein the first semiconductor fin has a narrower width than the first conductive line; and
   forming a second conductive line extending along a lengthwise direction of the second semiconductor fin and electrically connected to the second source/drain region, wherein the second semiconductor fin has a wider width than the second conductive line.

2. The method of claim 1, wherein the second semiconductor fin has a width in a range from about twice to about ten times a width of the first semiconductor fin.

3. The method of claim 1, further comprising:
   forming a source/drain via over the second source/drain region, wherein when in a plan view, the second semiconductor fin encloses the via.

4. The method of claim 1, wherein the second semiconductor fin has a greater concentration of the P-type dopant than the first semiconductor fin.

5. The method of claim 1, wherein the P-type dopant comprises boron.

6. The method of claim 1, wherein the first semiconductor fin is of a pass-gate transistor.

7. The method of claim 1, wherein the first semiconductor fin is of a pull-down transistor.

8. The method of claim 1, wherein the first semiconductor fin is a pull-up transistor.

9. The method of claim 1, further comprising:
   forming a third semiconductor fin over the P-type well region, wherein the third semiconductor fin is electrically connected to the second semiconductor fin and has a narrower width than the second semiconductor fin.

10. A method, comprising:
    forming a first semiconductor fin on a memory cell region;
    forming a first source/drain structure on the first semiconductor fin;
    forming a first conductive line extending along a lengthwise direction of the first semiconductor fin and electrically connected to the first source/drain structure, wherein the first semiconductor fin has a narrower width than the first conductive line;
    forming a second semiconductor fin on a well strap region;
    forming a second source/drain structure on the second semiconductor fin; and
    forming a second conductive line extending along a lengthwise direction of the second semiconductor fin and electrically connected to the second source/drain structure, wherein the second semiconductor fin has a wider width than the second conductive line.

11. The method of claim 10, wherein the second semiconductor fin has a wider width than the first semiconductor fin.

12. The method of claim 10, wherein the second semiconductor fin has a same conductivity type as the first semiconductor fin.

13. The method of claim 10, wherein the second semiconductor fin has a different conductivity type than the first semiconductor fin.

14. The method of claim 10, wherein the second source/drain structure has a same conductivity type as the second semiconductor fin.

15. The method of claim 10, wherein the second semiconductor fin has a greater dopant concentration than the first semiconductor fin.

16. A method, comprising:
    forming first, second, third, and fourth semiconductor fins extending upwardly from an N-type well region of a substrate, wherein the second semiconductor fin is between the first and third semiconductor fins and has a wider width than the first, third, and fourth semiconductor fins;
    forming a first gate structure extending across the first, second, and third semiconductor fins, and a second gate structure extending across the fourth semiconductor fin;
    forming a first source/drain structure on the first, second, and third semiconductor fins, and a second source/drain structure on the fourth semiconductor fin, wherein the first source/drain structure on the first, second, and third semiconductor fins on the N-type well region is doped with an N-type dopant, and the second source/drain structure on the fourth semiconductor fin on the N-type well region is doped with a P-type dopant;
    forming a first conductive line extending along a lengthwise direction of the second semiconductor fin and electrically connected to the first source/drain structure, wherein the second semiconductor fin has a wider width than the first conductive line; and
    forming a second conductive line extending along a lengthwise direction of the fourth semiconductor fin and electrically connected to the second source/drain structure, wherein the fourth semiconductor fin has a narrower width than the second conductive line.

17. The method of claim 16, further comprising:
forming a source/drain via over the first source/drain structure, wherein the source/drain via has a narrower width than the second semiconductor fin along a lengthwise direction of the first gate structure.

18. The method of claim 16, wherein the width of the first conductive line is wider than the first and third semiconductor fins.

19. The method of claim 1, wherein the first semiconductor fin is on a memory cell region, and the second semiconductor fin is on a well strap region.

20. The method of claim 16, wherein the second semiconductor fin is on a well strap region, and the fourth semiconductor fin is on a memory cell region.

* * * * *